(12) United States Patent
Yuasa et al.

(10) Patent No.: US 9,190,264 B2
(45) Date of Patent: Nov. 17, 2015

(54) METHOD OF MANUFACTURING SEMICONDUCTOR DEVICE, METHOD OF PROCESSING SUBSTRATE AND NON-TRANSITORY COMPUTER READABLE RECORDING MEDIUM

(75) Inventors: Kazuhiro Yuasa, Toyama (JP); Naonori Akae, Toyama (JP); Masato Terasaki, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 257 days.

(21) Appl. No.: 13/618,338

(22) Filed: Sep. 14, 2012

(65) Prior Publication Data
US 2013/0084712 A1 Apr. 4, 2013

(30) Foreign Application Priority Data

Sep. 30, 2011 (JP) ................................. 2011-218019
Aug. 9, 2012 (JP) ................................. 2012-176570

(51) Int. Cl.
*H01L 21/31* (2006.01)
*H01L 21/02* (2006.01)
(Continued)

(52) U.S. Cl.
CPC ............ *H01L 21/022* (2013.01); *C23C 16/345* (2013.01); *C23C 16/402* (2013.01); *C23C 16/45529* (2013.01); *H01L 21/0217* (2013.01); *H01L 21/0228* (2013.01); *H01L 21/0262* (2013.01); *H01L 21/02164* (2013.01); *H01L 21/02211* (2013.01); *H01L 21/02532* (2013.01); *H01L 21/67109* (2013.01)

(58) Field of Classification Search
CPC ............ H01L 21/0262; H01L 21/0228; H01L 21/02164; H01L 21/0217; H01L 21/02211; H01L 21/3185; H01L 21/0214

USPC .................. 257/E21.267, E21.478, E21.293, 257/E21.278, E21.17; 438/758, 763, 770, 438/775, 778, 786, 787, 791
See application file for complete search history.

(56) References Cited

U.S. PATENT DOCUMENTS 7,884,034 B2 2/2011 Hirose et al.
2003/0160274 A1 8/2003 Das et al.
(Continued)

FOREIGN PATENT DOCUMENTS

CN 101532126 A 9/2009
CN 102034702 A 4/2011
(Continued)

OTHER PUBLICATIONS

Nov. 2, 2014 Office Action issued in Chinese Patent Application No. 201210365930.8.

*Primary Examiner* — Khiem D Nguyen
(74) *Attorney, Agent, or Firm* — Oliff PLC

(57) ABSTRACT

A semiconductor manufacturing method includes forming an oxide film on a substrate by performing a first cycle a predetermined number of times, including supplying a first source gas, an oxidizing gas and a reducing gas to the substrate heated to a first temperature in a process container under a sub-atmospheric pressure; forming a seed layer on a surface of the oxide film by supplying a nitriding gas to the substrate in the process container, the substrate being heated to a temperature equal to or higher than the first temperature and equal to or lower than a second temperature; and forming a nitride film on the seed layer formed on the surface of the oxide film by performing a second cycle a predetermined number of times, including supplying a second source gas and the nitriding gas to the substrate heated to the second temperature in the process container.

19 Claims, 19 Drawing Sheets

(51) Int. Cl.
*H01L 21/67* (2006.01)
*C23C 16/34* (2006.01)
*C23C 16/40* (2006.01)
*C23C 16/455* (2006.01)

(56) References Cited

U.S. PATENT DOCUMENTS

| | | |
|---|---|---|
| 2004/0086640 A1 | 5/2004 | Luo et al. |
| 2004/0169259 A1* | 9/2004 | Zheng et al. ............... 257/649 |
| 2005/0037578 A1* | 2/2005 | Chen et al. ............... 438/261 |
| 2010/0105192 A1 | 4/2010 | Akae et al. |
| 2010/0190348 A1* | 7/2010 | Akae et al. ............... 438/703 |
| 2011/0076857 A1* | 3/2011 | Akae et al. ............... 438/769 |

FOREIGN PATENT DOCUMENTS

| | | |
|---|---|---|
| JP | A-2000-100809 | 4/2000 |
| JP | A-2006-190787 | 7/2006 |
| JP | A-2010-062230 | 3/2010 |
| JP | A-2010-153776 | 7/2010 |

* cited by examiner

METHOD OF MANUFACTURING SEMICONDUCTOR DEVICE, METHOD OF PROCESSING SUBSTRATE AND NON-TRANSITORY COMPUTER READABLE RECORDING MEDIUM

CROSS-REFERENCE TO RELATED PATENT APPLICATION

This U.S. non-provisional patent application claims priority under 35 U.S.C. §119 of Japanese Patent Application No. 2011-218019, filed on Sep. 30, 2011, and Japanese Patent Application No. 2012-176570, filed on Aug. 9, 2012, in the Japanese Patent Office, the entire contents of which are hereby incorporated by reference.

BACKGROUND OF THE INVENTION

1. Field of the Invention

The present invention relates to a method of manufacturing a semiconductor device, which includes forming a thin film on a substrate, a method of processing the substrate, a substrate processing apparatus that may be used in the process of forming the thin film, and a non-transitory computer-readable recording medium.

2. Description of the Related Art

As one process of a method of manufacturing a semiconductor device, forming an insulating film having an ONO stacked structure, in which an oxide film and a nitride film are alternately stacked on a substrate, may be performed. Conventional chemical vapor deposition (CVD) has been used to continuously form an oxide film and a nitride film of the ONO stacked structure within the same process chamber. For example, an insulating film having an ONO stacked structure may be formed on the substrate to a predetermined thickness by alternately performing formation of a silicon oxide (SiO) film by simultaneously supplying dichlorosilane (DCS) ($SiH_2Cl_2$) gas and nitrogen dioxide ($N_2O$) gas into a process chamber having the substrate therein, and formation of a silicon nitride (SiN) film by simultaneously supplying DCS gas and ammonia ($NH_3$) gas.

SUMMARY OF THE INVENTION

However, when the insulating film described above is formed by chemical vapor deposition (CVD) based on vapor-phase reactions, for example, microfabrication is performed on a surface of the substrate to increase a surface area of the substrate. Thus, an amount of gas consumed at edge portions of the substrate may be greater than that at central portions of the substrate, and the thickness uniformity of the insulating film in a plane of the substrate may decrease to be lower than allowable values required in a semiconductor device. Also, the step coverage of the insulating film may be degraded due to fine grooves formed in the surface of the substrate.

To solve these problems, vapor-phase reactions may be suppressed at the edges of the substrate by lowering pressure in the process chamber, or the deficiency of the gas at the central portions of the substrate may be supplemented by increasing a pitch between arranged substrates, i.e., the distance between adjacent substrates. However, if the former method of lowering the pressure in the process chamber is used, a deposition rate of the insulating film may decrease, thus lowering the yield. If the latter method of increasing the pitch of substrate arrangement is used, the number of substrates that are processed when substrate processing is performed once may decrease, thereby greatly lowering the yield.

The present invention provides a method of manufacturing a semiconductor device capable of improving the yield of a film by improving the thickness uniformity or step coverage of an insulating film having a stacked structure of an oxide film and a nitride film, a method of processing the substrate, a substrate processing apparatus, and a non-transitory computer-readable recording medium.

According to one aspect of the present invention, there is provided a method of manufacturing a semiconductor device, including:

(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

According to another aspect of the present invention, there is provided a method of processing a substrate including:

(a) forming an oxide film on the substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

According to still another aspect of the present invention, there is provided a substrate processing apparatus including:
a process container configured to accommodate a substrate;
a heater configured to heat the substrate in the process container;
a source gas supply system configured to supply a first source gas and a second source gas to the substrate in the process container;
an oxidizing gas supply system configured to supply an oxidizing gas to the substrate in the process container;
a reducing gas supply system configured to supply a reducing gas to the substrate in the process container;
a nitriding gas supply system configured to supply a nitriding gas to the substrate in the process container;
a pressure adjustment unit configured to adjust an inner pressure of the process container; and
a control unit configured to control the heater, the source gas supply system, the oxidizing gas supply system, the reducing gas supply system, the nitriding gas supply system and the pressure adjustment unit so as to perform forming an oxide film on the substrate by performing a first cycle a predetermined number of times, the first cycle including supplying the first source gas and supplying the oxidizing gas and the reducing gas to the substrate heated to a first temperature in a process container under a pressure lower than an atmospheric pressure; forming a seed layer on a surface of the oxide film by supplying the nitriding gas to the substrate in the process container, the substrate being heated to a temperature equal to or higher than the first temperature and equal to or lower than a second temperature; and forming a nitride film on the seed layer formed on the surface of the oxide film by performing a second cycle a predetermined number of times, the second cycle including supplying the second source gas and supplying the nitriding gas to the substrate heated to the second temperature in the process container.

According to yet another aspect of the present invention, there is provided a non-transitory computer-readable recording medium storing a program that causes a computer to execute:

(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

DETAILED DESCRIPTION OF THE PREFERRED EMBODIMENTS

<First Embodiment of the Present Invention>

(1) Configuration of Substrate Processing Apparatus

Figure 1:
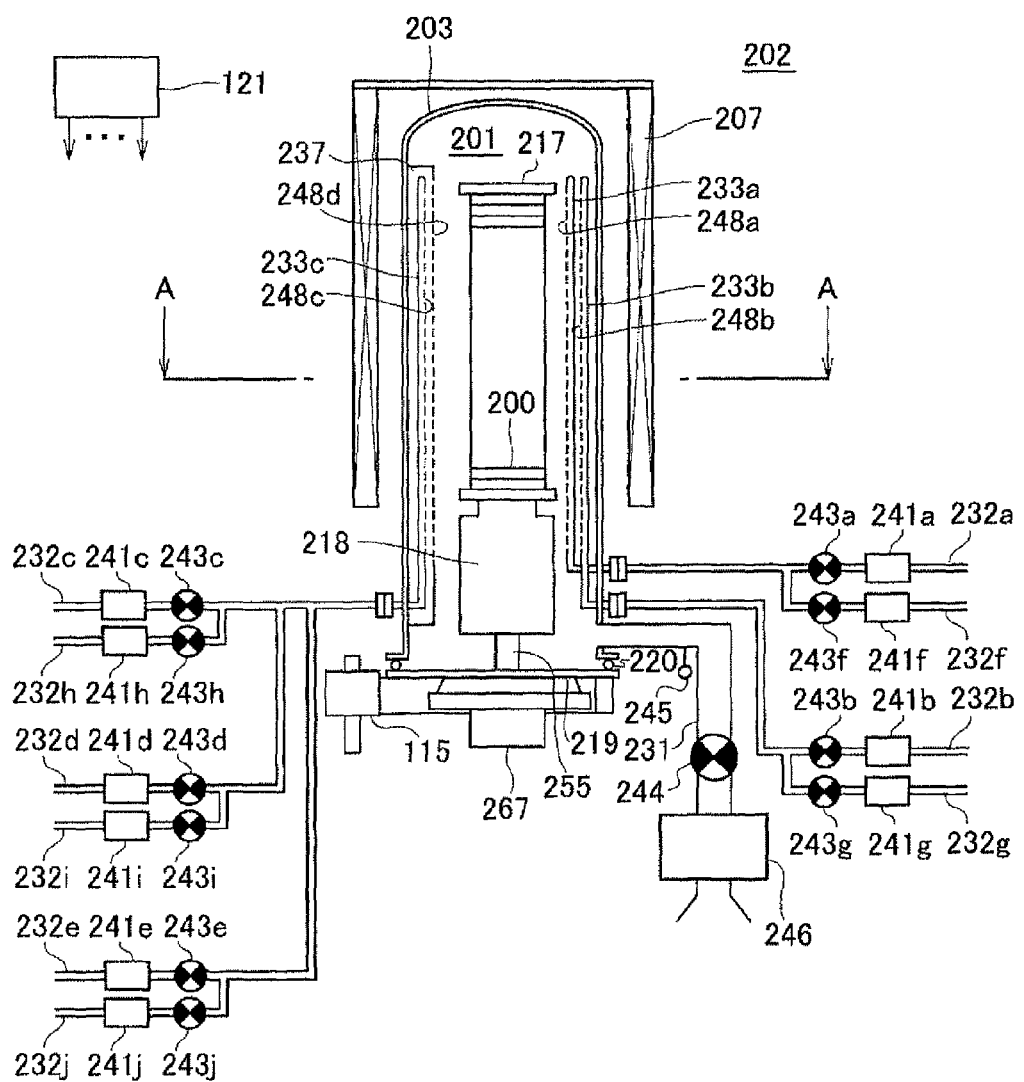
FIG. 1 is a schematic configuration diagram of a vertical process furnace of a substrate processing apparatus according to an embodiment of the present invention, in which a vertical cross-sectional view of a portion of the vertical process furnace is provided.
Figure 2:
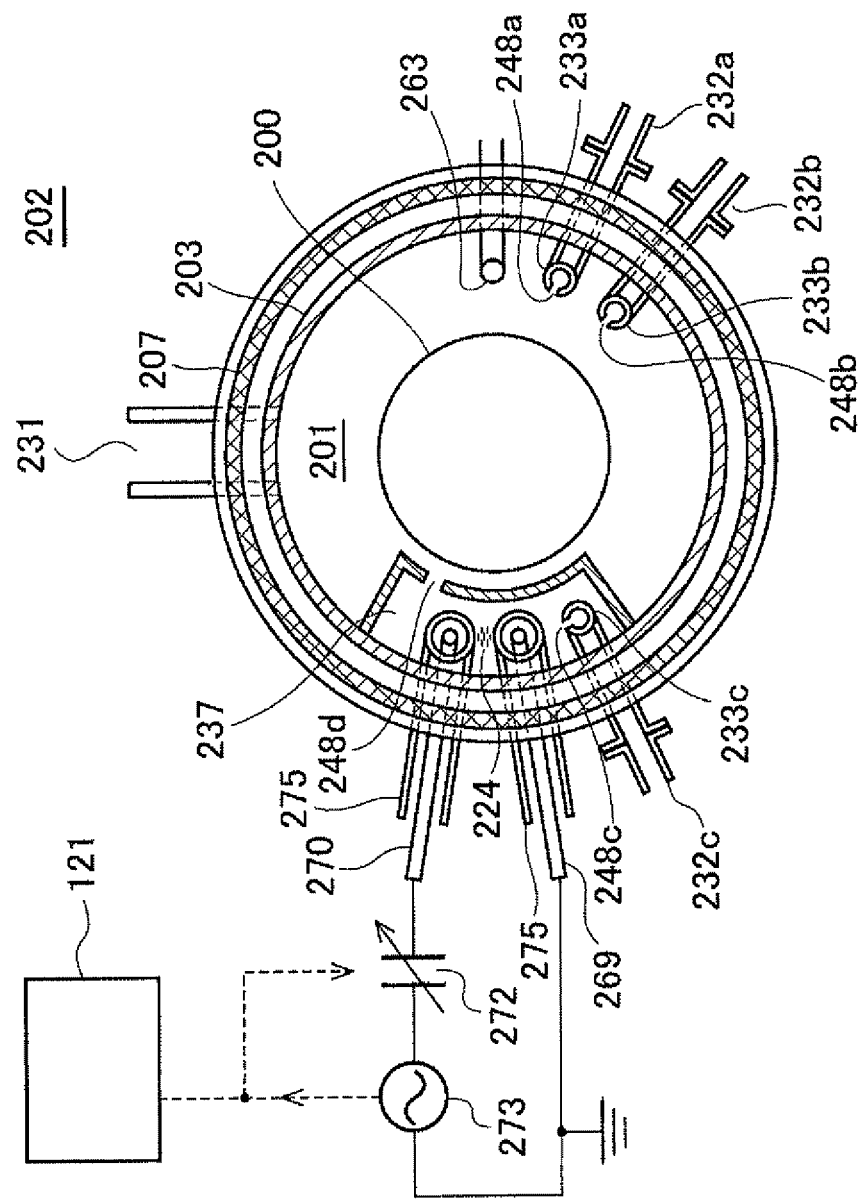
FIG. 2 is a schematic configuration diagram of the vertical process furnace of the substrate processing apparatus according to an embodiment of the present invention, in which a cross-sectional view taken along line A-A in the portion of the process furnace of FIG. 1 is provided.

FIG. 1 is a schematic configuration diagram of a vertical process furnace 202 of a substrate processing apparatus according to an embodiment of the present invention, in which a vertical cross-sectional view of a portion of the vertical process furnace is provided. FIG. 2 is a schematic configuration diagram of the vertical process furnace of the substrate processing apparatus according to an embodiment of the present invention, in which a cross-sectional view taken along line A-A in the portion of the process furnace of FIG. 1 is provided. However, the present invention is not limited to the substrate processing apparatus according to the present embodiment and may also be applied to a substrate processing apparatus including a single-wafer type, a hot-wall type, or a cold-wall type process furnace.

As illustrated in FIG. 1, the process furnace 202 includes a heater 207 serving as a heating unit (heating mechanism). The heater 207 has a cylindrical shape, and is vertically installed by being supported by a heater base (not shown) serving as a retaining plate. Also, the heater 207 acts as an activating mechanism that activates a gas with heat, as will be described below.

In the heater 207, a reaction pipe 203 forming a reaction container (process container) in a concentric shape with respect to the heater 207 is provided. The reaction pipe 203 is formed of a heat-resistant material, e.g., quartz ($SiO_2$) or silicon carbide (SiC), and has a cylindrical shape, an upper end of which is closed and a lower end of which is open. A process chamber 201 is formed in a hollow tubular portion of the reaction pipe 203, and is configured such that wafers 200 can be accommodated as substrates in a horizontal posture to be arranged in multiple stages in a vertical direction by means of a boat 217 to be described below.

A first nozzle 233a as a first gas introduction port, a second nozzle 233b as a second gas introduction port, and a third nozzle 233c as a third gas introduction port are installed in the process chamber 201 to pass through lower sidewalls of the reaction pipe 203. A first gas supply pipe 232a is connected to the first nozzle 233a. A second gas supply pipe 232b is connected to the second nozzle 233b. A third gas supply pipe 232c, a fourth gas supply pipe 232d, and a fifth gas supply pipe 232e are connected to the third nozzle 233c. As describe above, the three nozzles 233a, 233b, and 233c and the five gas supply pipes 232a, 232b, 232c, 232d, and 232e are installed in the reaction pipe 203 so that a plurality of types of gases (five types of gases in the present embodiment) can be supplied into the process chamber 201.

Also, a manifold formed of a metal may be installed below the reaction pipe 203 to support the reaction pipe 203, and the first to third nozzles 233a to 233c may be installed to pass through sidewalls of the manifold. In this case, an exhaust pipe 231 which will be described below may be installed in the manifold. Alternatively, the exhaust pipe 231 may be installed below the reaction pipe 203 rather than in the manifold. As described above, a furnace port portion of the process furnace 202 may be formed of a metal and the first to third nozzles 233a to 233c may be installed at the furnace port portion formed of a metal.

A mass flow controller (MFC) 241a which is a flow rate control device (flow rate control unit) and a valve 243a which is a switch valve are sequentially installed at the first gas supply pipe 232a in an upsteam direction. Also, a first inert gas supply pipe 232f is connected to the first gas supply pipe 232a at a downstream side of the valve 243a. An MFC 241f which is a flow rate control device (flow rate control unit) and a valve 243f which is a switch valve are sequentially installed at the first inert gas supply pipe 232f in an upstream direction. Also, the first nozzle 233a is connected to a front end of the first gas supply pipe 232a. The first nozzle 233a is installed in an arc-shaped space between inner walls of the reaction pipe 203 and the wafers 200 to move upward from lower inner walls of the reaction pipe 203 in a direction in which the wafers 200 are stacked. In other words, the first nozzle 233a is installed along a wafer arrangement region in which the wafers 200 are arranged, in a region that horizontally surrounds the wafer arrangement region at sides of the wafer arrangement region. The first nozzle 233a is configured as an L-shaped long nozzle, and includes a horizontal portion passing through lower sidewalls of the reaction pipe 203 and a vertical portion vertically moving at least from one end of the wafer arrangement region toward the other end thereof. A plurality of gas supply holes 248a are formed in a side surface of the first nozzle 233a to supply a gas. The gas supply holes 248a are open toward a center of the reaction pipe 203 to supply a gas toward the wafers 200. The gas supply holes 248a are formed from a lower portion of the reaction pipe 203 to an upper portion thereof, and each of the gas supply holes 248a has the same opening area at the same opening pitch.

A first gas supply system mainly includes the first gas supply pipe 232a, the MFC 241a, and the valve 243a. The first nozzle 233a may be further included in the first gas supply system. A first inert gas supply system mainly includes the first inert gas supply pipe 232f, the MFC 241f, and the valve 243f. The first inert gas supply system may also act as a purge gas supply system.

An MFC 241b which is a flow rate control device (flow rate control unit) and a valve 243b which is a switch valve are sequentially installed at the second gas supply pipe 232b in an upstream direction. A second inert gas supply pipe 232g is connected to the second gas supply pipe 232b at a downstream side of the valve 243b. An MFC 241g which is a flow rate control device (flow rate control unit) and a valve 243g which is a switch valve are sequentially installed at the second inert gas supply pipe 232g in an upstream direction. Also, the second nozzle 233b is connected to a front end of the second gas supply pipe 232b. The second nozzle 233b is installed in the arc-shaped space between inner walls of the reaction pipe 203 and the wafers 200 to move upward from lower inner walls of the reaction pipe 203 in the direction in which the wafers 200 are stacked. In other words, the second nozzle 233b is installed along the wafer arrangement region in which the wafers 200 are arranged, in the region that horizontally surrounds the wafer arrangement region at sides of the wafer arrangement region. The second nozzle 233b is configured as an L-shaped long nozzle, and includes a horizontal portion passing through lower sidewalls of the reaction pipe 203 and a vertical portion vertically moving at least from one end of the wafer arrangement region toward the other end thereof. A plurality of gas supply holes 248b are formed in a side surface of the second nozzle 233b to supply a gas. The gas supply holes 248b are open toward the center of the reaction pipe 203 to supply a gas toward the wafers 200. The gas supply holes 248b are formed from a lower portion of the reaction pipe 203 to an upper portion thereof, and each of the gas supply holes 248b has the same opening area at the same opening pitch.

A second gas supply system mainly includes the second gas supply pipe 232b, the MFC 241b, and the valve 243b. The second nozzle 233b may be further included in the second gas supply system. A second inert gas supply system mainly includes the second inert gas supply pipe 232g, the MFC 241g, and the valve 243g. The second inert gas supply system may also act as a purge gas supply system.

An MFC 241c which is a flow rate control device (flow rate control unit) and a valve 243c which is a switch valve are sequentially installed at the third gas supply pipe 232c in an upstream direction. A third inert gas supply pipe 232h is connected to the third gas supply pipe 232c at a downstream side of the valve 243c. An MFC 241h which is a flow rate control device (flow rate control unit) and a valve 243h which is a switch valve are sequentially installed at the third inert gas supply pipe 232h in an upstream direction. The third nozzle 233c is connected to a front end of the third gas supply pipe 232c. The third nozzle 233c is installed in a buffer chamber 237 which is a gas dispersion space.

In the arc-shaped space between the inner walls of the reaction pipe 203 and the wafers 200, the buffer chamber 237 is installed in a region ranging from a lower portion of one of the inner walls of the reaction pipe 203 to an upper portion thereof, in the direction in which the wafers 200 are stacked. In other words, the buffer chamber 237 is installed along the wafer arrangement region in which the wafers 200 are arranged, in the region that horizontally surrounds the wafer arrangement region at sides of the wafer arrangement region. A plurality of gas supply holes 248d are installed at an end of a wall of the buffer chamber 237 adjacent to the wafers 200. The gas supply holes 248d are open toward the center of the reaction pipe 203 to supply a gas toward the wafers 200. The gas supply holes 248d are installed from the lower portion of the reaction pipe 203 to the upper portion thereof, and each of the gas supply holes 248d has the same opening area at the same opening pitch.

The third nozzle 233c is installed at another end of the buffer chamber 237 opposite to an end of the buffer chamber 237 in which the gas supply holes 248d are formed to move upward from the lower inner walls of the reaction pipe 203 in the direction in which the wafers 200 are stacked. That is, the third nozzle 233c is installed along the wafer arrangement region in which the wafers 200 are arranged, in the region that horizontally surrounds the wafer arrangement region at sides of the wafer arrangement region. The third nozzle 233c is configured as an L-shaped long nozzle, and includes a horizontal portion passing through the lower sidewalls of the reaction pipe 203, and a vertical portion vertically moving at least from one end of the wafer arrangement region toward another end thereof. A plurality of gas supply holes 248c are formed in a side surface of the first nozzle 233a to supply a gas. The gas supply holes 248c are open toward the center of the buffer chamber 237. The gas supply holes 248c are formed from the lower portion of the reaction pipe 203 to the upper portion thereof, similar to the gas supply holes 248d in the buffer chamber 237. The gas supply holes 248c may be formed to each have the same opening area at the same opening pitch from an upstream side (lower portion thereof) to a downstream side (upper portion thereof) when a difference between pressures in the buffer chamber 237 and the process chamber 201 is small. However, the opening areas of the gas supply holes 248c may become increased or the opening pitches between the gas supply holes 248c may become reduced from the upstream side (lower portion thereof) to the downstream side (upper portion thereof), when the difference between pressures in the buffer chamber 237 and the process chamber 201 is large.

In the present embodiment, gases, the flow velocities of which are different and the flow rates of which are substantially the same, are respectively ejected through the gas supply holes 248c by adjusting the opening areas or the opening pitches of the gas supply holes 248c of the third nozzle 233c from an upstream side to a downstream side as described above. Then, the gases ejected through the gas supply holes 248c are introduced into the buffer chamber 237, and then the different flow velocities of the gases are equalized in the buffer chamber 237. In other words, the speeds of particles of the gases ejected through the gas supply holes 248c of the third nozzle 233c into the buffer chamber 237 are reduced in the buffer chamber 237, and the gases are then ejected into the process chamber 201 through the gas supply holes 248d of the buffer chamber 237. Thus, when the gases ejected into the buffer chamber 237 through the gas supply holes 248c of the third nozzle 233c are ejected into the process chamber 201 through the gas supply holes 248d of the buffer chamber 237, the gases each have the same flow rate and flow velocity.

A third gas supply system mainly includes the third gas supply pipe 232c, the MFC 241c, and the valve 243c. The third nozzle 233c and the buffer chamber 237 may be further included in the third gas supply system. A third inert gas supply system mainly includes the third inert gas supply pipe 232h, the MFC 241h, and the valve 243h. The third inert gas supply system may also act as a purge gas supply system.

An MFC 241d which is a flow rate control device (flow rate control unit) and a valve 243d which is a switch valve are sequentially installed at the fourth gas supply pipe 232d in an upstream direction. A fourth inert gas supply pipe 232i is connected to the fourth gas supply pipe 232d at a downstream side of the valve 243d. An MFC 241i which is a flow rate control device (flow rate control unit) and a valve 243i which is a switch valve are sequentially installed at the fourth inert gas supply pipe 232i in an upstream direction. A front end of the fourth gas supply pipe 232d is connected to the third gas supply pipe 232c at a downstream side of the valve 243c.

A fourth gas supply system mainly includes the fourth gas supply pipe 232d, the MFC 241d, and the valve 243d. Also, the third nozzle 233c and the buffer chamber 237 at a downstream side of a portion of the third gas supply pipe 232c connected to the fourth gas supply pipe 232d may be further included in the fourth gas supply system. A fourth inert gas supply system mainly includes the fourth inert gas supply pipe 232i, the MFC 241i, and the valve 243i. The fourth inert gas supply system may also act as a purge gas supply system.

An MFC 241e which is a flow rate control device (flow rate control unit) and a valve 243e which is a switch valve are sequentially installed at the fifth gas supply pipe 232e in an upstream direction. A fifth inert gas supply pipe 232j is connected to the fifth gas supply pipe 232e at a downstream side of the valve 243e. An MFC 241j which is a flow rate control device (flow rate control unit) and a valve 243j which is a switch valve are sequentially installed at the fifth inert gas supply pipe 232j in an upstream direction. A front end of the fifth gas supply pipe 232e is connected to the third gas supply pipe 232c at a downstream side of the valve 243c.

A fifth gas supply system mainly includes the fifth gas supply pipe 232e, the MFC 241e, and the valve 243e. The third nozzle 233c and the buffer chamber 237 at a downstream side of a portion of the third gas supply pipe 232c connected to the fifth gas supply pipe 232e may be further included in the fifth gas supply system. A fifth inert gas supply system mainly includes the fifth inert gas supply pipe 232j, the MFC 241j, and the valve 243j. The fifth inert gas supply system may also act as a purge gas supply system.

As described above, in a method of supplying a gas according to the present embodiment, a main flow of a gas within the reaction pipe 203 is controlled to be parallel to, i.e., to be horizontal with respect to, a surface of each of the wafers 200 by carrying the gas via the nozzles 233a, 233b, and 233c and the buffer chamber 237 in the vertically long arc-shaped space, defined by the inner walls of the reaction pipe 203 and ends of a plurality of stacked wafers 200, and then first ejecting the gas into the reaction pipe 203 near the wafers 200 through the gas supply holes 248a, 248b, 248c, and 248d which are respectively formed in the nozzles 233a, 233b, and 233c and the buffer chamber 237. Owing to the above configuration, the gas may be equally supplied to the wafers 200, thereby uniformizing the thickness of a thin film formed on the wafers 200. Also, a gas flowing on surfaces of the wafers 200, i.e., a residual gas remaining after a reaction, flows toward an exhaust port, i.e., in the direction of the exhaust pipe 231 to be described below. However, a flowing direction of the residual gas may be appropriately defined by a location of the exhaust port, and is not limited to the vertical direction.

Through the first gas supply pipe 232a, for example, hexachlorodisilane ($Si_2Cl_6$, abbreviated to "HCDS") gas is supplied as a first source gas containing a predetermined element, e.g., silicon (Si), (first silicon-containing gas) into the process chamber 201 via the MFC 241a, the valve 243a, and the first nozzle 233a. That is, the first gas supply system is configured as a first source gas supply system (first silicon-containing gas supply system). Also, when a liquid source, e.g., HCDS, which is in a liquid state at normal temperature and pressure, is used, the liquid source is vaporized using a vaporizing system, such as a vaporizer or a bubbler, and is then supplied as the first source gas. At the same time, through the first inert gas supply pipe 232f, an inert gas may be supplied into the first gas supply pipe 232a via the MFC 241f and the valve 243f.

Through the second gas supply pipe 232b, for example, dichlorodisilane ($SiH_2Cl_2$) (DCS) gas is supplied as a second source gas containing a predetermined element, e.g., silicon (Si), (second silicon-containing gas) into the process chamber 201 via the MFC 241b, the valve 243b, and the second nozzle 233b. That is, the second gas supply system is configured as a second source gas supply system (second silicon-containing gas supply system). Also, when a liquid source, e.g., DCS, which is in a liquid state at normal temperature and normal pressure, is used, the liquid source is vaporized using a vaporizing system, such as a vaporizer or a bubbler, and is then supplied as the second source gas. At the same time, through the second inert gas supply pipe 232g, an inert gas may be supplied into the second gas supply pipe 232b via the MFC 241g and the valve 243g.

A source gas supply system mainly includes the first gas supply system (first source gas supply system) and the second gas supply system (second source gas supply system) that respectively supply the first source gas and the second source gas into the process chamber 201.

Through the third gas supply pipe 232c, a gas containing nitrogen (nitrogen-containing gas) is supplied as a nitriding gas, e.g., ammonia ($NH_3$) gas, into the process chamber 201 via the MFC 241c, the valve 243c, the third nozzle 233c, and the buffer chamber 237. That is, the third gas supply system is configured as a nitrogen-containing gas supply system (nitriding gas supply system). At the same time, an inert gas may be supplied into the third gas supply pipe 232c through the third inert gas supply pipe 232h via the MFC 241h and the valve 243h.

Through the fourth gas supply pipe 232d, a gas containing oxygen (oxygen-containing gas) is supplied as an oxidizing gas, e.g., oxygen ($O_2$) gas, into the process chamber 201 via the MFC 241d, the valve 243d, the third gas supply pipe 232c, the third nozzle 233c, and the buffer chamber 237. That is, the fourth gas supply system is configured as an oxygen-containing gas supply system (oxidizing gas supply system). At the same time, an inert gas may be supplied into the fourth gas supply pipe 232d through the fourth inert gas supply pipe 232i via the MFC 241i and the valve 243i.

Through the fifth gas supply pipe 232e, a gas containing hydrogen (hydrogen-containing gas), is supplied as a reducing gas, e.g., hydrogen ($H_2$) gas, into the process chamber 201 via the MFC 241e, the valve 243e, the third gas supply pipe 232c, the third nozzle 233c, and the buffer chamber 237. That is, the fifth gas supply system is configured as a hydrogen-containing gas supply system (reducing gas supply system). At the same time, an inert gas may be supplied into the fifth gas supply pipe 232e through the fifth inert gas supply pipe 232j via the MFC 241j and the valve 243j.

In the present embodiment, the HCDS gas and the DCS gas are supplied into the process chamber 201 through different nozzles but may be supplied into the process chamber 201 through the same nozzle. Although in the present embodiment, $NH_3$ gas, $O_2$ gas, and $H_2$ gas are supplied into the process chamber 201 (or the buffer chamber 237) through the same nozzle, these gases may be supplied into the process chamber 201 through different nozzles or only the $H_2$ gas may be supplied into the process chamber 201 through a different nozzle. However, if a plurality of types of gases are supplied through a common nozzle, the total number of nozzles that are to be used may be reduced, device costs may be reduced, and maintenance may also be easily performed. Also, at least one of the HCDS gas or the DCS gas, and the $H_2$ gas may be supplied through a common nozzle. In other words, the HCDS gas and the $H_2$ gas may be supplied through the same nozzle, the DCS gas and the $H_2$ gas may be supplied through the same nozzle, or the HCDS gas, the DCS gas, and the $H_2$ gas may be supplied through the same nozzle. Also, since at a film-forming temperature described below, the HCDS gas or the DCS gas does not react with the $H_2$ gas but may react with the $NH_3$ gas or the $O_2$ gas, the HCDS gas or the DCS gas, and the $NH_3$ gas or the $O_2$ gas may be supplied through different nozzles.

In the buffer chamber 237, a first rod-shaped electrode 269 and a second rod-shaped electrode 270 which are slender and long electrodes are provided from the lower portion of the reaction pipe 203 to the upper portion thereof, in the direction in which the wafers 200 are stacked, as illustrated in FIG. 2. The first rod-shaped electrode 269 and the second rod-shaped electrode 270 are disposed in parallel with the third nozzle 233c. Each of the first rod-shaped electrode 269 and the second rod-shaped electrode 270 is covered with an electrode protection pipe 275 which is configured to protect these electrodes from an upper portion to a lower portion thereof. One of the first rod-shaped electrode 269 and the second rod-shaped electrode 270 is connected to a high-frequency power source 273 via an impedance matching unit 272, and the other electrode is connected to the ground that is a reference electric potential. Plasma is generated in a plasma generating region 224 between the first and second rod-shaped electrodes 269 and 270 by supplying high-frequency power between the first and second rod-shaped electrodes 269 and 270 from the high-frequency power source 273 via the impedance matching unit 272. A plasma source is mainly configured as a plasma generator (plasma generation unit) by the first rod-shaped electrode 269, the second rod-shaped electrode 270, and the electrode protection pipe 275. The impedance matching unit 272 and the high-frequency power source 273 may be further included in the plasma source. The plasma source may also act as an activating mechanism that activates a gas to a plasma state, as will be described below.

The electrode protection pipe 275 has a structure in which the first and second rod-shaped electrodes 269 and 270 may be inserted into the buffer chamber 237 in a state in which the first and second rod-shaped electrodes 269 and 270 are isolated from an atmosphere in the buffer chamber 237. Here, if the concentration of oxygen in the electrode protection pipe 275 is substantially the same as that of oxygen in the external air (the atmosphere), the first and second rod-shaped electrodes 269 and 270 inserted into the electrode protection pipe 275 are oxidized by heat from the heater 207. Thus, the concentration of the oxygen in the electrode protection pipe 275 is reduced by filling the inside of the electrode protection pipe 275 with an inert gas, e.g., nitrogen gas, or by purging the inside of the electrode protection pipe 275 with an inert gas, e.g., nitrogen gas, using an inert gas purging mechanism, thereby preventing the first or second rod-shaped electrode 269 or 270 from being oxidized.

The exhaust pipe 231 is installed at the reaction pipe 203 to exhaust the atmosphere in the process chamber 201. A vacuum pump 246 which is a vacuum exhaust device is connected to the exhaust pipe 231 via a pressure sensor 245 which is a pressure detector (pressure detection unit) that detects pressure in the process chamber 201 and an auto pressure controller (APC) valve 244 which is a pressure adjustor (pressure adjustment unit). The APC valve 244 is configured to perform or suspend vacuum-exhaust in the process chamber 201 by opening/closing the APC valve 244 while the vacuum pump 246 is operated, and to adjust pressure in the process chamber 201 by controlling the degree of opening the APC valve 244 while the vacuum pump 246 is operated. An exhaust system mainly includes the exhaust pipe 231, the APC valve 244, and the pressure sensor 245. The vacuum pump 246 may be further included in the exhaust system. The exhaust system is configured to perform vacuum-exhaust such that the pressure in the process chamber 210 becomes a predetermined pressure (degree of vacuum) by adjusting the degree of opening the APC valve 244 based on pressure information detected by the pressure sensor 245 while the vacuum pump 246 is operated.

Below the reaction pipe 203, a seal cap 219 is installed as a furnace port lid that may air-tightly close a lower end aperture of the reaction pipe 203. The seal cap 219 is configured to contact a lower end of the reaction pipe 203 in a vertical direction from a lower portion thereof. The seal cap 219 is formed of a metal, such as stainless steel, and has a disk shape. An O-ring 220 is installed as a seal member that contacts the lower end of the reaction pipe 203 on an upper surface of the seal cap 219. A rotating mechanism 267 is installed as a substrate supporter that rotates the boat 217 at a side of the seal cap 219 opposite to the process chamber 201. A rotation shaft of the rotating mechanism 267 is connected to the boat 217 while passing through the seal cap 219. The rotating mechanism 267 is configured to rotate the wafers 200 by rotating the boat 217. The seal cap 219 is configured to be vertically moved upward/downward by a boat elevator 115 that is a lifting mechanism vertically installed outside the reaction pipe 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, inside or outside the process chamber 201.

The boat 217 is formed as a substrate supporter of a heat-resistant material, e.g., quartz or silicon carbide, and is configured to support the plurality of wafers 200 in a state in which the wafers 200 are arranged in a concentrically multi-layered structure in a horizontal posture. Below the boat 217, an insulating member 218 is formed of a heat-resistant material, e.g., quartz or silicon carbide, to prevent heat generated from the heater 207 from being delivered to the seal cap 219. Also, the insulating member 218 may include a plurality of insulating plates formed of a heat-resistant material, e.g., quartz or silicon carbide, and an insulating plate holder that supports the plurality of insulating plates in a multi-layered structure in a horizontal posture.

In the reaction pipe 203, a temperature sensor 263 is installed as a temperature detector. The temperature sensor 263 is configured to control an amount of current to be supplied to the heater 207 based on temperature information detected by the temperature sensor 263, so that the temperature in the process chamber 201 may have a desired temperature distribution. The temperature sensor 263 has an L-shape similar to the first to third nozzles 233a, 233b, and 233c, and is installed along an inner wall of the reaction pipe 203.

Figure 3:
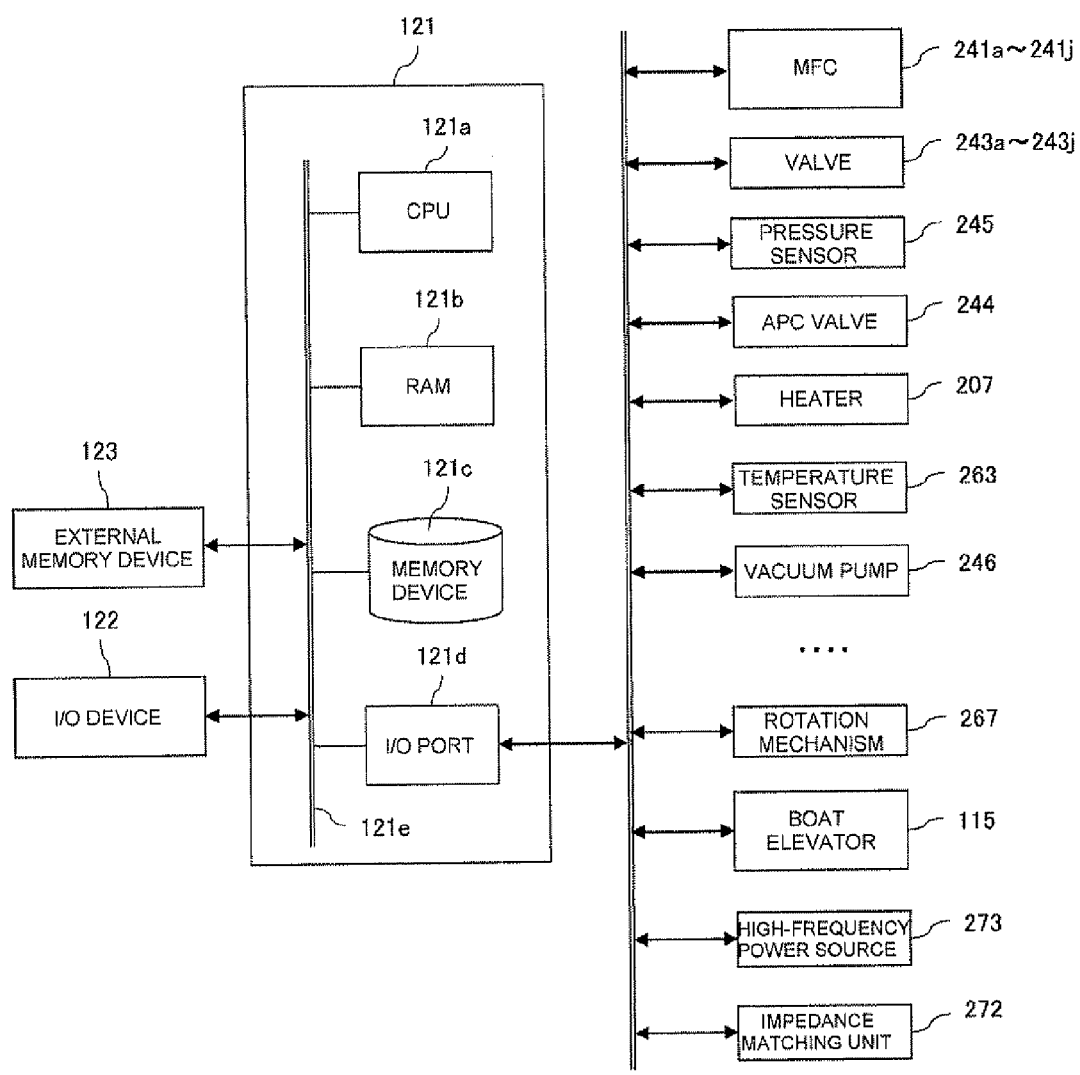
FIG. 3 is a schematic configuration diagram of a controller included in a substrate processing apparatus according to an embodiment of the present invention.

As illustrated in FIG. 3, a controller 121 which is a control unit (control member) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 212e. An I/O device 122 configured, for example, as a touch panel is connected to the controller 121.

The memory device 121c is configured, for example, as a flash memory, a hard disk drive (HDD), or the like. In the memory device 121c, a control program for controlling an operation of the substrate processing apparatus or a process recipe instructing an order or conditions of processing a substrate which will be described below are stored to be readable. The program recipe is a combination of processes designed to obtain a desired result when operations of a substrate processing process to be described below are performed by the controller 121, and acts as a program. Hereinafter, such a process recipe and a control program will be referred to together simply as a 'program.' Also, when the term 'program' is used in the present disclosure, it should be understood as including only program recipe groups, only control program groups, or both program recipe groups and control program groups. The RAM 221b is configured as a work area for temporarily storing a program or data read by the CPU 221a.

The I/O port 121d is connected to the MFCs 241a, 241b, 241c, 241d, 241e, 241f, 241g, 241h, 241i, and 241j, the valves 243a, 243b, 243c, 243d, 243e, 243f, 243g, 243h, 243i, and 243j, the pressure sensor 245, the APC valve 244, the vacuum pump 246, the heater 207, the temperature sensor 263, the rotating mechanism 267, the boat elevator 115, the high-frequency power source 273, the impedance matching unit 272, and the like.

The CPU 221a reads the process recipe from the memory device 121c according to a manipulation command received via the I/O device 122 while reading and executing the control program from the memory device 121c. Also, according to the read program recipe, the CPU 121a controls flow rates of various gases via the MFCs 241a, 241b, 241c, 241d, 241e, 241f, 241g, 241h, 241i, and 241j; controls opening/closing of the valves 243a, 243b, 243c, 243d, 243e, 243f, 243g, 243h, 243i, and 243j; controls opening/closing of the APC valve 244; controls the degree of pressure using the APC valve 244, based on the pressure sensor 245; controls temperature using the heater 207, based on the temperature sensor 263; controls driving/suspending of the vacuum pump 246, controls rotation and rotation speed of the boat using the rotating mechanism 267; controls upward/downward movement of the boat 217 using the boat elevator 115; controls an amount of power to be supplied from the high-frequency power source 273; and controls an impedance by the impedance matching unit 272.

The controller 121 is not limited to a personal computer, and may be configured as a general-purpose computer. For example, the controller 121 according to the present embodiment may be configured by preparing an external memory device 123 storing such programs, e.g., a magnetic disk (a magnetic tape, a flexible disk, a hard disk, etc.), an optical disc (a compact disk (CD) or a digital versatile disc (DVD), etc.), a magneto-optical disc (MO), or a semiconductor memory (a universal serial bus (USB) memory, a memory card, etc.), and then installing the programs in a general-purpose computer using the external storage device 123. Also, a method of supplying a program to a computer is not limited to using the external memory device 123. For example, a communication unit, e.g., the Internet or an exclusive line, may be used to supply a program to a computer without having to use the external memory device 123. The memory device 121c or the external memory device 123 may be configured as a non-transitory computer-readable recording medium. Hereinafter, the storage device 121c and the external storage device 123 may also be referred to together simply as a 'recording medium.' Also, when the term 'recording medium' is used in the present disclosure, it may be understood as a case in which only groups of the memory devices 121c are included, a case in which only groups of the external memory devices 123 are included, or a case in which both groups of the memory devices 121c and groups of the external memory devices 123 are used.

(2) Substrate Processing Process

Figure 4:
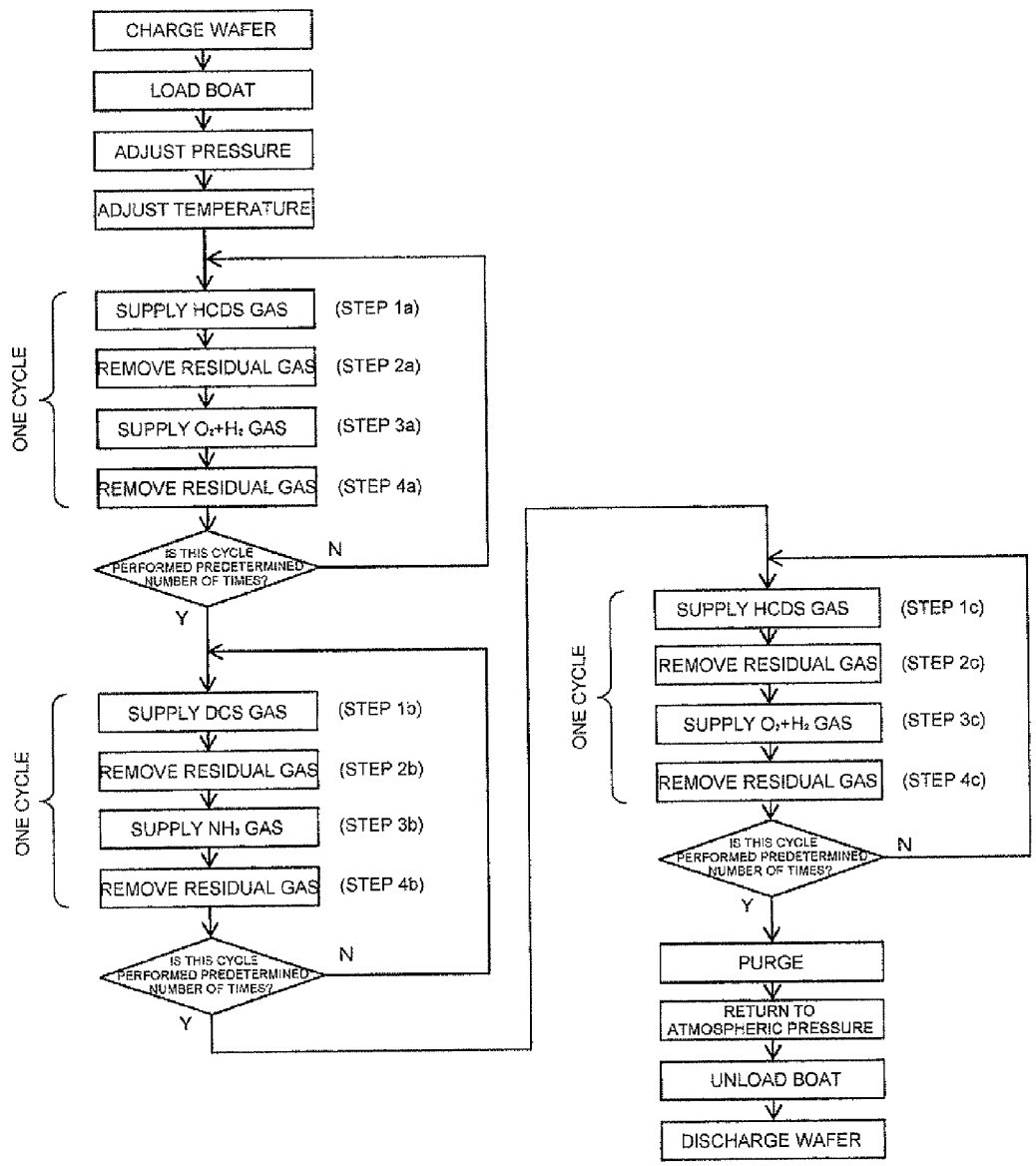
FIG. 4 is a flowchart illustrating a method of forming a film according to a first embodiment of the present invention.
Figure 11:
FIG. 11 is a gas supply timing chart according to the first embodiment of the present invention.

Next, forming an insulating film having an ONO stacked structure in which a first oxide film, a nitride film, and a second oxide film are sequentially formed, on a substrate using the process furnace 202 of the above-described substrate processing apparatus, will be described as one process of a process of manufacturing a semiconductor device with reference to FIGS. 4 and 11. FIG. 4 is a flowchart illustrating a method of forming a film according to the present embodiment. FIG. 11 is a gas supply timing chart according to the present embodiment. In the description below, operations of elements of the substrate processing apparatus are controlled by the controller 121.

In the present embodiment, the process of forming a first oxide film on a substrate by performing a first cycle a predetermined numbers of times, the first cycle including supplying a first source gas and supplying an oxidizing gas (oxygen-containing gas) and a reducing gas (hydrogen-containing gas) to a substrate heated to a first temperature in a process container under a pressure lower than the atmospheric pressure;

the process of forming a nitride film on the first oxide film by performing a second cycle a predetermined numbers of times, the second cycle including supplying a second source gas and supplying a nitriding gas (nitrogen-containing gas) on the substrate heated to a second temperature within the process container; and the process of forming a second oxide film on the nitride film by performing a third cycle a predetermined number of times, the third cycle including supplying the first source gas and supplying the oxidizing gas (oxygen-containing gas) and the reducing gas (hydrogen-containing gas) to the substrate heated to the first temperature within the container under a pressure lower than atmospheric pressure are performed.

That is, in the present embodiment, the process of forming the first oxide film on the substrate by alternately and repeatedly performing the process of supplying the first source gas and the process of supplying the oxygen-containing gas and the hydrogen-containing gas to the substrate heated to the first temperature within the process container under the pressure lower than atmospheric pressure;

the process of forming the nitride film on the first oxide film by alternately and repeatedly performing the process of supplying the second source gas to the substrate heated to the second temperature within the process container under the pressure lower than atmospheric pressure and the process of supplying the nitrogen-containing gas; and the process of forming the second oxide film on the nitride film by alternately and repeatedly performing the process of supplying the first source gas to the substrate heated to the first temperature within the process container under the pressure lower than atmospheric pressure and the process of supplying the oxygen-containing gas and the hydrogen-containing gas are performed.

The process of forming the first oxide film, the process of forming the nitride film, and the process of forming the second oxide film are continuously performed within the process container.

Also, in the process of forming the first oxide film and the process of forming the second oxide film according to the present embodiment, a cycle including the process of supplying the first source gas and the process of supplying the oxygen-containing gas and the hydrogen-containing gas is repeatedly performed several times. In the process of forming the first oxide film and the process of forming the second oxide film, the oxygen-containing gas and the hydrogen-containing gas are activated by heat and are then supplied.

In the process of forming the nitride film according to the present embodiment, a cycle including the process of supplying the second source gas and the process of supplying the nitrogen-containing gas is repeatedly performed several times. In the process of forming the nitride film, the nitrogen-containing gas is activated by heat or plasma and is then supplied.

A sequence of forming a film according to the present embodiment will now be described in greater detail. Here, a silicon oxide film ($SiO_2$ film) (hereinafter, referred also to as a 'first silicon oxide film' or a 'first SiO film') is formed as a first oxide film on a wafer 200 serving as a substrate using HCDS gas as a first source gas, $O_2$ gas as an oxygen-containing gas, $H_2$ gas as a hydrogen-containing gas, and $N_2$ gas as a purge gas. Then, a silicon nitride film ($Si_3N_4$ film) (hereinafter, referred to also as a 'SiN film') is formed as a nitride film on the first silicon oxide film as an underlying film using DCS gas, having a higher pyrolysis temperature and a lower reactivity than HCDS gas, as a second source gas, using $NH_3$ gas as a nitrogen-containing gas, and using $N_2$ gas as a purge gas. Then, a silicon oxide film ($SiO_2$ film) (hereinafter, referred to also as a 'second silicon oxide film' or a 'second SiO film') is formed as a second oxide film on the silicon nitride film as an underlying film using the HCDS gas as the first source gas, $O_2$ gas as the oxygen-containing gas, $H_2$ gas as the hydrogen-containing gas, and $N_2$ gas as a purge gas. Thus, an insulating film having an ONO stacked structure in which the first silicon oxide film, the silicon nitride film, and the second silicon oxide film are sequentially stacked is formed on the wafer 200. Also, as will be described below, the process of forming the first silicon oxide film, the process of forming the silicon nitride film, and the process of forming the second silicon oxide film are continuously performed within the same process container (in-situ).

When the term 'wafer' is used in the present disclosure, it should be understood as either the wafer itself, or both the wafer and a stacked structure (assembly) including a layer/film formed on the wafer, i.e., the wafer having the layer/film formed thereon may also be referred to together as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer including a stacked structure.

Thus, in the present disclosure, the expression 'predetermined gas is supplied to a wafer' should be understood to mean that the predetermined gas is directly supplied onto a surface (exposed surface) of the wafer or that the predetermined gas is supplied onto a surface of a layer/film on the wafer, i.e., the uppermost surface of the wafer including a stacked structure. Also, in the present disclosure, the expression 'a layer (or film) is formed on the wafer' should be understood to mean that the layer (or film) is directly formed on a surface (exposed surface) of the wafer itself or mean that the predetermined layer (or film) is formed on a layer/film on the wafer, i.e., on the uppermost surface of the wafer including the stacked structure.

Also, in the present disclosure, the term 'substrate' has the same meaning as the term 'wafer.' Thus, the term 'wafer' may be interchangeable with the term 'substrate'.

(Wafer Charging and Boat Loading)

When a plurality of wafers 200 are placed in the boat 217 (wafer charging), the boat 217 supporting the plurality of wafers 200 is lifted by the boat elevator 115 to be loaded into the process chamber 201 (boat loading), as illustrated in FIG. 1. In this state, the lower end of the reaction pipe 203 is air-tightly closed by the seal cap 219 via the O-ring 220.

(Pressure & Temperature Control)

The inside of the process chamber 201 is vacuum-exhausted to have a desired pressure (degree of vacuum) by the vacuum pump 246. In this case, the pressure in the process chamber 201 is measured by the pressure sensor 245, and the APC valve 244 is feedback-controlled based on the measured pressure information (pressure control). The vacuum pump 246 is kept operated at least until processing of the wafers 200 is completed. Also, the inside of the process chamber 201 is heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 begins by the rotating mechanism 267. Also, the rotation of the boat 217 and the wafers 200 by the rotating mechanism 267 is continuously performed at least until the processing of the wafers 200 is completed.

(Process of Forming First Silicon Oxide Film)

Then, a first silicon oxide film is formed to a predetermined thickness on the wafer 200 by repeatedly performing a cycle including steps 1a to 4a to be described below, several times.

[Step 1a]

HCDS gas is supplied into the first gas supply pipe 232a by opening the valve 243a of the first gas supply pipe 232a. The HCDS gas flows through the first gas supply pipe 232a and the flow rate thereof is adjusted by the MFC 241a. The HCDS gas having the adjusted flow rate is supplied into the heated and reduced-pressure process chamber 201 via the gas supply holes 248a of the first nozzle 233, and is exhausted via the exhaust pipe 231 (supply of HCDS gas).

In this case, $N_2$ gas may be supplied as an inert gas via the first inert gas supply pipe 232f by opening the valve 243f of the first inert gas supply pipe 232f. The flow rate of the $N_2$ gas is adjusted by the MFC 241f and the $N_2$ gas is then supplied into the first gas supply pipe 232a. The $N_2$ gas having the adjusted flow rate is mixed with the HCDS gas having the adjusted flow rate within the first gas supply pipe 232a, is supplied into the heated and reduced-pressure process chamber 201 via the gas supply holes 248a of the first nozzle 233a, and is then exhausted via the exhaust pipe 231. In this case, in order to prevent the HCDS gas from flowing through the buffer chamber 237, the second nozzle 233b, or the third nozzle 233c, $N_2$ gas is supplied into the second inert gas supply pipe 232g, the third inert gas supply pipe 232h, the fourth inert gas supply pipe 232i, and the fifth inert gas supply pipe 232j by opening the valves 243g, 243h, 243i, and 243j. The $N_2$ gas is supplied into the process chamber 201 via the second gas supply pipe 232b, the third gas supply pipe 232c, the fourth gas supply pipe 232d, the fifth gas supply pipe 232e, the second nozzle 233b, the third nozzle 233c, and the buffer chamber 237, and is exhausted via the exhaust pipe 231.

In this case, the pressure in the process chamber 201 is maintained constant to be less than atmospheric pressure, e.g., to fall within a range from 10 to 1,000 Pa, by appropriately controlling the APC valve 244. The flow rate of the HCDS gas is controlled by the MFC 241a, for example, to fall within a range of 10 to 1,000 sccm (0.01 to 1 slm). The flow rate of the $N_2$ gas is controlled by each of the MFCs 241f, 241g, 241h, 241i, and 241j, for example, to fall within a range of 100 to 2,000 sccm (0.1 to 2 slm). A time period in which the HCDS gas is supplied to the wafer 200, i.e., a gas supply time (irradiation time), is set to range, for example, from 1 to 120 seconds. The temperature of the heater 207 is set to generate a CVD reaction in the process chamber 201 under the pressure described above. That is, the temperature of the heater 207 is set in such a manner that the wafer 200 may have a temperature ranging from, for example, 350 to 800° C., preferably 450 to 800° C., and more preferably, 550 to 750° C. If the temperature of the wafer 200 is less than 350° C., it is difficult for the HCDS gas to be decomposed on or adsorbed onto the wafer 200. If the temperature of the wafer 200 is not less than 450° C., remarkable effects may be achieved when oxidizing power is increased in Step 3a which will be described below. If the temperature of the wafer 200 is not less than 550° C., the HCDS gas may be sufficiently decomposed. If the temperature of the wafer 200 is greater than 750° C. and particularly, 800° C., a CVD reaction becomes strong, thereby greatly degrading the thickness uniformity. Thus, the temperature of the wafer 200 may be set to 350 to 800° C., preferably to 450 to 800° C., and more preferably, to 550 to 750° C.

Under the conditions described above, i.e., conditions of causing a CVD reaction, the HCDS gas is supplied to the process chamber 201 to form a silicon-containing layer on the wafer 200 (an underlying film formed on the wafer 200) to a thickness of less than one atomic layer to several atomic layers. The silicon-containing layer may include at least one of an adsorption layer of HCDS gas and a silicon (Si) layer. However, the silicon-containing layer may preferably include silicon (Si) and chlorine (Cl).

Here, the silicon layer generally refers to all layers including continuous layers formed of silicon (Si), discontinuous layers formed of silicon (Si), or a silicon thin film formed by overlapping the continuous layers and the discontinuous layers. The continuous layers formed of silicon (Si) may also be referred to together as a silicon thin film. Also, silicon (Si) used to form the silicon layer should be understood as including silicon (Si) from which a bond with chlorine (Cl) is not completely separated.

Examples of the adsorption layer of HCDS gas include not only continuous chemical adsorption layers including gas molecules of the HCDS gas but also discontinuous chemical adsorption layers including gas molecules of the HCDS gas. That is, the adsorption layer of HCDS gas includes a chemical adsorption layer formed of HCDS molecules to a thickness of one or less than one molecular layer. Also, examples of HCDS ($Si_2Cl_6$) molecules of the adsorption layer of HCDS gas may include molecules in which a bond between silicon (Si) and chlorine (Cl) is partially separated ($Si_xCl_y$). That is, examples of the adsorption layer of HCDS include continuous or discontinuous chemical adsorption layers including $Si_2Cl_6$ molecules and/or $Si_xCl_y$ molecules. Also, a layer having a thickness of less than one atomic layer means a discontinuously formed atomic layer, and a layer having a thickness of one atomic layer means a continuously formed atomic layer. A layer having a thickness less than one molecular layer means a discontinuously formed molecular layer, and a layer having a thickness of one molecular layer means a continuously formed molecular layer.

Silicon (Si) is deposited on the wafer 200 to form a silicon layer on the wafer 200 under conditions in which the HCDS gas is self-decomposed (pyrolyzed), i.e., conditions causing a pyrolysis reaction of the HCDS gas. The HCDS gas is adsorbed onto the wafer 200 to form an adsorption layer of HCDS gas on the wafer 200 under conditions in which the HCDS gas is not self-decomposed (pyrolyzed), i.e., conditions that do not cause a pyrolysis reaction of the HCDS gas. A film-forming rate may be higher when the silicon layer is formed on the wafer 200 than when the adsorption layer of HCDS gas is formed on the wafer 200. For example, a cycle rate may be increased by increasing an oxidizing power in Step 3a by forming a silicon layer on the wafer 200 to a thickness corresponding to several atomic layers, thereby increasing the film-forming rate.

If the thickness of the silicon-containing layer formed on the wafer 200 exceeds a thickness of several atomic layers, then an oxidization (modification) action does not have an effect on the entire silicon-containing layer in Step 3a to be described below. The silicon-containing layer formed on the wafer 200 may have a minimum thickness of less than one atomic layer. Thus, the silicon-containing layer may be set to have a thickness of less than one atomic layer to several atomic layers. Also, by controlling the silicon-containing layer to have a thickness not more than one atomic layer, i.e., a thickness of less than one atomic layer or of one atomic layer, an action of an oxidization reaction (modification reaction) in Step 3a to be described below may be relatively increased, and a time required for the oxidization reaction (modification reaction) in Step 3a may thus be reduced. Also, a time required to form the silicon-containing layer in Step 1a may be reduced. Accordingly, a time required to process each cycle may be reduced, and a time required to process a total of cycles may thus be reduced. That is, a film-forming rate may be increased. Also, thickness uniformity may be controlled to be increased by controlling the silicon-containing layer to have a thickness of less than one atomic layer.

In addition to hexachlorodisilane ($Si_2Cl_6$, abbreviated to HCDS) gas, an inorganic source, e.g., tetrachlorosilane, i.e., silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas, or monosilane ($SiH_4$) gas; or an organic source, such as an aminosilane-based gas, e.g., tetrakisdimethylaminosilane ($Si[N(CH_3)_2]_4$, abbreviated to 4DMAS) gas, trisdimethylaminosilane ($Si[N(CH_3)_2]_3H$, abbreviated to 3DMAS) gas, bisdiethylaminosilane ($Si[N(C_2H_5)_2]_2H_2$, abbreviated to 2DEAS) gas, or bistertiarybutylaminosilane ($SiH_2[NH(C_4H_9)]_2$, abbreviated to BTBAS), gas may be used as the first source gas (first silicon-containing gas). In addition to $N_2$ gas, a rare gas, e.g., Ar gas, He gas, Ne gas, or Xe gas, may be used as the inert gas.

[Step 2a]

After the silicon-containing layer is formed on the wafer 200, the valve 243a of the first gas supply pipe 232a is closed to suspend supplying of the HCDS gas. In this case, the inside of the process chamber 201 is exhausted via the vacuum pump 246 while the APC valve 244 of the exhaust pipe 231 is open, so as to exclude an unreacted or residual HCDS gas remaining in the process chamber 201 after the silicon-containing layer is formed, from the process chamber 201. The $N_2$ gas continues to be supplied as an inert gas into the process chamber 201 while the valves 243f, 243g, 243h, 243i, and 243j are open. The $N_2$ gas acts as a purge gas to guarantee the excluding of the unreacted or residual HCDS gas remaining in the process chamber 201 after the silicon-containing layer is formed, from the process chamber 201 (removing of residual gas).

Alternatively, the residual gas may not be completely excluded from the process chamber 201 and the inside of the process chamber 201 may not be completely purged. When the amount of the residual gas remaining in the process chamber 201 is small, Step 3a performed thereafter may not negatively influenced by the residual gas. In this case, the flow rate of the $N_2$ gas supplied into the process chamber 201 does not need to be high. For example, the inside of the process chamber 201 may be purged by supplying the amount of $N_2$ gas, which corresponds to the capacity of the reaction pipe 203 (or the process chamber 201), without causing negative influences in Step 3a. As described above, the inside of the process chamber 201 may not be completely purged to reduce a purging time, thereby improving the throughput. Also, unnecessary consumption of the $N_2$ gas may be suppressed.

In this case, the temperature of the heater 207 is set, for example, to fall within a range of 350 to 800° C., preferably, a range of 450 to 800° C., and more preferably, a range of 550 to 750° C., similar to the temperature of the wafer 200 when the HCDS gas is supplied thereto. The supply flow rate of the $N_2$ gas supplied as a purge gas via each inert gas supply system may range, for example, from 100 to 2,000 sccm (0.1 to 2 sim). Alternatively, a rare gas, e.g., Ar gas, He gas, Ne gas, or Xe gas, may be used as the purge gas, instead of $N_2$ gas.

[Step 3a]

After the residual gas is removed from the process chamber 201, the valve 243d of the fourth gas supply pipe 232d is opened to supply $O_2$ gas into the fourth gas supply pipe 232d. The $O_2$ gas flows through the fourth gas supply pipe 232d and the flow rate of the $O_2$ gas is then adjusted by the MFC 241d. The $O_2$ gas having the adjusted flow rate flows through the third gas supply pipe 232c and is then supplied into the heated and reduced-pressure buffer chamber 237 via the gas supply holes 248c of the third nozzle 233c. At the same time, $H_2$ gas is supplied into the fifth gas supply pipe 232e by opening the valve 243e of the fifth gas supply pipe 232e. The $H_2$ gas flows through the fifth gas supply pipe 232e and the flow rate of the $H_2$ gas is then adjusted by the MFC 241e. The $H_2$ gas having the adjusted flow rate flows through the third gas supply pipe 232c and is then supplied into the heated and reduced-pressure buffer chamber 237 via the gas supply holes 248c of the third nozzle 233c. When the $H_2$ gas flows through the third gas supply pipe 232c, the $H_2$ gas is mixed with the $O_2$ gas in the third gas supply pipe 232c. That is, a mixed gas of the $O_2$ gas and the $H_2$ gas is supplied via the third nozzle 233c. The mixed gas of the $O_2$ gas and the $H_2$ gas supplied into the buffer chamber 237 is supplied into the heated and reduced-pressure buffer chamber 237 via the gas supply holes 248d of the buffer chamber 237, and is then exhausted via the exhaust pipe 231 (supply of $O_2$ gas+$H_2$ gas).

In this case, $N_2$ gas may be further supplied as an inert gas via the fourth inert gas supply pipe 232i by opening the valve 243i of the fourth inert gas supply pipe 232i. The flow rate of the $N_2$ gas is adjusted by the MFC 241i and the $N_2$ gas is then supplied into the fourth gas supply pipe 232d. Also, the $N_2$ gas may be supplied as an inert gas via the fifth inert gas supply pipe 232j by opening the valve 243j of the fifth inert gas supply pipe 232j. The flow rate of the $N_2$ gas is adjusted by the MFC 241j and the $N_2$ gas is then supplied into the fifth gas supply pipe 232e. In this case, a mixed gas of the $O_2$ gas, the $H_2$ gas, and the $N_2$ gas is supplied via the third nozzle 233c. Alternatively, a rare gas, such as Ar gas, He gas, Ne gas, or Xe gas, may be used as the inert gas, instead of $N_2$ gas. In this case, $N_2$ gas is supplied into the first to third inert gas supply pipes 232f, 232g, and 232h by opening the valves 243f, 243g, and 243h so as to prevent the $O_2$ gas and the $H_2$ gas from being supplied into the first nozzle 233a, the second nozzle 233b, or an upstream side of the third gas supply pipe 232c. The $N_2$ gas is supplied into the process chamber 201 via the first gas supply pipe 232a, the second gas supply pipe 232b, the third gas supply pipe 232c, the first nozzle 233a, the second nozzle 233b, the third nozzle 233c, and the buffer chamber 237, and is exhausted via the exhaust pipe 231.

In this case, the pressure in the process chamber 201 is maintained constant to be less than atmospheric pressure, e.g., to fall within a range from 1 to 1,000 Pa, by appropriately controlling the APC valve 244. The supply flow rate of the $O_2$ gas is adjusted by the MFC 241d to range, for example, from 1,000 to 10,000 sccm (1 to 10 slm). The supply flow rate of the $H_2$ gas is adjusted by the MFC 241e to range, for example, from 1,000 to 10,000 sccm (1 to 10 slm). The supply flow rate of $N_2$ gas is respectively adjusted by the MFCs 241i, 241j, 241f, 241g, and 241h to range, for example, from 100 to 2,000 sccm (0.1 to 2 slm). A time period in which the $O_2$ gas and the $H_2$ gas are supplied to the wafer 200, i.e., a gas supply time (irradiation time), is set to range, for example, from 1 to 120 seconds. The temperature of the heater 207 is set to heat the wafer 200 to a temperature at which oxidizing power may be remarkably increased when supplying the HCDS gas, in step 1a, e.g., 450 to 800° C., and preferably, 550 to 750° C. When the temperature of the heater 207 is set as described above, an effect achieved when an oxidizing power is increased by adding $H_2$ gas to $O_2$ gas under a reduced-pressure atmosphere was greatly improved, as will be described below. Also, the oxidizing power could not be increased when the temperature of the wafer 200 was excessively low. As described above, when the throughput is considered, the temperature of the heater 207 may be set to maintain the temperature in the process chamber 201 in Steps 1a to 3a as described above. Also, the temperature of the heater 207 may be set to maintain the temperature in the process chamber 201 in Steps 1a to 4a (which will be described below). In this case, the temperature of the heater 207 may be set in such a manner that in Steps 1a to 4a, the temperature in the process chamber 201 may be maintained constant to fall within, for example, a range from 450 to 800° C., and preferably, a range from 550 to 750° C.

When the $O_2$ gas and the $H_2$ gas are supplied into the process chamber 201 under the conditions described above, the $O_2$ gas and $H_2$ gas react to be thermally activated to a non-plasma state under a heated and reduced-pressure atmosphere, thereby generating a moisture ($H_2O$)-free oxidized species containing oxygen, e.g., atomic oxygen (O). The silicon-containing layer formed on the wafer in Step 1a is mainly oxidized by the oxidized species and is thus changed (modified) into a silicon oxide ($SiO_2$) layer (hereinafter referred to simply as 'SiO layer'). Oxidizing power may be more highly increased when oxidation is performed as described above than when only $O_2$ gas is supplied. In other words, oxidizing power may be more highly increased by adding $H_2$ gas to $O_2$ gas under the reduced-pressure atmosphere than when only $O_2$ gas is supplied.

In this case, at least one of $O_2$ gas and $H_2$ gas may be activated to a plasma state and may then be supplied. By activating and supplying $O_2$ gas and/or $H_2$ gas to the plasma state, oxidized species including active species having higher energy may be generated. Also, when oxidization is performed using the oxidized species, device characteristics may be improved, For example, if both $O_2$ gas and $H_2$ gas are activated to the plasma state, then a mixed gas of $O_2$ gas and $H_2$ gas supplied into the buffer chamber 237 is activated to a plasma state (excited to plasma) by supplying high-frequency power between the first rod-shaped electrode 269 and the second rod-shaped electrode 270 from the high-frequency power source 273 via the impedance matching unit 272, is supplied into the process chamber 201 as a gas containing active species, i.e., a gas (oxidized species) containing $O_2$* (active species of oxygen) or $H_2$* (active species of hydrogen), via the gas supply hole 248d), and is exhausted via the exhaust pipe 231. In this case, the high-frequency power supplied between the first rod-shaped electrode 269 and the second rod-shaped electrode 270 from the high-frequency power source 273 is set to fall within, for example, a range from 50 to 1,000 W. The other process conditions are set similar to those described above. Also, at the temperature range described above, $O_2$ gas and $H_2$ gas are thermally activated to sufficiently react with each other to generate oxidized species including, for example, a sufficient amount of atomic oxygen (O). Thus, even if $O_2$ gas and $H_2$ gas are thermally activated to a non-plasma state, a sufficient amount of oxidizing power may be obtained. Also, when $O_2$ gas and $H_2$ gas are thermally activated and are then supplied, soft reactions may be generated without causing plasma damage and the oxidization described above may be softly performed.

Alternatively, ozone ($O_3$) gas may be used as an oxygen-containing gas, i.e., an oxidizing gas, instead of oxygen ($O_2$) gas. Also, in the temperature range described above, when a hydrogen-containing gas was added to nitric oxide (NO) gas or nitrous oxide ($N_2O$) gas, oxidizing power was not remarkably increased compared to when only NO gas or $N_2O$ gas was supplied. In other words, an oxygen-containing gas including no nitrogen (gas including oxygen rather than nitrogen) may be used as the oxygen-containing gas. Deuterium ($D_2$) gas may be used as a hydrogen-containing gas, i.e., a reducing gas, instead of hydrogen ($H_2$) gas. If ammonia ($NH_3$) gas or methane ($CH_4$) gas is used, nitrogen (N) impurities or carbon (C) impurities may penetrate into a film. That is, a hydrogen-containing gas including no other elements (a gas including only hydrogen or deuterium) may be used as the hydrogen-containing gas. In other words, at least one gas selected from the group consisting of $O_2$ gas and $O_3$ gas may be used as the oxygen-containing gas, and at least one gas selected from the group consisting of $H_2$ gas and $D_2$ gas may be used as the hydrogen-containing gas.

[Step 4a]

After the silicon-containing layer is changed into the silicon oxide layer, the supply of $O_2$ gas is suspended by closing the valve 243d of the fourth gas supply pipe 232d. Also, the supply of $H_2$ gas is suspended by closing the valve 243e of the fifth gas supply pipe 232e. In this case, the inside of the process chamber 201 is exhausted by the vacuum pump 246 while the APC valve 244 of the exhaust pipe 231 is open, thereby excluding non-reacted or residual $O_2$ gas or $H_2$ gas or reacted by-products remaining in the process chamber 201 after the silicon oxide layer is formed, from the process chamber 201. Also, $N_2$ gas is continuously supplied as an inert gas into the process chamber 201 while the valves 243i, 243j, 243f, 243g, and 243h are open. The $N_2$ gas acts as a purge gas to guarantee the exclusion of the non-reacted or residual $O_2$ gas or $H_2$ gas or reacted by-products remaining in the process chamber 201 after the silicon oxide layer is formed, from the process chamber 201 (removing of residual gases).

Alternatively, the residual gases remaining in the process chamber 201 may not be completely excluded from the process chamber 201, and the inside of the process chamber 201 may not be completely purged. If the amounts of the residual gases in the process chamber 201 are small, Step 1a performed thereafter will not be negatively influenced by the residual gases. In this case, the flow rate of $N_2$ gas supplied into the process chamber 201 need not be high. For example, the inside of the process chamber 201 may be purged by supplying the amount of $N_2$ gas corresponding to the capacity of the reaction pipe 203 (or the process chamber 201) into the process chamber 201 without causing negative influences in Step 1a. By not completely purging the inside of the process chamber 201, a purging time may be reduced, thus improving the throughput. Also, unnecessary consumption of $N_2$ gas may be suppressed.

In this case, the temperature of the heater 207 is set in such a manner that the temperature of the wafer 200 may range, for example, from 450 to 800° C., and preferably, from 550 to 750° C., similar to when $O_2$ gas and $H_2$ gas are supplied. The supply flow rate of $N_2$ gas supplied as a purge gas via each inert gas supply system is set to range, for example, from 100 to 2,000 seem (0.1 to 2 slm). A rare gas, e.g., Ar gas, He gas, Ne gas, or Xe gas, may be used as a purge gas instead of $N_2$ gas.

The first silicon oxide film may be formed on the wafer 200 to a predetermined thickness by repeatedly performing a cycle including Steps 1a to 4a several times. The first silicon oxide film is used as an underlying film of a silicon nitride film formed during a subsequent process described below.

(Process of Forming Silicon Nitride Film)

Then, the silicon nitride film is formed on the first silicon oxide film as an underlying film to a predetermined thickness by repeatedly performing a cycle including Steps 1b to 4b described below several times. Here, DCS gas having a higher pyrolysis temperature and a lower reactivity than HCDS gas used to form the first silicon oxide film is used as a second source gas. Also, the silicon nitride film is formed in such a manner that the difference between the temperature of the wafer 200 when the silicon nitride film is formed and the temperature of the wafer 200 when the first silicon oxide film is formed may be set to be less than 150° C., and preferably, less than 100° C.

[Step 1b]

DCS gas is supplied into the second gas supply pipe 232b by opening the valve 243b of the second gas supply pipe 232b. The DCS gas flows through the second gas supply pipe 232b and the flow rate of the DCS gas is adjusted by the MFC 241b. The DCS gas having the adjusted flow rate is supplied into the heated and reduced-pressure process chamber 201 via the gas supply holes 248b of the second nozzle 233b, and is exhausted via the exhaust pipe 231 (supply of DCS gas).

In this case, $N_2$ gas may be supplied as an inert gas via the second inert gas supply pipe 232g by opening the valve 243g of the second inert gas supply pipe 232g. The flow rate of the $N_2$ gas is adjusted by the MFC 241g and the $N_2$ gas is then supplied into the second gas supply pipe 232b. The $N_2$ gas having the adjusted flow rate is mixed with the DCS gas having the adjusted flow rate in the second gas supply pipe 232b, and the resultant mixed gas is supplied into the heated and reduced-pressure process chamber 201 via the gas supply holes 248b of the second nozzle 233b and is exhausted via the exhaust pipe 231. In this case, in order to prevent the DCS gas from being supplied into the buffer chamber 237, the first nozzle 233a, or the third nozzle 233c, $N_2$ gas is supplied into the first inert gas supply pipe 232f, the third inert gas supply pipe 232h, the fourth inert gas supply pipe 232i, and the fifth inert gas supply pipe 232j by opening the valves 243f, 243h, 243i, and 243j. The $N_2$ gas is supplied into the process chamber 201 via the first gas supply pipe 232a, the third gas supply pipe 232c, the fourth gas supply pipe 232d, the fifth gas supply pipe 232e, the first nozzle 233a, the third nozzle 233c, and the buffer chamber 237, and is exhausted via the exhaust pipe 231.

In this case, the pressure in the process chamber 201 is maintained constant to be less than atmospheric pressure, e.g., within a range of, for example, 10 to 1,000 Pa, by appropriately controlling the APC valve 244. The supply flow rate of the DCS gas controlled by the MFC 241b is set to range, for example, from 10 to 1,000 sccm (0.01 to 1 slm). The supply flow rate of $N_2$ gas controlled by each of the MFCs 241g, 241f, 241h, 241i, and 241j is set to range, for example, from 100 to 2,000 seem (0.1 to 2 slm). A time period in which DCS gas is supplied to the wafer 200, i.e., a gas supply time (irradiation time), is set to range, for example, within 1 to 120 seconds. The temperature of the heater 207 is set to generate a CDS reaction under the pressure described above. That is, the temperature of the heater 207 is set in such a manner that the temperature of the wafer 200 may range, for example, from 550 to 800° C., preferably, from 600 to 800° C., and more preferably, from 650 to 750° C. If the temperature of the wafer 200 is less than 550° C., it is difficult for the DCS gas to be decomposed on or adsorbed onto the wafer 200. If the temperature of the wafer 200 is less than 600° C., the DCS gas cannot be sufficiently decomposed on or adsorbed onto the wafer 200, thereby preventing a practical film-forming rate from being achieved. If the temperature of the wafer 200 is not less than 650° C., the DCS gas may be sufficiently decomposed and adsorbed onto the wafer 200, thereby achieving the practical film-forming rate. If the temperature of the wafer 200 is greater than 750° C., and particularly, 800° C., a CVD reaction may be strong and thickness uniformity may be degraded. Thus, the temperature of the wafer 200 may to be set to range from 550 to 800° C., preferably, 600 to 800° C., and more preferably, 650 to 750° C. Also, the temperature of the wafer 200 may be the same as when the first silicon oxide film is formed but is not limited thereto. For example, if HCDS gas is used as in the present embodiment to form the first silicon oxide film and DCS gas having a lower reactivity than when the HCDS gas is used to form the silicon nitride film, then the temperature of the wafer 200 (second temperature) when the silicon nitride film is formed may be higher than the temperature of the wafer 200 (first temperature) when the first silicon oxide film is formed. In this case, the difference between the first temperature and the second temperature may be set to be less than 150° C., and preferably, less than 100° C. so as to suppress a reduction in the throughput. For example, the first temperature may range from 550 to 600° C., and the second temperature may range from 650 to 700° C.

A silicon-containing layer is formed on the first silicon oxide film (underlying film) to a thickness, for example, of less than one atomic layer to several atomic layers by supplying the DCS gas into the process chamber 201 under the conditions described above, i.e., conditions of generating a CVD reaction. The silicon-containing layer may include at least one of an adsorption layer of DCS gas and a silicon (Si) layer. However, the silicon-containing layer may preferably be a layer including silicon (Si) and chlorine (Cl).

Here, the silicon layer may be understood as continuous layers configured of silicon (Si), discontinuous layers configured of silicon (Si), or a silicon thin film formed by overlapping the continuous layers and the discontinuous layers. The continuous layers configured of silicon (Si) may also be referred to together as a silicon thin film. Also, silicon (Si) used to form the silicon layer should be understood as including silicon (Si) that is not completely separated from chlorine (Cl) or hydrogen (H).

Examples of the adsorption layer of the DCS gas include not only continuous chemical adsorption layers including gas molecules of the DCS gas but also discontinuous chemical adsorption layers including gas molecules of the DCS gas. That is, the adsorption layer of the DCS gas includes an adsorption layer including the DCS molecules and having a thickness of less than one molecular layer or of one molecular layer. Also, examples of DCS ($SiH_2Cl_2$) molecules forming the adsorption layer of the DCS gas may include ($SiH_xCl_y$) molecules in which a bond between silicon (Si) and chlorine (Cl) or a bond between silicon (Si) and hydrogen (H) is partially separated. That is, examples of the adsorption layer of the DCS gas include continuous or discontinuous chemical adsorption layers including $SiH_2Cl_2$ molecules and/or $SiH_xCl_y$ molecules. Also, a layer having a thickness of less than one atomic layer means a discontinuously formed atomic layer, and a layer having a thickness of one atomic layer means a continuously formed atomic layer. A layer having a thickness less than one molecular layer means a discontinuously formed molecular layer, and a layer having a thickness of one molecular layer means a continuously formed molecular layer.

Silicon (Si) is deposited on the wafer 200 to form a silicon layer on the wafer 200 under conditions in which the DCS gas is self-decomposed (pyrolyzed), i.e., conditions causing a pyrolysis reaction of the DCS gas. The DCS gas is adsorbed onto the wafer 200 to form an adsorption layer of the DCS gas on the wafer 200 under conditions in which the DCS gas is not self-decomposed (pyrolyzed), i.e., conditions not causing a pyrolysis reaction of the DCS gas. Also, a film-forming rate may be higher when the silicon layer is formed on the first silicon oxide film than when the adsorption layer of the DCS gas is formed on the first silicon oxide film.

If the thickness of the silicon-containing layer formed on the first silicon oxide film exceeds a thickness of several atomic layers, then an action of nitridation (modification) does not have an effect on the entire silicon-containing layer in Step 3b to be described below. The silicon-containing layer formed on the wafer 200 may have a minimum thickness of less than one atomic layer. Thus, the silicon-containing layer may be set to have a thickness of less than one atomic layer to several atomic layers. Also, by controlling the silicon-containing layer to have a thickness not more than one atomic layer, i.e., a thickness of less than one atomic layer or of one atomic layer, an action of a nitridation reaction (modification reaction) in Step 3b to be described below may be relatively increased, and a time required for the nitridation reaction (modification reaction) in Step 3b may thus be reduced. That is, the silicon-containing layer may be efficiently nitrified in Step 3b. Also, a time required to form the silicon-containing layer in Step 1a may be reduced. As a result, a time required for each cycle may be reduced, and a time required for a total of cycles may thus be reduced. That is, a film-forming rate may also be increased. Also, the thickness of the silicon-containing layer may be controlled to be less than one atomic layer, thereby greatly controlling thickness uniformity.

In addition to dichlorosilane ($SiH_2Cl_2$, abbreviated to DCS) gas, an inorganic source, e.g., hexachlorodisilane ($Si_2Cl_6$, abbreviated to HCDS) gas, tetrachlorosilane, i.e., silicontetrachloride ($SiCl_4$, abbreviated to STC) gas, trichlorosilane ($SiHCl_3$, abbreviated to TCS) gas, monochlorosilane ($SiH_3Cl$, abbreviated to MCS) gas, or monosilane ($SiH_4$) gas; or an organic source, e.g., an aminosilane-based gas, such as tetrakisdimethylaminosilane ($Si[N(CH_3)_2]_4$, abbreviated to 4DMAS) gas, trisdimethylaminosilane ($Si[N(CH_3)_2]_3H$, abbreviated to 3DMAS) gas, bisdiethylaminosilane ($Si[N(C_2H_5)_2]_2H_2$, abbreviated to 2DEAS) gas, or bistertiarybutylaminosilane ($SiH_2[NH(C_4H_9)]_2$, abbreviated to BTBAS) gas, may be used as the second source gas (second silicon-containing gas). A rare gas, e.g., Ar gas, He gas, Ne gas, or Xe gas, may be used as an inert gas, instead of $N_2$ gas.

[Step 2b]

After the silicon-containing layer is formed on the first silicon oxide film, the supply of the DCS gas is suspended by closing the valve 243b of the second gas supply pipe 232b. In this case, the inside of the process chamber 201 is exhausted by the vacuum pump 246 while the APC valve 244 of the exhaust pipe 231 is open, and the non-reacted or residual DCS gas remaining in the process chamber 201 after the silicon-containing layer is formed is excluded from the process chamber 201. Also, the $N_2$ gas is continuously supplied as an inert gas into the process chamber 201 while the valves 243g, 243f, 243h, 243i, and 243j are open. The $N_2$ gas may act as a purge gas to guarantee the exclusion of the non-reacted or residual DCS gas, which remains in the process chamber 201 after the silicon-containing layer is formed, from the process chamber 201 (removing of residual gas).

Alternatively, the residual gas remaining in the process chamber 201 may not be completely excluded from the process chamber 201, and the inside of the process chamber 201 may not be completely purged. If the amount of the residual gas in the process chamber 201 is small, Step 3b performed thereafter will not be negatively influenced by the residual gas. In this case, the flow rate of the $N_2$ gas supplied into the process chamber 201 need not be high. For example, the inside of the process chamber 201 may be purged by supplying the amount of $N_2$ gas corresponding to the capacity of the reaction pipe 203 (or the process chamber 201) into the process chamber 201 without causing negative influences in Step 3b. By not completely purging the inside of the process chamber 201, a purging time may be reduced, thus improving the throughput. Also, unnecessary consumption of $N_2$ gas may be suppressed.

In this case, the temperature of the heater 207 is set in such a manner that the temperature of the wafer 200 may range, for example, from 550 to 800° C., preferably, from 600 to 800° C., and more preferably, from 650 to 750° C., similar to when the DCS gas is supplied. The supply flow rate of $N_2$ gas supplied as a purge gas via each inert gas supply system is set to fall within, for example, a range of 100 to 2,000 sccm (0.1 to 2 slm). A rare gas, e.g., Ar gas, He gas, Ne gas, or Xe gas, may be used as a purge gas, instead of $N_2$ gas.

[Step 3b]

After the residual gas is removed from the process chamber 201, $NH_3$ gas is supplied into the third gas supply pipe 232c by opening the valve 243c of the third gas supply pipe 232c. The $NH_3$ gas flows through the third gas supply pipe 232c, and the flow rate of the $NH_3$ gas is adjusted by the MFC 241c. The $NH_3$ gas having the adjusted flow rate flows through the third gas supply pipe 232c, and is then supplied into the heated and reduced-pressure buffer chamber 237 via the gas supply holes 248c of the third nozzle 233c. In this case, when high-frequency power is supplied between the first rod-shaped electrode 269 and the second rod-shaped electrode 270, the $NH_3$ gas supplied into the buffer chamber 237 is activated to a plasma state. When high-frequency power is not supplied between the first rod-shaped electrode 269 and the second rod-shaped electrode 270, the $NH_3$ gas supplied into the buffer chamber 237 is activated by heat. In the present embodiment, the $NH_3$ gas supplied into the buffer chamber 237 is activated by heat without supplying high-frequency power between the first rod-shaped electrode 269 and the second rod-shaped electrode 270. Thus, the $NH_3$ gas supplied into the buffer chamber 237 is activated by heat, is supplied into the heated and reduced-pressure process chamber 201 via the gas supply holes 248c of the buffer chamber 237, and is exhausted via the exhaust pipe 231 (supply of $NH_3$ gas). $NH_3$ gas may be activated by plasma and supplied, but a soft reaction may be generated when $NH_3$ gas is activated by heat and supplied, thereby softly performing nitridation to described below.

In this case, $N_2$ gas may be supplied as an inert gas via the third inert gas supply pipe 232h by opening the valve 243h of the third inert gas supply pipe 232h. The flow rate of the $N_2$ gas is adjusted by the MFC 241h and the $N_2$ gas is then supplied into the third gas supply pipe 232c. The $N_2$ gas having the adjusted flow rate is mixed with the $NH_3$ gas having the adjusted flow rate in the third gas supply pipe 232c. The resultant mixed gas is supplied into the heated and reduced-pressure buffer chamber 237 via the gas supply holes 248c of the third nozzle 233c, is supplied into the heated and reduced-pressure process chamber 201 via the gas supply holes 248*d* of the buffer chamber 237, and is exhausted via the exhaust pipe 231. In this case, in order to prevent the NH$_3$ gas from being supplied into the first nozzle 233*a*, the second nozzle 233*b*, the fourth gas supply pipe 232*d*, and the fifth gas supply pipe 232*e*, N$_2$ gas is supplied into the first inert gas supply pipe 232*f*, the second inert gas supply pipe 232*g*, the fourth inert gas supply pipe 232*i*, and the fifth inert gas supply pipe 232*j* by opening the valves 243*f*, 243*g*, 243*i*, and 243*j*. The N$_2$ gas is supplied into the process chamber 201 via the first gas supply pipe 232*a*, the second gas supply pipe 232*b*, the fourth gas supply pipe 232*d*, the fifth gas supply pipe 232*e*, the first nozzle 233*a*, the second nozzle 233*b*, the third nozzle 233*c*, and the buffer chamber 237, and is exhausted via the exhaust pipe 231.

In this case, by appropriately controlling the APC valve 244, the pressure in the process chamber 201 is maintained constant to be less than atmospheric pressure, for example, to fall within a range of 1 to 3,000 Pa. The supply flow rate of the NH$_3$ gas controlled by the MFC 241*c* is set to fall within, for example, a range of 100 to 10,000 sccm (0.1 to 10 slm). The supply flow rate of the N$_2$ gas controlled by each of the MFCs 241*h*, 241*f*, 241*g*, 241*i*, and 241*j* is set to fall within, for example, a range of 100 to 2,000 sccm (0.1 to 2 slm). A time period in which the NH$_3$ gas is exposed on the wafer 200 is set to fall within, for example, a range of 1 to 120 seconds. The temperature of the heater 207 is set in such a manner that the temperature of the wafer 200 may have a temperature range similar to when the DCS gas is supplied in Step 1b temperature, that is, the temperature of the wafer 200 may fall within, for example, a range of 550 to 800° C., preferably, 600 to 800° C., and more preferably, 650 to 750° C. Also, when the temperature of the wafer 200 has a temperature range described above, an effect of nitridation to be described below using the NH$_3$ gas, i.e., a nitriding reaction of the silicon-containing layer, was achieved, under a reduced-pressure atmosphere. If the temperature of the wafer 200 was excessively low, the effect of the nitridation was not achieved. As described above, when the throughput is considered, the temperature of the heater 207 may be set to maintain the temperature in the process chamber 201 in Steps 1b to 3b as described above. Also, the temperature of the heater 207 may be set to maintain the temperature in the process chamber 201 in Steps 1b to 4b to be described below.

By supplying NH$_3$ gas into the process chamber 201 under the conditions described above, the NH$_3$ gas is thermally activated to a non-plasma state or is thermally decomposed under heated and depressurizing conditions, thus forming nitriding species containing nitrogen. In this case, since DCS gas is not supplied into the process chamber 201, the NH$_3$ gas does not cause a vapor-phase reaction. The nitriding species obtained when the NH$_3$ gas is thermally activated or thermally decomposed react with at least a part of the silicon-containing layer formed on the first silicon oxide film in Step 1b. Thus, the silicon-containing layer is nitrided to be changed (modified) into a silicon nitride (Si$_3$N$_4$) layer (hereinafter referred to simply as a 'SiN layer').

Also, in this case, the NH$_3$ gas may be activated and supplied as plasma, as described above. By activating and supplying the NH$_3$ gas as plasma, nitriding species including active species having higher energy may be generated. When the silicon-containing layer is nitrided using the nitriding species, for example, device characteristics may be improved. If the NH$_3$ gas is activated as plasma, the NH$_3$ gas supplied into the buffer chamber 237 is activated as plasma (excited as plasma) by supplying high-frequency power between the first rod-shaped electrode 269 and the second rod-shaped electrode 270 from the high-frequency power source 273 via the impedance matching unit 272, is supplied as a gas (nitriding species) including NH$_3$* (active species of ammonia) into the process chamber 201 via the gas supply holes 248*d*, and is exhausted via the exhaust pipe 231. In this case, the high-frequency power supplied between the first rod-shaped electrode 269 and the second rod-shaped electrode 270 from the high-frequency power source 273 is set to fall within, for example, a range of 50 to 1,000 W. The other conditions are set as described above. The NH$_3$ gas is sufficiently activated by heat at the temperature range described above to generate a sufficient amount of nitriding species. Thus, even if the NH$_3$ gas is thermally activated to a non-plasma state, a sufficient nitriding power may be obtained. Also, when the NH$_3$ gas is activated by heat and supplied, a soft reaction may be generated without causing plasma damage, and the nitriding process described above may thus be softly performed.

Diazene (N$_2$H$_2$) gas, hydrazine (N$_2$H$_4$) gas, N$_3$H$_8$ gas, or an amine-based gas may be used as a nitrogen-containing gas, instead of NH$_3$ gas.

[Step 4b]

After the silicon-containing layer is changed into the silicon nitride layer, the supply of the NH$_3$ gas is suspended by closing the valve 243*c* of the third gas supply pipe 232*c*. In this case, the inside of the process chamber 201 is vacuum-exhausted by the vacuum pump 246 while the APC valve 244 of the exhaust pipe 231 is open so as to exclude non-reacted or residual NH$_3$ gas or reacted by-products, which remain in the process chamber 201 after the silicon nitride layer is formed, from the process chamber 201. Also, N$_2$ gas is continuously supplied as an inert gas into the process chamber 201 while the valves 243*h*, 243*f*, 243*g*, 243*i*, and 243*j* are open. The N$_2$ gas acts as a purge gas to guarantee the exclusion of the non-reacted or residual NH$_3$ gas or reacted by-products, which remain in the process chamber 201 after the silicon nitride layer is formed, from the process chamber 201 (removing of residual gases).

Alternatively, the residual gases remaining in the process chamber 201 may not be completely excluded from the process chamber 201, and the inside of the process chamber 201 may not be completely purged. If the amounts of the residual gases in the process chamber 201 are small, Step 1b performed thereafter will not be negatively influenced by the residual gases. In this case, the flow rate of N$_2$ gas supplied into the process chamber 201 need not be high. For example, the inside of the process chamber 201 may be purged by supplying the amount of N$_2$ gas corresponding to the capacity of the reaction pipe 203 (or the process chamber 201) into the process chamber 201 without causing negative influences in Step 1b. By not completely purging the inside of the process chamber 201, a purging time may be reduced, thus improving the throughput. Also, unnecessary consumption of N$_2$ gas may be suppressed.

In this case, the temperature of the heater 207 is set in such a manner that the temperature of the wafer 200 may range, for example, from 550 to 800° C., preferably, from 600 to 800° C., and more preferably, from 650 to 750° C., similar to when NH$_3$ gas is supplied. The supply flow rate of N$_2$ gas supplied as a purge gas via each inert gas supply system is set to range, for example, from 100 to 2,000 sccm (0.1 to 2 slm). A rare gas, e.g., Ar gas, He gas, Ne gas, or Xe gas, may be used as a purge gas, instead of N$_2$ gas.

A silicon nitride film may be formed on the first silicon oxide film to a predetermined thickness by repeatedly performing a cycle including Steps 1b to 4b several times. The silicon nitride film is used as an underlying film of a second silicon oxide film formed during a subsequent process to be described below.

(Process of Forming Second Silicon Oxide Film)

Then, the second silicon oxide film is formed as an underlying film on the silicon nitride film to a predetermined thickness by repeatedly performing a cycle including Steps 1c to 4c to be described below, several times.

Steps 1c to 4c are performed in the same order and under the same conditions as Steps 1a to 4a to form the first silicon oxide film. That is, in order to form the second silicon oxide film, a first source gas, i.e., the HCDS gas used to form the first silicon oxide film, is used as a source gas. Also, the second silicon oxide film is formed while the wafer 200 is controlled to have the same temperature range as in the process of forming the first silicon oxide film described above.

Also, the second silicon oxide film may be formed on the silicon nitride film to a predetermined thickness by repeatedly performing a cycle including Steps 1c to 4c several times. As a result, an insulating film having an ONO stacked structure in which the first silicon oxide film, the silicon nitride film, and the second silicon oxide film are sequentially stacked is formed on the wafer 200.

(Purging and Atmospheric Pressure Recovery)

After the insulating film having the ONO stacked structure is formed, $N_2$ gas is supplied as an inert gas into the process chamber 201 via each of the first inert gas supply pipe 232f, the second inert gas supply pipe 232g, the third inert gas supply pipe 232h, the fourth inert gas supply pipe 232i, and the fifth inert gas supply pipe 232j by opening the valves 243f, 243g, 243h, 243i, and 243j, and is exhausted via the exhaust pipe 231. The $N_2$ gas acts as a purge gas to purge the inside of the process chamber 201 with the inert gas, thereby removing gases or reacted by-products from the process chamber 201 (purging). Then, the atmosphere in the process chamber 201 is replaced with the inert gas, and the pressure in the process chamber 201 is returned to the normal pressure (atmospheric pressure recovery).

(Boat Unloading and Wafer Discharging)

Then, when the seal cap 219 is moved downward by the boat elevator 115, the lower end of the reaction pipe 203 is opened, and at the same time, the processed wafer 200 supported by the boat 217 is unloaded from the reaction pipe 203 (boat unloading). Then, the processed wafer 200 is discharged by the boat 217 (wafer discharging).

(3) Effects of the Present Embodiment

According to the present embodiment, at least one of the following effects can be achieved.

When the first silicon oxide film and the second silicon oxide film were formed according to a film-forming sequence according to the present embodiment, it was revealed that the thickness uniformity and step coverage of a plane of the wafer 200 were better than when a silicon oxide film was formed by general CVD. Thus, the thickness uniformity and step coverage of the insulating film having the ONO stacked structure in the plane of the wafer 200 were improved. This is because the first and second silicon oxide films according to the present embodiment were formed by repeatedly performing a cycle including supplying HCDS gas and supplying $O_2$ gas and $H_2$ gas, several times (Steps 1a to 4a and Steps 1c to 4c), Here, general CVD means a method of forming a silicon oxide film [High Temperature Oxide (HTO) film] by CVD by simultaneously supplying DCS gas and $N_2O$ gas which are inorganic sources.

Also, it was revealed that the first silicon oxide film and the second silicon oxide film formed according to the film-forming sequence according to the present embodiment became high-quality films having very low concentrations of impurities therein, such as nitrogen or chlorine, and having a silicon (Si)-to-oxygen (O) ratio that is substantially the same as the stoichiometric composition, i.e., 0.5, compared to a silicon oxide film (CVD-SiO film) formed by general CVD. This is because, in the film-forming sequence to form the silicon oxide film according to the present embodiment, oxidized species including atomic oxygen (O) are generated by reacting $O_2$ gas and $H_2$ gas with each other under a heated and reduced-pressure atmosphere, and a silicon-containing layer is changed into a silicon oxide layer using the oxidized species (Steps 3a and 3c). By supplying the oxidized species including atomic oxygen (O) to the silicon-containing layer, Si—N, Si—Cl, Si—H, and Si—C bonds included in the silicon-containing layer may be separated mainly using the energy of the atomic oxygen (O). Since energy for forming a Si—O bond is higher than bonding energy for forming the Si—N, Si—Cl, Si—H, and Si—C bonds, the energy for forming the Si—O bond is supplied from the oxidized species to the silicon-containing layer so as to separate the Si—N, Si—Cl, Si—H, and Si—C bonds included in the silicon-containing layer. N, H, Cl, and C separated from Si are removed from the silicon-containing layer, and are discharged as $N_2$, $H_2$, $Cl_2$, HCl, and $CO_2$. The bonding electrons of Si remaining after being separated from N, H, Cl, and C are bonded with the oxygen (O) included in the oxidized species. Therefore, the qualities of the first and second silicon oxide films may be greatly improved, thereby obtaining a very high-quality insulating film having the ONO stacked structure.

Also, the first silicon oxide film and the second silicon oxide film formed according to the film-forming sequence according to the present embodiment are not limited to using inorganic silicon sources. When the first silicon oxide film and the second silicon oxide film formed according to the film-forming sequence according to the present embodiment were formed of organic silicon sources, it was revealed that the thickness uniformity and step coverage in a plane of the wafer 200 and the concentration of impurities therein had desired levels. Also, when organic sources were used, the thickness uniformity and step coverage of the insulating film having the ONO stacked structure in a plane of the wafer 200 and the concentration of impurities therein had desired levels.

The thickness uniformity and step coverage in a plane of the wafer 200 were better when a silicon nitride film was formed according to the film-forming sequence according to the present embodiment than when a silicon nitride film was formed by general CVD. Thus, the thickness uniformity and step coverage of an insulating film having an ONO stacked structure in a plane of the wafer 200 were improved. This is because the silicon nitride film according to the present embodiment is formed by repeatedly performing a cycle including supplying DCS gas and supplying $NH_3$ gas several times (Steps 1b to 4b). Here, general CVD means a method of forming a silicon nitride film by CVD by simultaneously supplying DCS gas and $NH_3$ gas which are inorganic sources.

Also, the silicon nitride film formed according to the film-forming sequence according to the present embodiment became a very high-quality film having a low concentration of hydrogen therein, compared to a silicon nitride film (CVD-SiN film) formed by general CVD. This is because, in the film-forming sequence of forming a silicon nitride film according to the present embodiment, the silicon-containing layer is changed into the silicon nitride layer using nitriding species obtained by activating or thermally decomposing $NH_3$ gas in the heated and reduced-pressure atmosphere (Step 3b). Since the energy of the nitriding species dissociates not only the Si—H bond but also the N—H bond having higher bonding energy than the Si—H bond, hydrogen (H) may be removed from the silicon nitride layer. The removed hydrogen (H) is discharged, for example, in the form of $H_2$. Silicon (Si) or nitrogen (N) separated from hydrogen (H) are respectively bonded with nitrogen (N) and silicon (Si) to form a new Si—N bond. Accordingly, the silicon nitride film may become a very high-quality film, and a very high-quality insulating film having an ONO stacked structure may be thereby obtained.

The silicon nitride film according to the present embodiment is not limited to using inorganic silicon sources. When the silicon nitride film was formed of organic silicon sources, the thickness uniformity and step coverage in a plane of the wafer 200 and the concentration of impurities therein also had desired levels. Thus, when organic sources were used, the thickness uniformity and step coverage of the insulating film having the ONO stacked structure in a plane of the wafer 200 and the concentration of impurities therein had desired levels.

Also, the film-forming sequence according to the present embodiment revealed that the yield of the first silicon oxide film, the silicon nitride film, and the second silicon oxide film, i.e., the yield of the insulating film having the ONO stacked structure, could be greatly improved.

This is because, according to the film-forming sequence according to the present embodiment, the thickness uniformity and step coverage of each of the first silicon oxide film, the silicon nitride film, and the second silicon oxide film may be improved without suppressing vapor-phase reactions around the wafer 200 by lowering the pressure in the process chamber 201. Furthermore, pitches between arranged wafers 200 (the distances between adjacent wafers supported by the boat 217) need not be increased.

Also, according to the film-forming sequence according to the present embodiment, oxidized species obtained by thermally activating $O_2$ gas and $H_2$ gas are used to form the first and second silicon oxide films, and nitriding species obtained by activating or thermally decomposing $NH_3$ gas are used to form the silicon nitride film, thereby increasing deposition rates of these films. Thus, the yield of the insulating film having the ONO stacked structure may be greatly increased.

Also, according to the film-forming sequence according to the present embodiment, the first silicon oxide film, the silicon nitride film, and the second silicon oxide film are continuously formed in the same process container (in-situ) by controlling the difference between the temperature of the wafer 200 when the silicon oxide films are formed and the temperature of the wafer 200 when the silicon nitride film is formed to be less than 150° C., and preferably, less than 100° C. Accordingly, the yield of the insulating film having the ONO stacked structure may be greatly increased. Furthermore, when an insulating film having an ONO stacked structure is formed by general CVD, it is difficult to control the difference between the temperature of a wafer when silicon oxide films are formed and the temperature of the wafer when a silicon nitride film is formed to be less than 150° C. That is, in the film-forming sequence according to the present embodiment, temperature control, i.e., substrate temperature control, need not be performed to a large extent, between the process of forming the first silicon oxide film and the process of forming the silicon nitride film and between the process of forming the silicon nitride film and the process of forming the second silicon oxide film, thereby greatly increasing the yield. Also, the yield may be greatly increased, since the wafer 200 need not be transferred between other devices and pressure control need not be performed after the wafer 200 is transferred.

(4) Modified Examples

The film-forming sequence according to the present embodiment may be modified, for example, as follows. Effects of the film-forming sequence according to the present embodiment may also be achieved when the following modified examples are performed. Also, an arbitrary combination of the following modified examples may be used.

First Modified Example

Although in film-forming sequence illustrated in FIGS. 4 and 11, a first source gas used to form a first oxide film or a second oxide film and a second source gas used to form a nitride film are different types of source gases, the first modified example is not limited thereto. For example, the first source gas and the second source gas may be formed of the same material.

Figure 5:
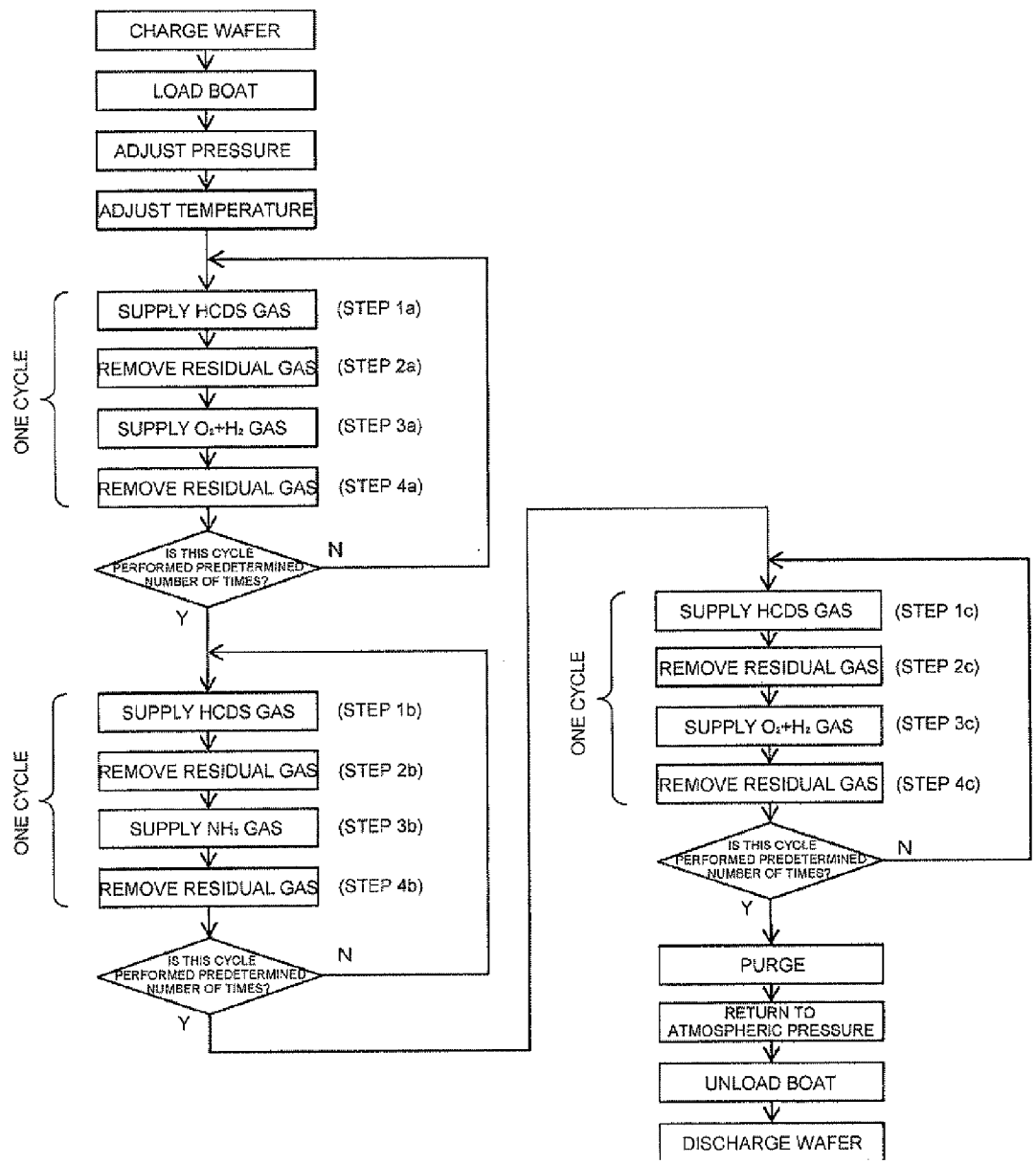
FIG. 5 is a flowchart illustrating a method of forming a film according to a first modified example of the first embodiment of the present invention.
Figure 12:
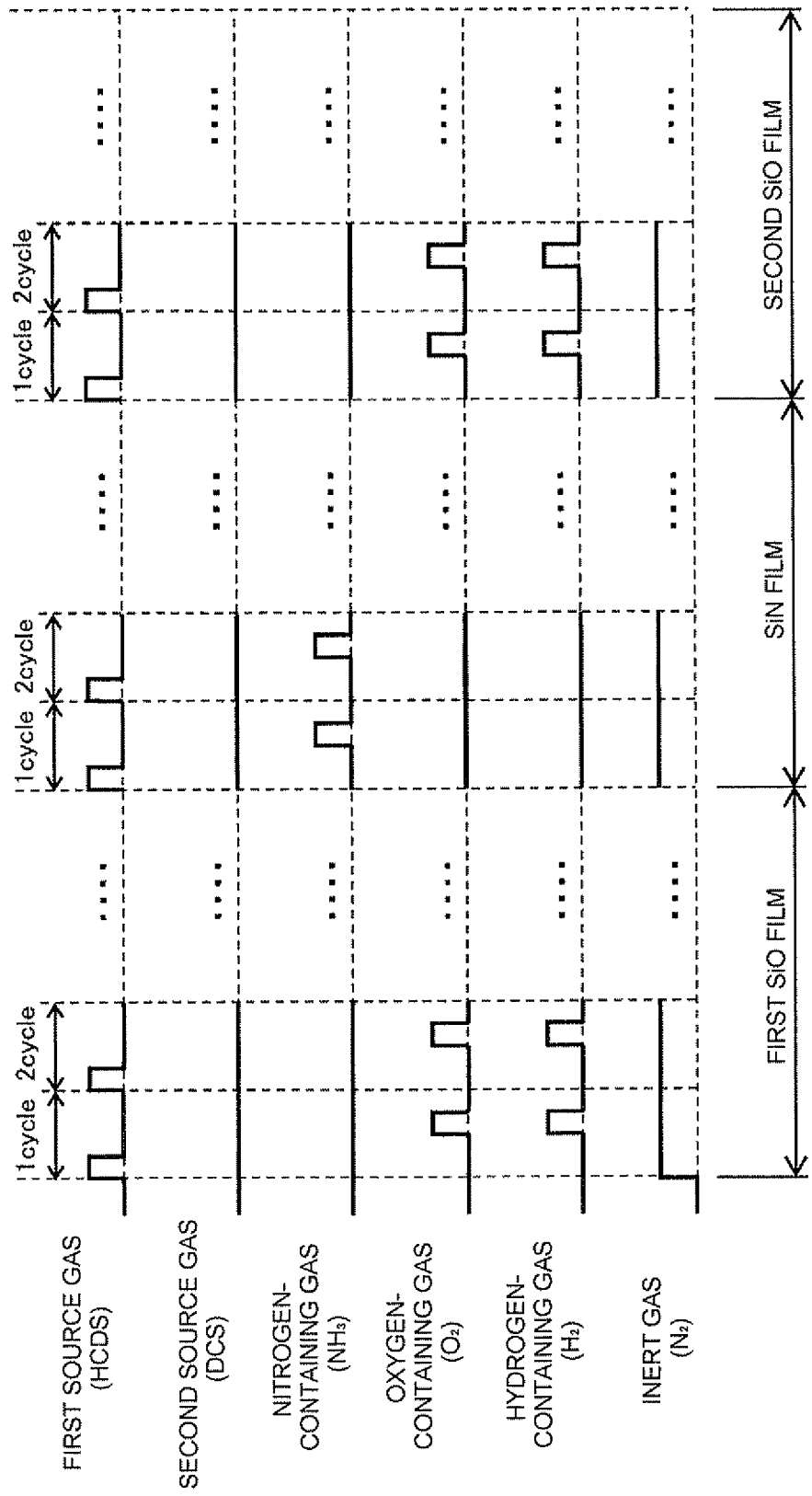
FIG. 12 is a gas supply timing chart according to the first modified example of the first embodiment of the present invention.

FIG. 5 is a flowchart illustrating a method of forming a film according to the first modified example of the first embodiment of the present invention. FIG. 12 is a gas supply timing chart according to the first modified example of the first embodiment of the present invention. FIGS. 5 and 12 illustrate cases in which HCDS gas is used as both a first source gas and a second source gas. The film-forming sequence according to the first modified example is the same as those of FIGS. 5 and 12, except that the HCDS gas is used as the second source gas in forming a nitride film. Forming a nitride film (or silicon nitride film) according to the current modified example will now be described.

In the film-forming sequence of forming a silicon nitride film according to the first modified example, the silicon nitride film is formed on a first silicon oxide film to a predetermined thickness by repeatedly performing a cycle including Steps 1b to 4b to be described below, several times.

[Step 1b]

HCDS gas (or a mixed gas of HCDS gas and $N_2$ gas) is supplied into the heated and reduced-pressure process chamber 201 and the inside of the process chamber 201 is exhausted, in the same order and under the same conditions as Step 1a of the process of forming the first silicon oxide film (supply of HCDS gas). Process conditions, reactions to be generated, layers to be formed, and the like in Step 1b are the same as those in Step 1a of the process of forming the first silicon oxide film described above. In other words, in Step 1b, a silicon-containing layer is formed on the first silicon oxide film by supplying HCDS gas into the process chamber 201.

[Step 2b]

After the silicon-containing layer is formed on the first silicon oxide film, the HCDS gas is excluded from the process chamber 201, and at the same time, the inside of the process chamber 201 is purged with $N_2$ gas, in the same order and under the same conditions as Step 2a of the process of forming the first silicon oxide film (removing of residual gas).

[Step 3b]

After the residual gas is removed from the process chamber 201, $NH_3$ gas (or a mixed gas of $NH_3$ gas and $N_2$ gas) is supplied into the heated and reduced-pressure process chamber 201 and the inside of the process chamber 201 is exhausted, in the same order and under the same conditions as Step 3b of the process of forming the silicon nitride film (supply of $NH_3$ gas). Process conditions, reactions to be generated, layers to be formed, and the like in Step 3b are the same as those in Step 3b of the process of forming the silicon nitride film. In other words, in Step 3b, the silicon-containing layer formed in Step 1b is changed (modified) into a silicon nitride layer by supplying $NH_3$ gas into the process chamber 201.

[Step 4b]

After the silicon-containing layer is changed into the silicon nitride layer, the NH₃ gas or reacted by-products are excluded from the process chamber 201, and at the same time, the inside of the process chamber 201 is purged with N₂ gas, in the same order and under the same conditions as Step 4b of the process of forming the silicon nitride film (removing of residual gas).

The silicon nitride film may be formed on the first silicon oxide film as an underlying film to a predetermined thickness by repeatedly performing a cycle including Steps 1b to 4b described above, several times.

As described above, when HCDS gas is used as the first and second source gases, the effects of the film-forming sequence illustrated in FIGS. 4 and 11 may also be achieved. On the other hand, even if DCS gas is used as the first and second source gases, the same effects may be achieved. Since the HCDS gas has a lower pyrolysis temperature and a higher reactivity than DCS gas, deposition rates may be relatively increased even when the HCDS gas is used as the first and second source gases, thereby increasing the yield.

Second Modified Example

In the film-forming sequence illustrated in FIGS. 4 and 11, the first oxide film and the second oxide film are formed by repeatedly performing a cycle including supplying a first source gas and supplying an oxygen-containing gas and a hydrogen-containing gas, several times, but a second modified example is not limited thereto.

For example, in forming a first oxide film and/or forming a second oxide film, a cycle including supplying a first source gas and supplying an oxygen-containing gas and a hydrogen-containing gas may be repeatedly performed several times, and then supplying the oxygen-containing gas and the hydrogen-containing gas (modification process) may be performed. In this film-forming sequence, the oxygen-containing gas and the hydrogen-containing gas are thermally activated and supplied without using plasma, as in the film-forming sequence described above with reference to FIGS. 4 and 11. Also, this film-forming sequence may be performed using at least one of the process of forming the first oxide film and the process of forming the second oxide film.

Figure 6:
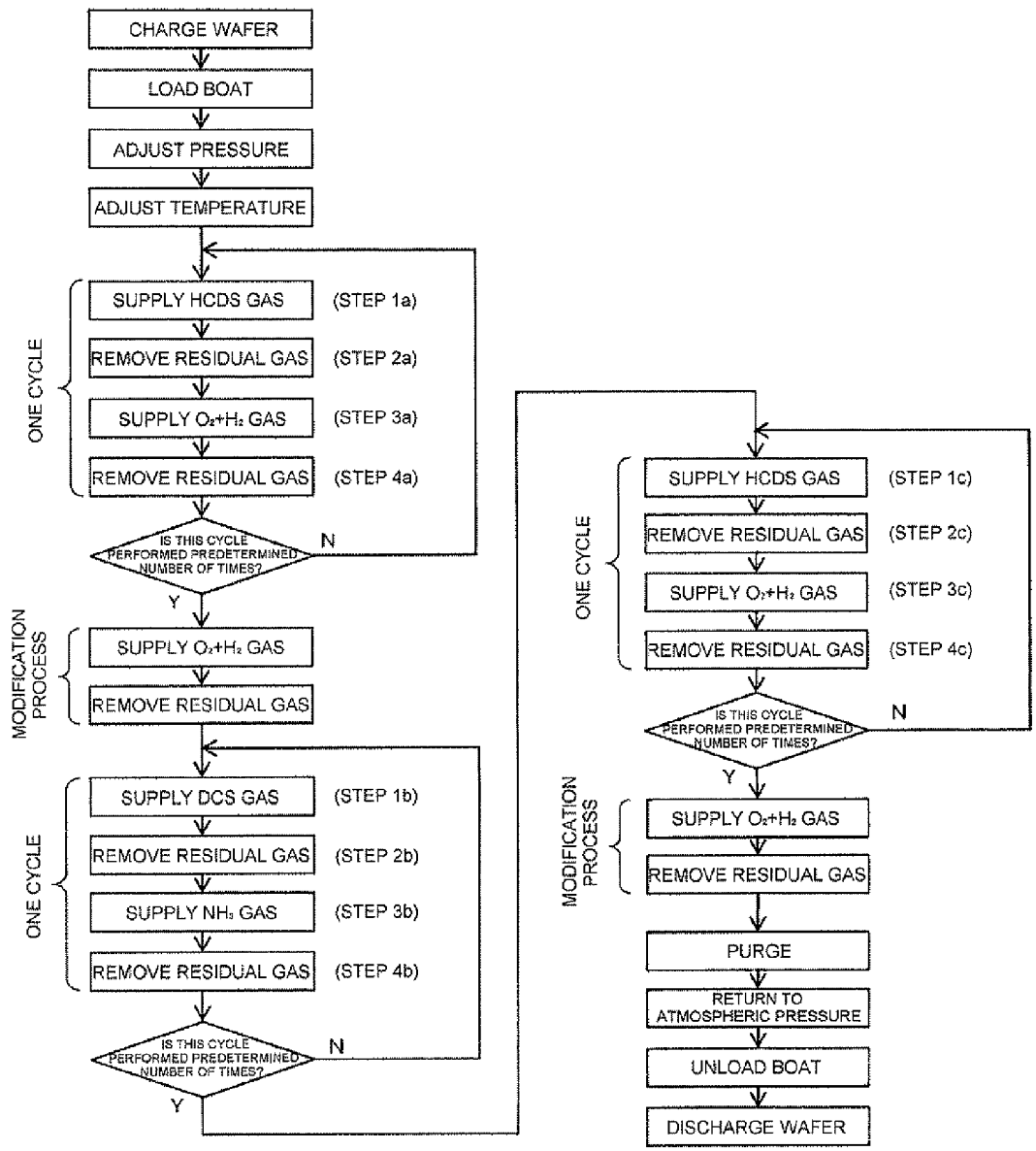
FIG. 6 is a flowchart illustrating a method of forming a film according to a second modified example of the first embodiment of the present invention.
Figure 13:
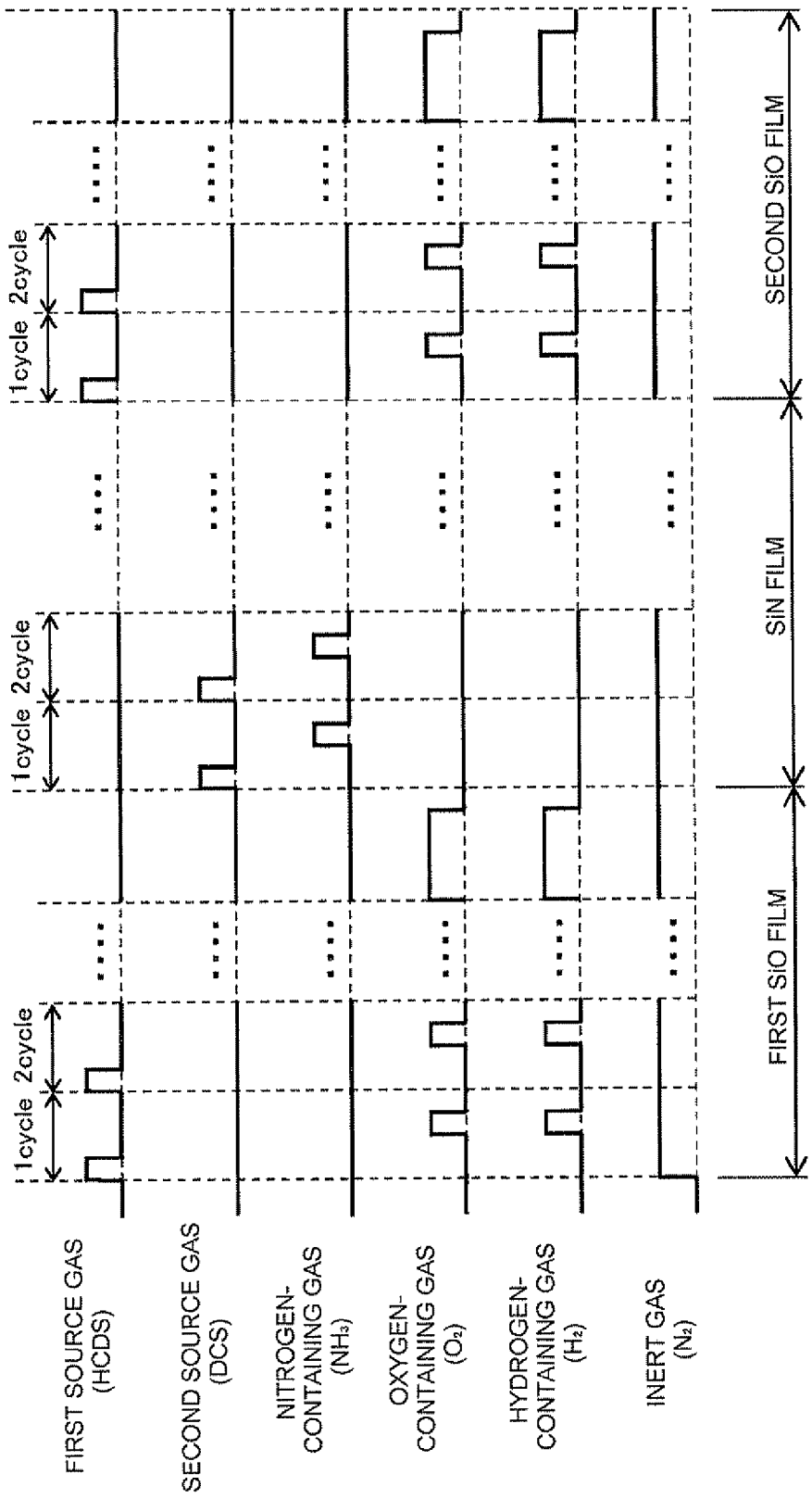
FIG. 13 is a gas supply timing chart according to the second modified example of the first embodiment of the present invention.

FIG. 6 is a flowchart illustrating a method of forming a film according to the second modified example of the first embodiment of the present invention. FIG. 13 is a gas supply timing chart according to the second modified example of the first embodiment of the present invention. FIGS. 6 and 13 illustrate cases in which a film-forming sequence of forming an oxide film according to the second modified example is performed by forming a first oxide film and forming a second oxide film. The film-forming sequence according to the second modified example is the same as that of FIGS. 4 and 11, except that during the process of forming the first oxide film and/or the process of forming the second oxide film, a cycle including supplying a first source gas and supplying an oxygen-containing gas and a hydrogen-containing gas is repeatedly performed several times, and the process of supplying the oxygen-containing gas and the hydrogen-containing gas is performed again as the modification process. The process of forming the first oxide film (or first silicon oxide film) and the process of forming the second oxide film (or second silicon oxide film) will now be described.

In the film-forming sequence of forming the first silicon oxide film according to the second modified example, a silicon oxide film is formed on the wafer 200 to a predetermined thickness by repeatedly performing a cycle including Steps 1a to 4a, which are the same as Steps 1a to 4a of the film-forming sequence described above with reference to FIGS. 4 and 11, several times. Then, the modification process is performed to remove impurities from the silicon oxide film, as in Steps 3a and 4a according to the second modified example, thereby improving film quality. Accordingly, the first silicon oxide film is formed as described above.

Then, in a film-forming sequence of forming a second silicon oxide film according to the second modified example, a silicon oxide film is formed on the silicon nitride film to a predetermined thickness by repeatedly performing a cycle, which includes Steps 1c to 4c of the film-forming sequence described above with reference to FIGS. 4 and 11, several times. Then, the modification process is performed again to remove impurities from the silicon oxide film, as in Steps 3c and 4c of the second modified example, thereby improving film quality. Accordingly, the second silicon oxide film is formed as described above.

Process conditions of performing the modification process are substantially the same as those in Steps 3a, 4a, 3c, and 4c. However, the temperature of the wafer 200 may be set to be higher, e.g., to fall within a range of 350 to 1,200° C., than in Steps 3a, 4a, 3c, and 4c. A time period in which O₂ gas and H₂ gas are supplied to the wafer 200 may be set to be long, for example, to fall within a range of 60 to 600 seconds. FIG. 13 illustrates a case in which, in a modification process, a time period in which O₂ gas and H₂ gas are supplied to the wafer 200 is set to be longer than in Steps 3a and 3c.

The first and second silicon oxide films formed according to the film-forming sequence according to the second modified example had very low concentrations of impurities therein, e.g., nitrogen, hydrogen, or chlorine, and a silicon (Si)-to-oxygen (O) ratio that is substantially the same as the stoichiometric composition, i.e., 0.5, compared to a silicon oxide film (CVD-SiO film) by general CVD. This is because, in the film-forming sequence of forming the silicon oxide film according to the second modified example, oxidized species including atomic oxygen (O) are generated by reacting O₂ gas and H₂ gas with each other under a heated and reduced-pressure atmosphere, and the silicon oxide film (SiO₂ film) is modified using the oxidized species (modification process). By supplying the oxidized species including atomic oxygen (O) to the silicon oxide film, Si—N, Si—Cl, Si—H, and Si—C bonds included in the silicon oxide film may be separated mainly using the energy of the atomic oxygen (O). Since energy for forming a Si—O bond is higher than bonding energy of the Si—N, Si—Cl, Si—H, and Si—C bonds, the Si—N, Si—Cl, Si—H, Si—C bonds included in the silicon oxide film may be separated by supplying energy for forming the Si—O bond from the oxidized species to the silicon oxide film. N, H, Cl, and C separated from Si are removed from the silicon oxide film and are then discharged, for example, in the form of N₂, H₂, O₂, HCl, and CO₂. Bonding electrons of Si remaining after being separated from N, H, Cl, and C are bonded with the atomic oxygen (O) of the oxidized species. In this case, the silicon oxide film becomes dense. As described above, the first and second silicon oxide films may become very high-quality silicon oxide films, and a very high-quality insulating film having an ONO stacked structure may be thereby obtained.

Third and Fourth Modified Examples

In the film-forming sequence described above with reference to FIGS. 4 and 11, the first and second oxide films are formed by repeatedly performing a cycle including the process of supplying the first source gas and the process of supplying the oxygen-containing gas and the hydrogen-containing gas, several times, but third and fourth modified examples of the first embodiment of the present invention are not limited thereto.

For example, in forming a first oxide film and/or forming a second oxide film, supplying a first source gas may be skipped, and instead, an oxygen-containing gas and a hydrogen-containing gas may be continuously supplied. Also, film-forming sequences according to the third and fourth modified examples may be performed using at least one of the process of forming the first oxide film and the process of forming the second oxide film.

Figure 7:
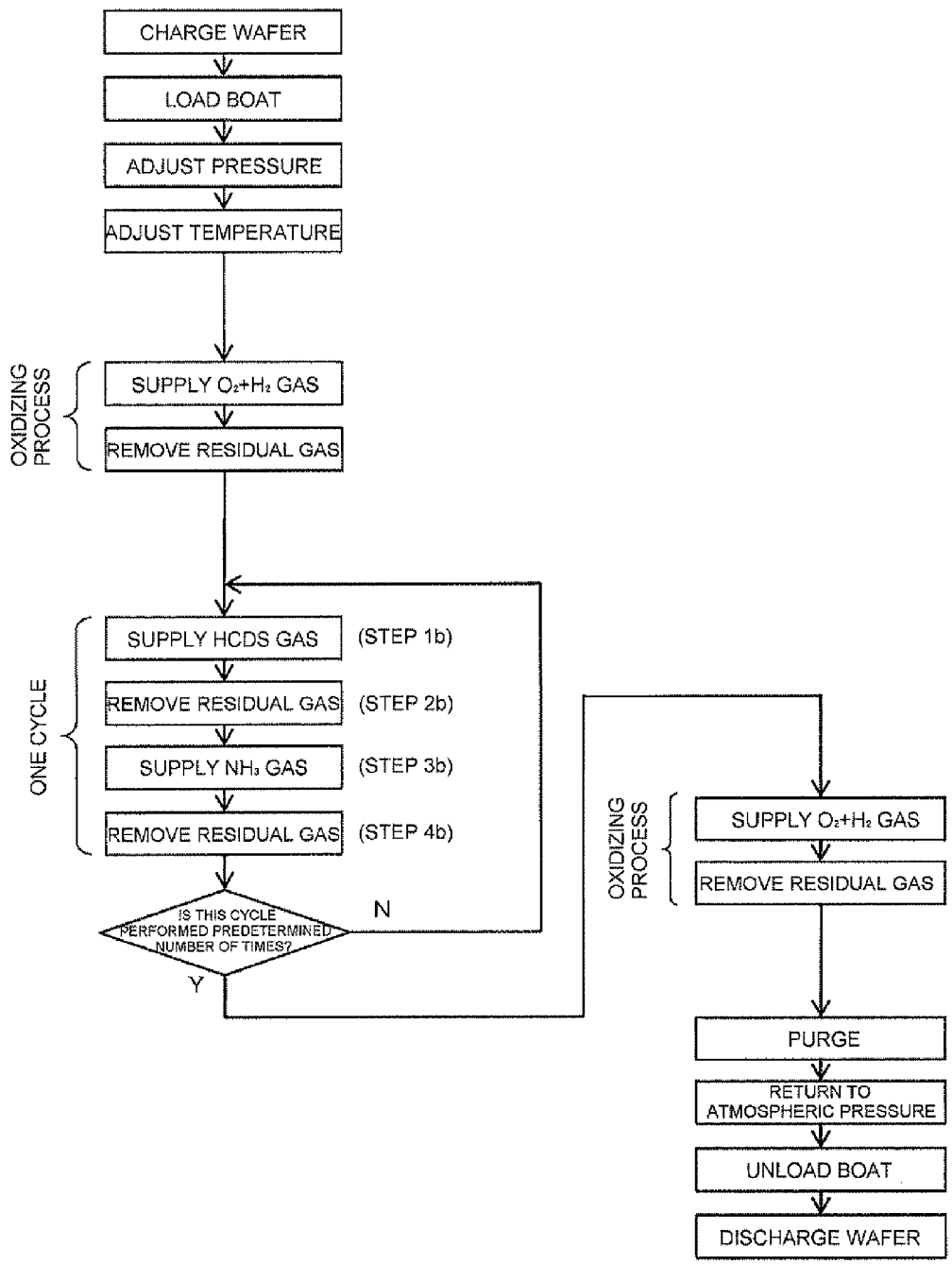
FIG. 7 is a flowchart illustrating a method of forming a film according to a third modified example of the first embodiment of the present invention.
Figure 8:
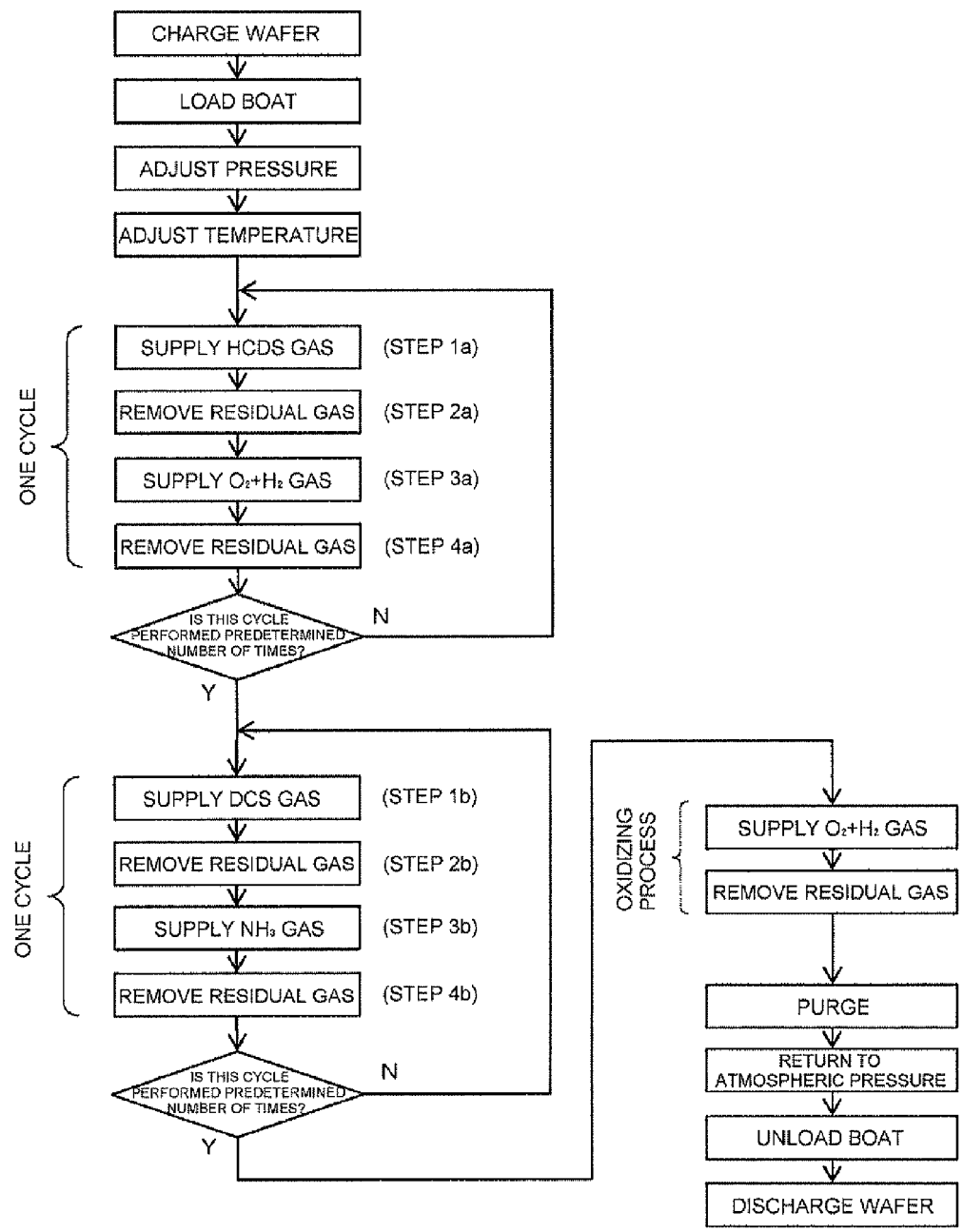
FIG. 8 is a flowchart illustrating a method of forming a film according to a fourth modified example of the first embodiment of the present invention.
Figure 14:
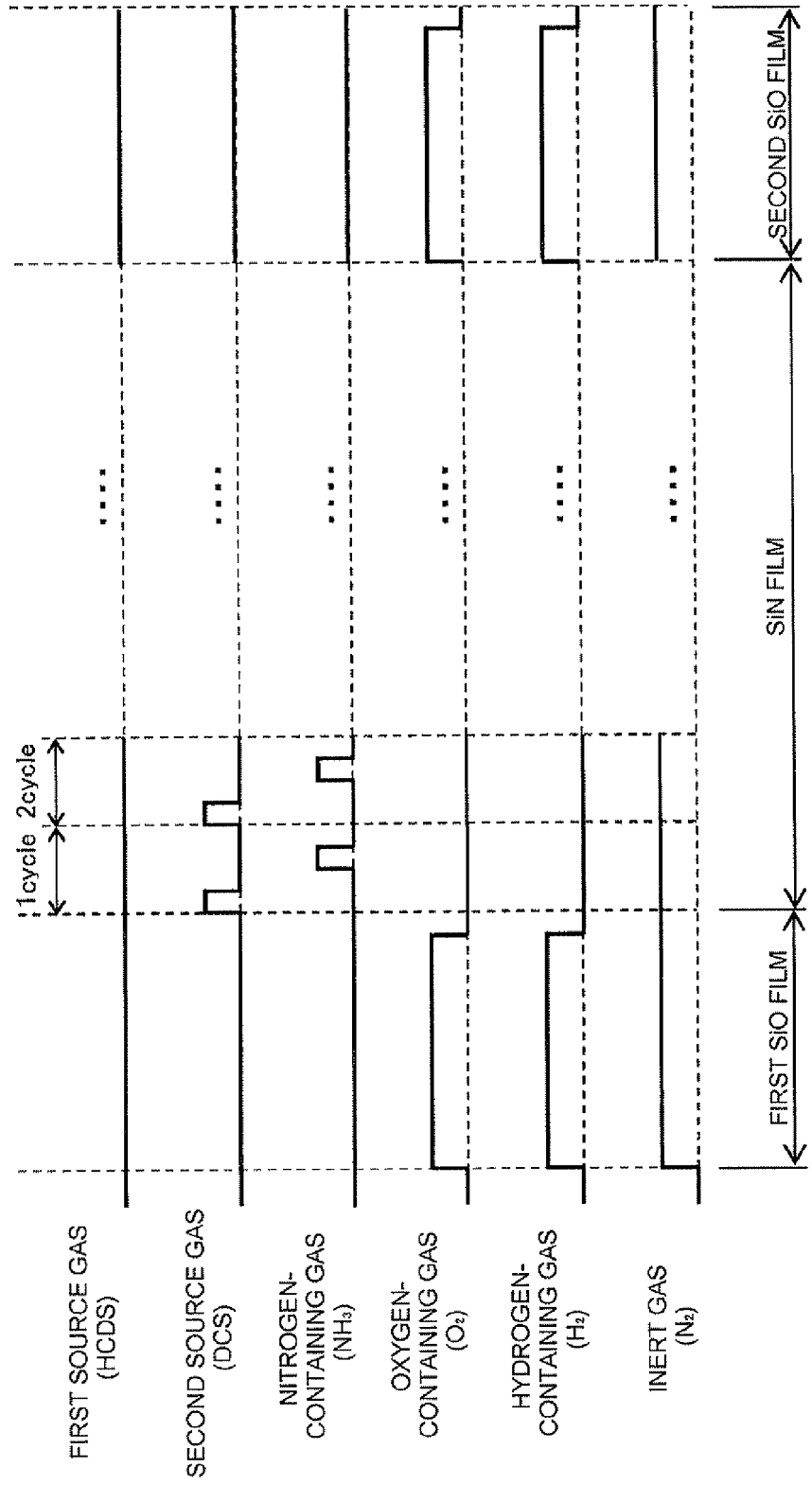
FIG. 14 is a gas supply timing chart according to the third modified example of the first embodiment of the present invention.
Figure 15:
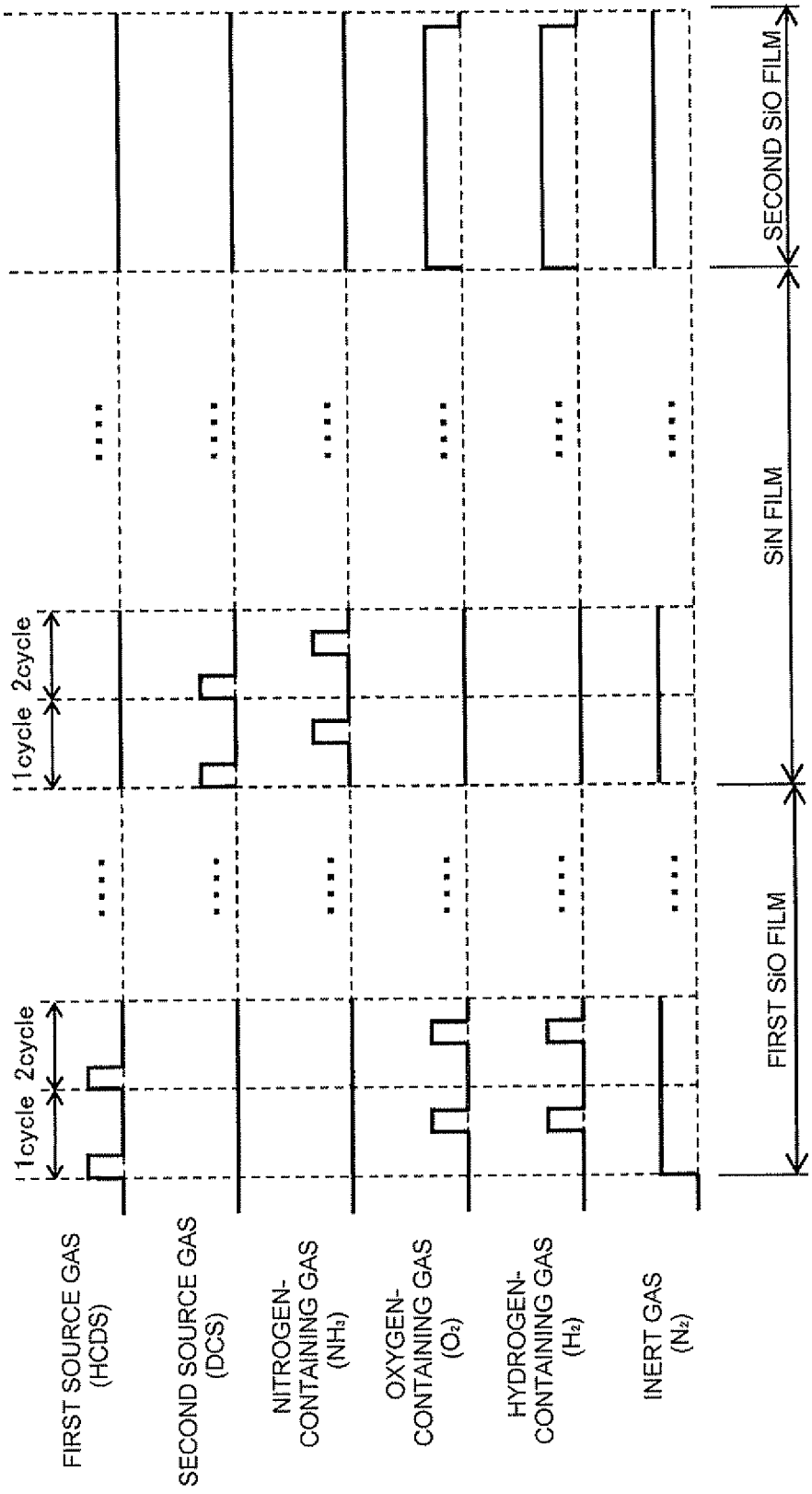
FIG. 15 is a gas supply timing chart according to the fourth modified example of the first embodiment of the present invention.

FIG. 7 is a flowchart illustrating a method of forming a film according to the third modified example of the first embodiment of the present invention. FIG. 14 is a gas supply timing chart according to the third modified example of the first embodiment of the present invention. FIGS. 7 and 14 illustrate cases in which a film-forming sequence of forming an oxide film according to the third modified example is performed by forming a first oxide film and forming a second oxide film. FIG. 8 is a flowchart illustrating a method of forming a film according to the fourth modified example of the first embodiment of the present invention. FIG. 15 is a gas supply timing chart according to the fourth modified example of the first embodiment of the present invention. FIGS. 8 and 15 illustrate cases in which a film-forming sequence of forming an oxide film according to the fourth modified example is performed only by forming a second silicon oxide film, and a first silicon oxide film is formed according to the film-forming sequence described above with reference to FIGS. 4 and 11. The film-forming sequences according to the third and fourth modified examples are the same as that described above with reference to FIGS. 4 and 11, except that during the process of forming the first oxide film and/or the process of forming the second oxide film, supplying a first source gas is skipped and instead, an oxygen-containing gas and a hydrogen-containing gas are continuously supplied. The process of supplying the first oxide film (or first silicon oxide film) and the process of supplying the second oxide film (or second silicon oxide film) will now be described.

In a film-forming sequence of forming the first silicon oxide film according to the third modified example, the first silicon oxide film is formed by oxidizing an underlying silicon film formed on the wafer 200 by performing Steps 3a and 4a of the film-forming sequence described above with reference to FIGS. 4 and 11 without performing a step of supplying HCDS gas, i.e., by continuously supplying $O_2$ gas and $H_2$ gas that are thermally activated and then performing purging. In other words, in this case, the first silicon oxide film is formed by oxidizing a surface of the underlying silicon film formed on the wafer 200, rather than depositing the first silicon oxide film on the silicon film on the wafer 200 as in the film-forming sequence described above with reference to FIGS. 4 and 11. Thus, in this case, the first silicon oxide film is formed by forming the underlying silicon film in advance on the wafer 200 to a thickness greater than a desired thickness, and oxidizing an undesired thickness of the underlying silicon film.

Also, in film-forming sequences of forming a second silicon oxide film according to the third and fourth modified examples, the second silicon oxide film is formed by oxidizing an underlying silicon nitride film by performing Steps 3a and 4a of the film-forming sequence described above with reference to FIGS. 4 and 11 without supplying HCDS gas after the silicon nitride film is formed on the first silicon oxide film as an underlying film, i.e., by continuously supplying $O_2$ gas and $H_2$ gas that are thermally activated and performing purging. In other words, in this case, the second silicon oxide film is formed by oxidizing a surface of the underlying silicon nitride film formed on the wafer 200, rather than depositing the second silicon oxide film on the silicon nitride film on the wafer 200 as in the film-forming sequence described above with reference to FIGS. 4 and 11. Thus, in this case, the second silicon oxide film is formed by forming the underlying silicon nitride film on the first silicon oxide film to a thickness greater than a desired thickness, and oxidizing an undesired thickness of the underlying silicon nitride film.

<Second Embodiment of the Present Invention>

In the first embodiment, the nitride film is formed right after the first oxide film is formed. However, in this case, during an initial stage of the process of forming the nitride film, a time delay may occur during adsorption of a second source gas onto a surface of the first oxide film (namely, an incubation time), and thus formation of the nitride film may be delayed, thereby lowering the yield of an insulating film having an ONO stacked structure. For example, when DCS gas having a higher pyrolysis temperature and a lower reactivity than HCDS gas is used as the second source gas to form the silicon nitride film (in the case of the film-forming sequence FIGS. 4 and 11), the DCS gas may not be directly chemically adsorbed onto the surface of the first silicon oxide film even when Step 1b is performed to form silicon nitride film, or silicon (Si) may not be deposited on the first silicon oxide film, thereby increasing the incubation time.

Thus, in the second embodiment of the present invention, forming a first oxide film on a substrate by performing a first cycle a predetermined number of times, the first cycle including supplying a first source gas and supplying an oxidizing gas (or oxygen-containing gas) and a reducing gas (hydrogen-containing gas) to the substrate heated to a first temperature in the process container 201 under pressure lower than atmospheric pressure;

forming a seed layer on a surface of the first oxide film by supplying a nitriding gas (or nitrogen-containing gas) to the substrate heated to a temperature equal to or higher than the first temperature and equal to or lower than a second temperature, in the process container; forming a nitride film on the seed layer on the first oxide film by performing a second cycle a predetermined number of times, the second cycle including supplying the second source gas to the substrate heated to the second temperature in the process container and supplying a nitriding gas; and forming a second oxide film on the nitride film by performing a third cycle a predetermined number of times, the third cycle including supplying the first source gas and supplying an oxidizing gas (or oxygen-containing gas) and a reducing gas (or hydrogen-containing gas) to the substrate heated to the first temperature in the process chamber 201 under the pressure lower than the atmospheric pressure are performed.

Figure 9:
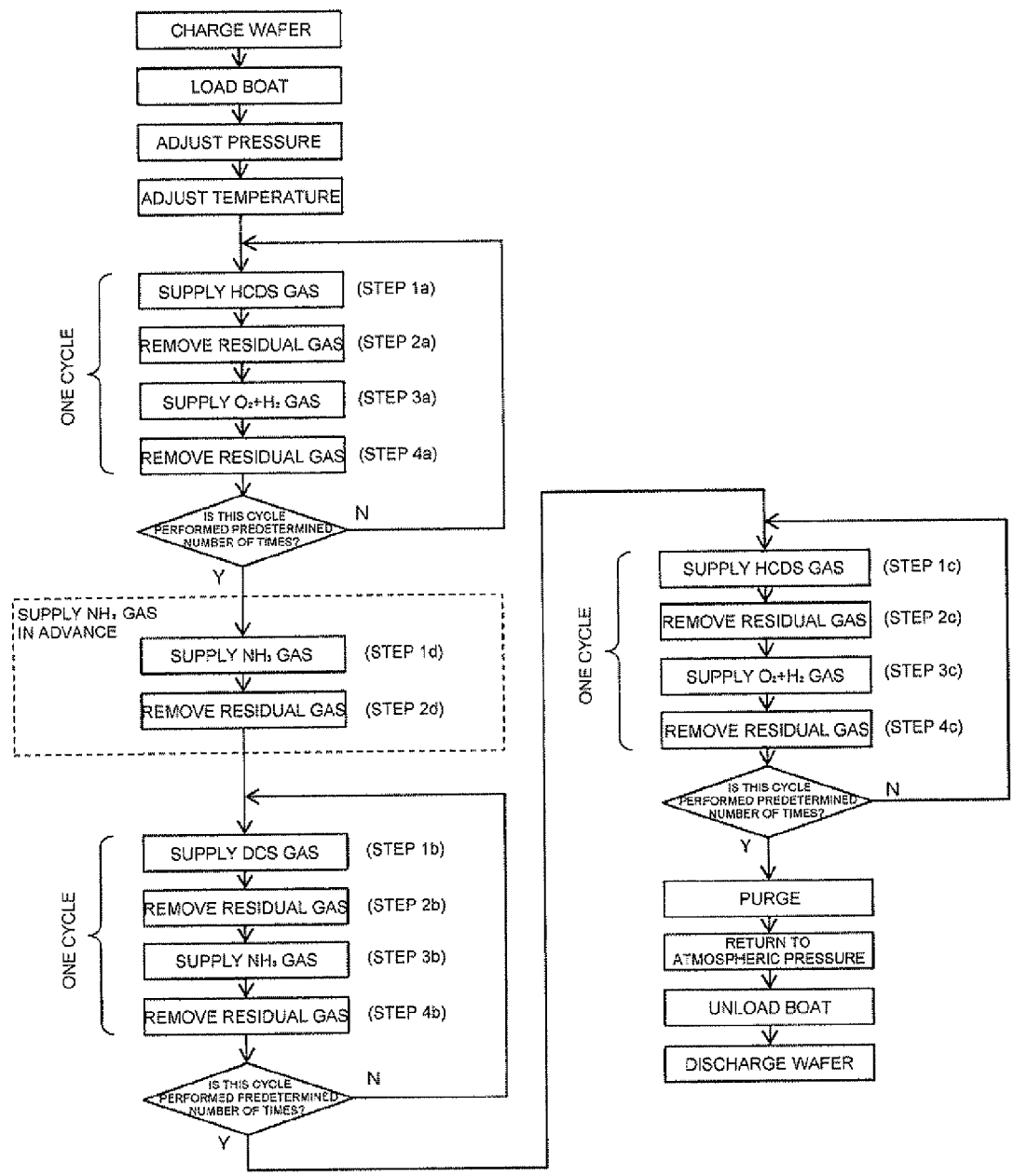
FIG. 9 is a flowchart illustrating a method of forming a film according to a second embodiment of the present invention.
Figure 16:
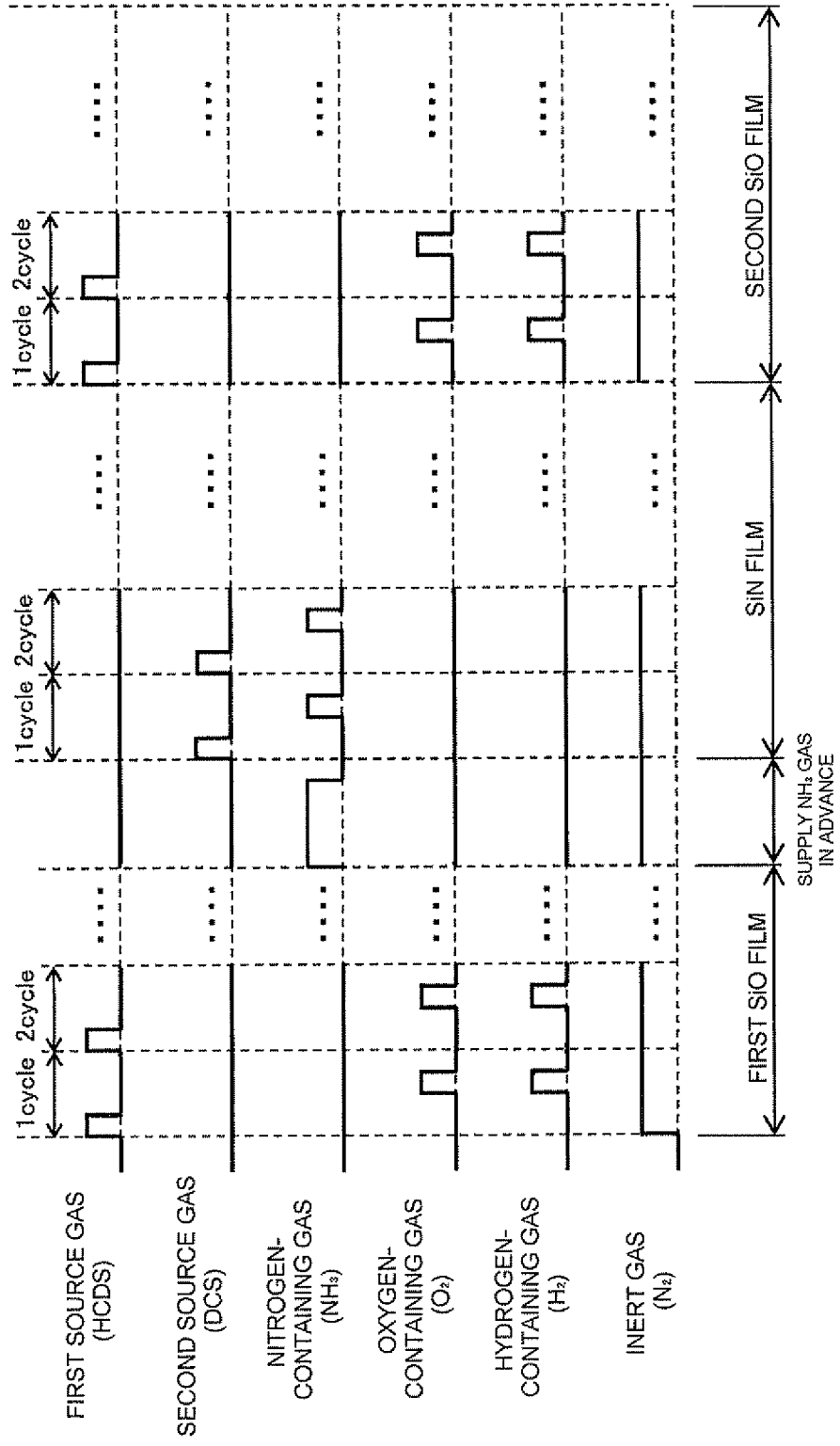
FIG. 16 is a gas supply timing chart according to the second embodiment of the present invention.

That is, in the second embodiment, after the process of forming the first oxide film is performed, the nitrogen-containing gas is supplied to the wafer 200 in the process container 201 before the process of forming the nitride film is performed. FIG. 9 is a flowchart illustrating a method of forming a film according to the second embodiment of the present invention. FIG. 16 is a gas supply timing chart according to the second embodiment of the present invention. The second embodiment is the same as the first embodiment, except that after the process of forming the first oxide film (or forming a first silicon oxide film) is performed, supplying a nitrogen-containing gas, e.g., $NH_3$ gas, to the wafer 200 in the process container 201 (supplying $NH_3$ gas in advance) is performed before forming a nitride film (or forming a silicon nitride film). The process of supplying $NH_3$ gas in advance will now be described.

In the process of supplying $NH_3$ gas in advance according to the second embodiment, Steps 1d and 2d to be described below are sequentially performed to nitride a surface of the first silicon oxide film, thereby forming a layer including a Si—N bond as a seed layer, i.e., a silicon nitride layer, on the surface of the first silicon oxide film.

[Step 1d]

After the first silicon oxide film is formed on the wafer 200, $NH_3$ gas (or a mixed gas of $NH_3$ gas and $N_2$ gas) is supplied into the heated and reduced-pressure process chamber 201 and the inside of the process chamber 201 is exhausted, in the order in which Step 3b is performed to form a silicon nitride film (supply of $NH_3$ gas). Nitriding species obtained when the $NH_3$ gas is thermally activated or thermally decomposed react with a surface of the first silicon oxide film. Thus, the surface of the first silicon oxide film is nitrided (thermally nitrided) to change (modify) the surface of the first silicon oxide film to a layer including a Si—N bond, i.e., a silicon nitride layer.

[Step 2d]

After the surface of the first silicon oxide film is changed to the silicon nitride layer, $NH_3$ gas or reacted by-products are excluded from the process chamber 201, and at the same time, the inside of the process chamber 201 is purged with $N_2$ gas, in the order in which Step 3b is performed to form a silicon nitride film (removing of residual gas).

By performing Steps 1d and 2d described above, the silicon nitride layer may be formed on the first silicon oxide film as an underlying film to a predetermined thickness. Then, the process of forming a silicon nitride film and the process of forming a second silicon oxide film described above are sequentially performed to form an insulating film having an ONO stacked structure in which the first silicon oxide film, the silicon nitride film, and the second silicon oxide film are sequentially stacked, on the wafer 200.

Process conditions of supplying $NH_3$ gas in advance are substantially the same as those in Steps 3b and 4b. However, the pressure in the process chamber 201 in Step 1 may be set to be higher than in Step 3b. For example, the pressure in the process chamber 201 may be set to fall within a range of 100 to 3,000 Pa. The higher the pressure in the process chamber 201, the more efficiently the surface of the first silicon oxide film may be nitrided. Also, a time period in which $NH_3$ gas is supplied to the wafer 200, i.e., a gas supply time (irradiation time), may be set to be longer than in Step 3b, for example, to fall within a range of 60 to 300 seconds. FIG. 16 illustrates a case in which, during the supply of $NH_3$ gas in advance, a time period in which $NH_3$ gas is supplied to the wafer 200 is set to be longer than in Step 3b. Also, the temperature of the wafer 200 may be equal to or longer than the temperature of the wafer 200 (first temperature) in Steps 1a to 4a, and may be not more than the temperature of the wafer 200 (second temperature) in Steps 1b to 4b. However, if the temperature of the wafer 200 is set to be equal to the temperature of the wafer 200 (second temperature) in Steps 1b to 4b, then the surface of the first silicon oxide film may be sufficiently modified (nitrided). In this case, since the temperature of the wafer 200 is not changed from Steps 1d to 2d and from Steps 1b to 4b, the yield may thus be improved. In other words, the temperature of the wafer 200 is preferably set to be equal to the second temperature. Also, during the supply of $NH_3$ gas in advance, the layer including the Si—N bond, which is formed on the surface of the first silicon oxide film, may have a thickness of, for example, 0.1 to 2 nm, and preferably, 1 to 2 nm.

According to the second embodiment, the effects according to the first embodiment may also be achieved. Also, according to the second embodiment, during the supply of $NH_3$ gas in advance, the silicon nitride layer formed on the surface of the first silicon oxide film may promote the second source gas to be adsorbed onto the first silicon oxide film or may promote silicon (Si) to be deposited thereon. That is, the silicon nitride layer formed on the surface of the first silicon oxide film acts as an initial layer, i.e., a seed layer, which promotes growth of the silicon nitride film at an initial stage of forming the silicon nitride film. As a result, even if DCS gas having a higher pyrolysis temperature and a lower reactivity than HCDS gas is used as the second source gas, formation of the silicon nitride film may rapidly start (i.e., incubation time may be reduced), thereby greatly increasing the yield of an insulating film having an ONO stacked structure.

<Third Embodiment of the Present Invention>

In the second embodiment, after the process of forming the first oxide film is performed, the formation of the nitride film rapidly starts by supplying the nitrogen-containing gas to the wafer 200 in the process container 201 before the process of forming the nitride film is performed, but the present invention is not limited thereto.

For example, after the process of forming the first oxide film is performed, supplying a source gas having a higher reactivity than the second source gas to the wafer 200 in the process container 201; and supplying the nitrogen-containing gas may be alternately performed, before the process of forming the nitride film is performed.

Figure 10:
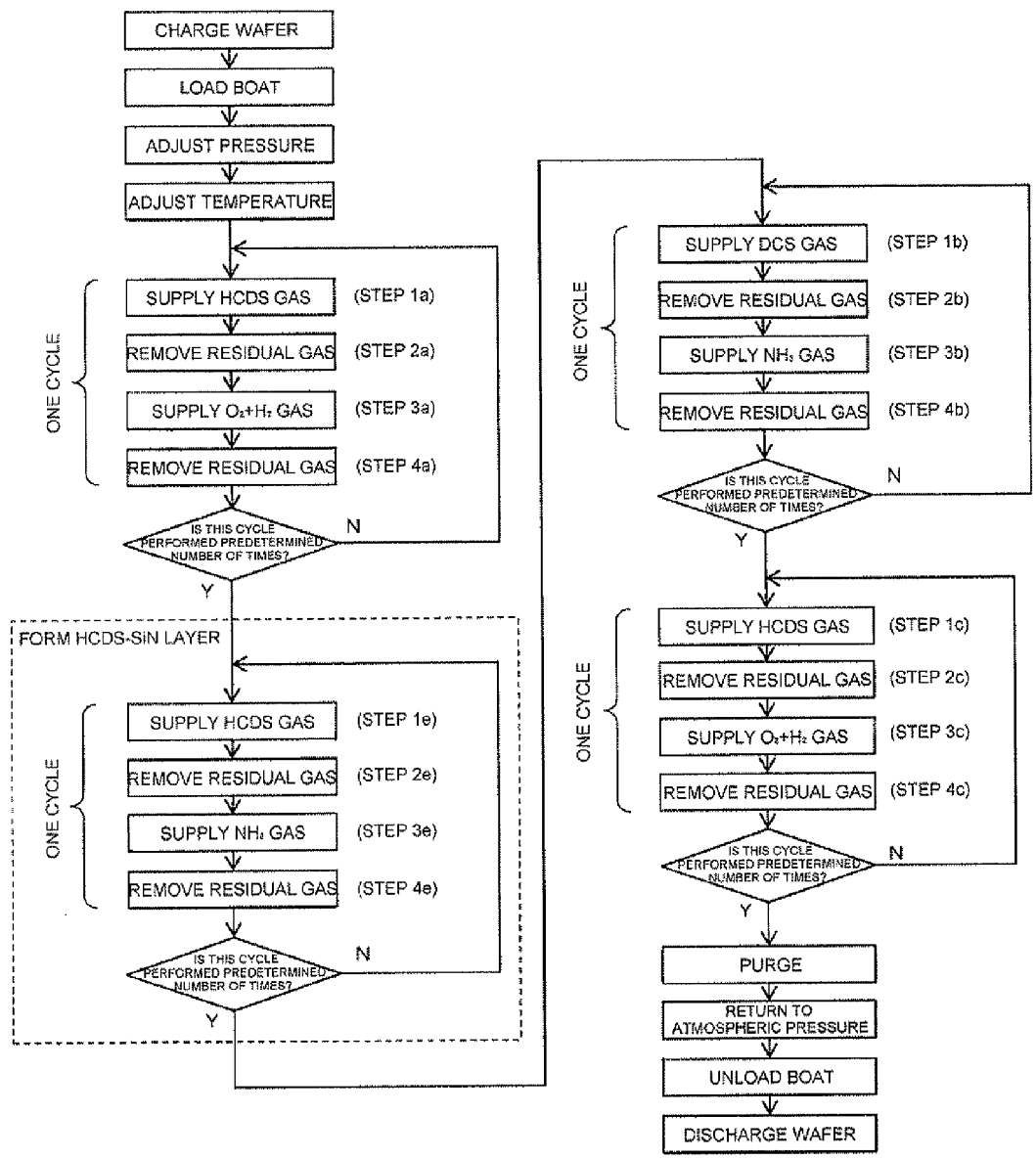
FIG. 10 is a flowchart illustrating a method of forming a film according to a third embodiment of the present invention.
Figure 17:
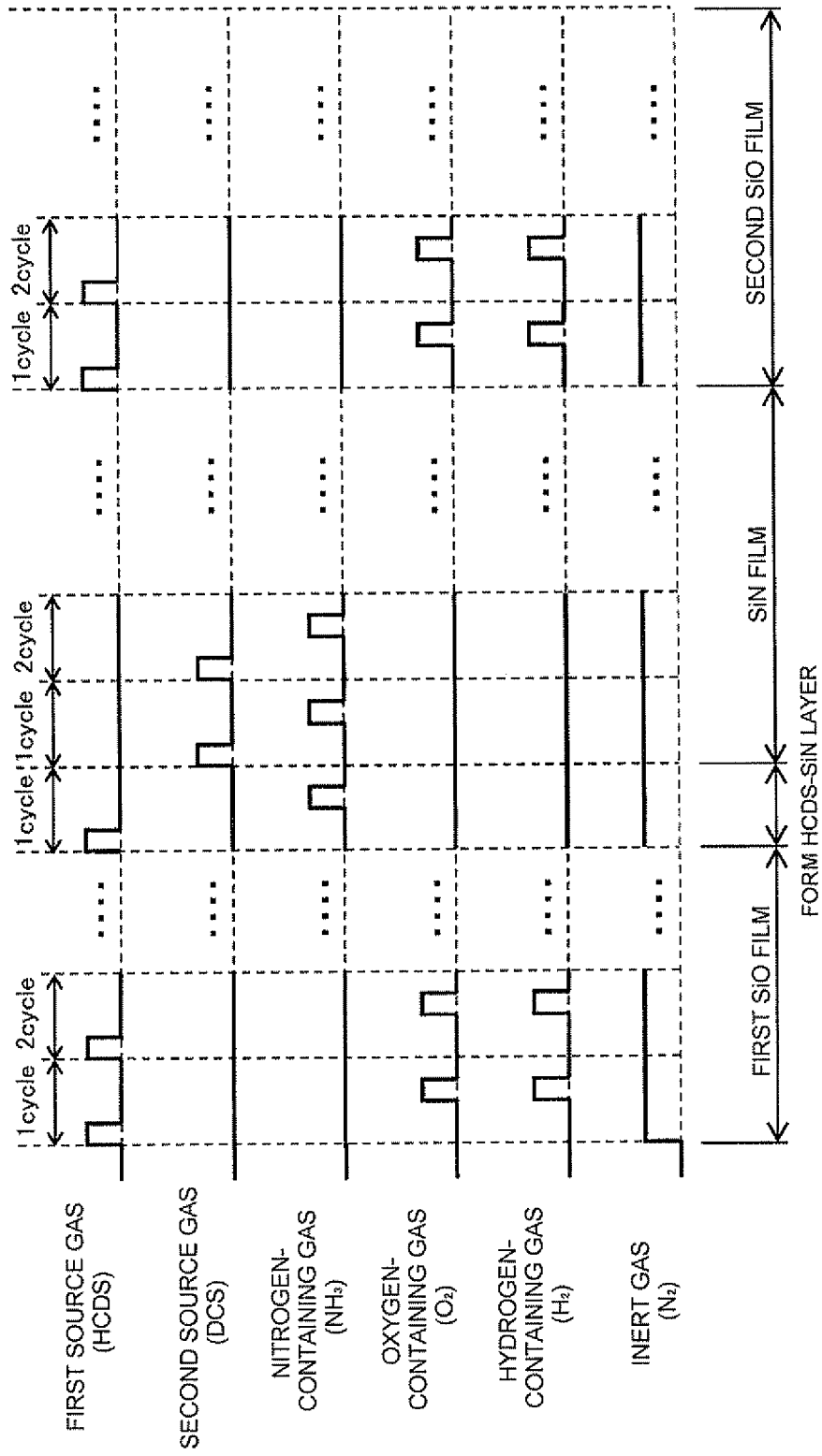
FIG. 17 is a gas supply timing chart according to the third embodiment of the present invention.

FIG. 10 is a flowchart illustrating a method of forming a film according to a third embodiment of the present invention. FIG. 17 is a gas supply timing chart according to the third embodiment of the present invention. The third embodiment is the same as the second embodiment, except that after forming a first oxide film (or forming a first silicon oxide film) is performed, supplying a gas having a higher reactivity than DCS gas as a second source gas, e.g., HCDS gas, to the wafer in the process container 201, and supplying a nitrogen-containing gas, e.g., $NH_3$ gas, are alternately performed (or forming an HCDS-SiN layer), before forming a nitride film (or forming a silicon nitride film) is performed. The process of forming the HCDS-SiN layer will now be described.

In the process of forming an HCDS-SiN layer according to the third embodiment, a cycle including Steps 1e to 4e to be described below is performed at least once (or a predetermined number of times) so that a silicon nitride layer (HCDS-SiN layer) is formed as a seed layer to cover (laminate) a surface of the first silicon oxide film.

[Step 1e]

After the first silicon oxide film is formed on the wafer 200, HCDS gas (or a mixed gas of HCDS gas and $N_2$ gas) is supplied into the heated and reduced-pressure process chamber 201 and the inside of the process chamber 201 is exhausted, in the same order and under the same conditions as Step 1a of the process of forming the first silicon oxide film (supply of HCDS gas). Process conditions, reactions to be generated, layers to be formed, and the like in Step 1e are the same as those in Step 1a of the process of forming the first silicon oxide film. That is, in Step 1e, a silicon-containing layer is formed on the first silicon oxide film by supplying the HCDS gas into the process chamber 201.

[Step 2e]

After the silicon-containing layer is formed on the first silicon oxide film, the HCDS gas is excluded from the process chamber 201 and at the same time, the inside of the process chamber 201 is purged with $N_2$ gas, in the same order and under the same conditions as Step 2a of the process of forming the first silicon oxide film (removing of residual gas).

[Step 3e]

After the residual gas is removed from the process chamber 201, $NH_3$ gas (or a mixed gas of $NH_3$ gas and $N_2$ gas) is supplied into the heated and reduced-pressure process chamber 201 and the inside of the process chamber 201 is exhausted, in the same order and under the same conditions as Step 3b of the process of forming the silicon nitride film (supply of $NH_3$ gas). Process conditions, reactions to be generated, layers to be formed, and the like in Step 3e are the same as those in Step 3b of the process of forming the silicon nitride film. That is, in Step 3e, the silicon-containing layer formed in Step 1e is changed (modified) into a silicon nitride layer by supplying $NH_3$ gas into the process chamber 201.

[Step 4e]

After the silicon-containing layer is changed into the silicon nitride layer, $NH_3$ gas or reacted by-products are excluded from the process chamber 201, and at the same time, the inside of the process chamber 201 is purged with $N_2$ gas, in the same order and under the same conditions as Step 4b of the process of forming the silicon nitride film (removing of residual gas).

A silicon nitride layer (e.g., a HCDS-SiN layer) is formed to a predetermined thickness so as to cover a surface of the first silicon oxide film as an underlying film by performing a cycle including Steps 1e to 4e described above, at least once, and preferably, 1 to 10 times, e.g., 1 to 5 times. FIG. 17 illustrates a case in which the cycle described above is performed once. The temperature of the wafer 200 in Steps 1e to 4e may be set to be the same as in Step 1d according to the second embodiment. However, as in Step 1d, the temperature of the wafer 200 may be preferably the same as the second temperature. Thereafter, the process of forming the silicon nitride film and the process of forming the second silicon oxide film described above are sequentially performed to form an insulating film having an ONO stacked structure in which the first silicon oxide film, the silicon nitride film, and the second silicon oxide film are sequentially stacked, on the wafer 200. Also, in the process of forming the HCDS-SiN layer, the HCDS-SiN formed on the surface of the first silicon oxide film may have a thickness of, for example, 0.1 to 2 nm, and preferably, 1 to 2 nm.

According to the third embodiment, the effects of the first embodiment may also be achieved. Also, according to the third embodiment, during the process of forming the HCDS-SiN layer, the HCDS-SiN layer formed to cover the surface of the first silicon oxide film may promote the second source gas to be chemically adsorbed onto the first silicon oxide film or may promote silicon (Si) to be deposited on the first silicon oxide film. That is, the HCDS-SiN layer formed on the first silicon oxide film acts as an initial layer, i.e., a seed layer, which promotes growth of the silicon nitride film at an initial stage of forming the silicon nitride film. As a result, even if DCS gas having a higher pyrolysis temperature and a lower reactivity than HCDS gas is used as the second source gas, formation of the silicon nitride film may rapidly start (an incubation time may be reduced), thereby greatly increasing the yield of an insulating film having an ONO stacked structure.

<Other Embodiments of the Present Invention>

Although various embodiments of the present invention have been described above in detail, the present invention is not limited thereto and various changes may be made in form and details without departing from the spirit and scope of the invention as defined by the appended claims.

For example, the first and second oxide films described above may not be formed according to the same method, and may be formed according to different methods. That is, each of the first and second oxide films may be formed according to one of appropriate combinations of various film-forming sequences according to the first embodiment and the first and fourth modified examples.

Also, for example, the nitride film described above may not be formed by alternately performing the process of supplying the second source gas (DCS gas) and the process of supplying the nitriding gas ($NH_3$ gas), and may be formed by simultaneously performing these processes. If, as in the embodiments described above, DCS gas which is a chlorosilane-based source gas is used as a second source gas, the differences between the temperatures of a substrate when the first oxide film is formed, when the nitride film is formed, and when the second oxide film is formed may be set to be less than 150° C., and preferably, less than 100° C., even when the second source gas and a nitriding gas are simultaneously supplied under the process conditions in the embodiments described above. In this case, a film-forming rate may be higher than when the second source gas and the nitriding gas are alternately supplied, and the yields of the first oxide film, the nitride film, and the second oxide film may be greatly increased.

In this case, before the second source gas and the nitriding gas are simultaneously supplied, $NH_3$ gas may be supplied, as in the second embodiment. Also, before the second source gas and the nitriding gas are simultaneously supplied, the process of forming the HCDS-SiN layer may be performed, as in the third embodiment. Thus, in this case, since the formation of the silicon nitride film may also rapidly start (an incubation time may be reduced), the yield of an insulating film having an ONO stacked structure may be greatly increased.

Although in the various embodiments described above, examples of a method of forming a multi-layered film including a stacked structure of SiO/SiN/SiO (ONO stacked structure) have been described, the present invention is not limited thereto. For example, the present invention may also be applied to a multi-layered film including a stacked structure of SiO/SiN/SiO/SiN/SiO (ONONO stacked structure), a multi-layered film including a stacked structure of SiN/SiO/SiN(NON stacked structure), a multi-layered film including a stacked structure of SiO/SiN(ON stacked structure), or a multi-layered film including a stacked structure of SiN/SiO (NO stacked structure).

Also, a film-forming sequence according to the present invention is not limited to a case in which an insulating film having an ONO stacked structure (or an ONONO stacked structure, a NON stacked structure, an ON stacked structure, a NO stacked structure, or the like) is formed on a film formed on a wafer (i.e., a case in which a stacked structure is formed), and may also be applied to a case in which an insulating film having an ONO stacked structure is formed in a trench structure formed in a surface of a wafer (i.e., a case in which a trench structure is formed).

Also, when an oxide film is formed on a nitride film to form a multi-layered film including an ONO stacked structure, an ONONO stacked structure, a NON stacked structure, an ON stacked structure, or a NO stacked structure, the nitride film which acts as an underlying film to form the oxide film may be formed to be thicker than a desired thickness needed to form such a stacked structure. That is, the nitride film which acts as the underlying film to form the oxide film may be formed to a thickness greater than a finally desired thickness. When the oxide film is formed on the nitride film according to one of the film-forming sequences according to the embodiments described above, a surface of the nitride film which acts an underlying film to form the oxide film may be oxidized (consumed), and thus the thickness of the nitride film may become thinner than a desired thickness needed to form such a multi-layered film. To solve this problem, a thickness of the nitride film, which is to be oxidized (consumed) when the oxide film is formed on the nitride film, may be measured in advance, and the nitride film may be formed to be thicker by the measured thickness, thereby securing the desired thickness of the nitride film needed to form the multi-layered film.

Also, during the process of forming the oxide film, a process of adding nitrogen (N) to the oxide film may be further performed. In this case, during the process of forming the oxide film, supplying a nitriding gas to the substrate in the process container may be performed. In this case, process conditions or the nitriding gas may be, for example, the same as in Step 3b of the film-forming sequence according to the first embodiment. However, the temperature of the substrate may be the same as in Steps 1a to 4a of the film-forming sequence according to the first embodiment. When a small amount of nitrogen is added to the oxide film, non-plasma conditions may be set. The process of adding nitrogen (N) to the oxide film may be performed simultaneously with, before, or after the process of supplying an oxidizing gas and a reducing gas in the substrate in the process container.

For example, in the film-forming sequence according to the first embodiment (see FIG. 4), the process of adding nitrogen to the oxide film may be performed simultaneously with, before, or after Step 3a.

As described above, a nitrogen-added oxide film may be formed by performing the process of adding nitrogen to the oxide film during the process of forming the oxide film.

During the process of forming the nitride film, a process of adding oxygen (O) to the nitride film may be performed. In this case, during the process of forming the nitride film, supplying an oxidizing gas to the substrate in the process container may be performed. In this case, process conditions or the oxidizing gas may be, for example, the same as in Step 3a in the film-forming sequence according to the first embodiment. However, the temperature of the substrate may be the same as in Steps 1b to 4b in the film-forming sequence according to the first embodiment. When a small amount of oxygen is added to the nitride film, non-plasma conditions may be set. The process of adding oxygen to the nitride film may be performed simultaneously with, before, or after the process of supplying a nitriding gas to the substrate in the process container.

For example, in the film-forming sequence according to the first embodiment (see FIG. 4), the process of adding oxygen to the nitride film may be performed simultaneously with, before, or after Step 3b.

As described above, an oxygen-added nitride film may be formed by performing the process of adding oxygen to the nitride film during the process of forming the nitride film.

Although in the embodiments described above, methods of forming a multi-layered film including a stacked structure of SiO/SiN/SiO have been described, the present invention is not limited thereto. For example, the present invention may be applied to formation of a multi-layered film including a stacked structure of SiON/SiN/SiO. In addition, the present invention may be applied to formation of a multi-layered film including a stacked structure of at least one from among an oxide film (SiO film), a nitride film (SiN film), and an oxynitride film (SiON film), e.g., a multi-layered film including a stacked structure of SiO/SiON/SiO, a multi-layered film including a stacked structure of SiO/SiN/SiON, a multi-layered film including a stacked structure of SiON/SiN/SiON, or the like.

Also, a SiON film may be formed by performing a process similar to the process of adding nitrogen (N) to the oxide film or the process of adding oxygen (O) to the nitride film.

Although in the embodiments described above, methods of forming a multi-layered film, i.e., a silicon-based insulating film including silicon which is a semiconductor element, as a thin film have been described, the present invention is not limited thereto. For example, the present invention may also be applied to a multi-layered metal-based thin film including a metal element, e.g., titanium (Ti), zirconium (Zr), hafnium (Hf), tantalum (Ta), aluminum (Al), or molybdenum (Mo).

For example, the present invention may be applied to formation of a multi-layered film including a stacked structure of a titanium oxide film (TiO film) and a titanium nitride film (TiN film) which are titanium-based thin films, a multi-layered film including a stacked structure of a zirconium oxide film (ZrO film) and a zirconium nitride film (ZrN film) which are zirconium-based thin films, a multi-layered film including a stacked structure of a hafnium oxide film (HfO film) and a hafnium nitride film (HfN film) which are hafnium-based thin films, a multi-layered film including a stacked structure of a tantalum oxide film (TaO film) and a tantalum nitride film (TaN film) which are tantalum-based thin films, a multi-layered film including a stacked structure of a aluminum oxide film (AlO film) and an aluminum nitride film (AlN film) which are aluminum-based thin films, or a multi-layered film including a stacked structure of a molybdenum oxide film (MoO film) and a molybdenum nitride film (MoN film) which are molybdenum-based thin films.

In this case, such films may be formed using a material including metal elements as a source gas according to the film-forming sequence according to one of the embodiments described above. Also, a nitrogen-containing gas, an oxygen-containing gas, and a hydrogen-containing gas according to one of the embodiments described above may be used. Process conditions may be the same as in one of the embodiments described above.

For example, when a titanium-based thin film is formed, titanium tetrachloride ($TiCl_4$), tetrakis(ethylmethylamino)titanium ($Ti[N(C_2H_5)(CH_3)]_4$, abbreviated to TEMAT), tetrakis(dimethylamino)titanium ($Ti[N(CH_3)_2]_4$, abbreviated to TDMAT), or tetrakis(diethylamino)titanium ($Ti[N(C_2H_5)_2]_4$, abbreviated to TDEAT) may be used as a source element.

For example, when a zirconium-based thin film is formed, zirconium tetrachloride ($ZrCl_4$), tetrakis(ethylmethylamino)zirconium ($Zr[N(C_2H_5)(CH_3)]_4$, abbreviated to TEMAZ), tetrakis(dimethylamino)zirconium ($Zr[N(CH_3)_2]_4$, abbreviated to TDMAZ), or tetrakis(diethylamino)zirconium ($Zr[N(C_2H_5)_2]_4$, abbreviated to TDEAZ) may be used as a source element.

For example, when a hafnium-based thin film is formed, hafnium tetrachloride ($HfCl_4$), tetrakis(ethylmethylamino)hafnium ($Hf[N(C_2H_5)(CH_3)]_4$, abbreviated to TEMAH), tetrakis(dimethylamino)hafnium ($Hf[N(CH_3)_2]_4$, abbreviated to TDMAH), or tetrakis(diethylamino)hafnium ($Hf[N(C_2H_5)_2]_4$, abbreviated to TDEAH) may be used as a source element.

As described above, the present invention may be applied to not only a multi-layered silicon-based thin film but also a multi-layered metal-based thin film. In this case, the effects according to the embodiments described above may also be achieved. That is, the present invention may also be applied to formation of a thin film including a specific element, such as a semiconductor element or a metal element.

Although in the embodiments described above, a thin film is formed using a batch-type substrate processing apparatus capable of processing a plurality of substrates at a time, the present invention is not limited thereto, and a thin film may be formed using a single-wafer type substrate processing apparatus capable of processing one or several substrates at a time.

Also, an appropriate combination of the embodiments, modified examples, or application examples described above may be used.

The present invention may also be performed by changing, for example, a program recipe of the existing substrate processing apparatus. To change the program recipe, a program recipe according to the present invention may be installed in the existing substrate processing apparatus via a communication line or a recording medium storing the program recipe according to the present invention, or the program recipe of the existing substrate processing apparatus may be replaced with the program recipe according to the present invention by manipulating an input/output device of the existing substrate processing apparatus.

EXAMPLES

Example 1

In Example 1, a silicon nitride film was continuously formed on a first silicon oxide film, as in the first embodiment (that is, without performing the process of supplying $NH_3$ gas in advance or the process of forming the HCDS-SiN layer between the process of forming the first silicon oxide film and the process of forming the silicon nitride film). Also, the silicon nitride film was continuously formed on the first silicon oxide film, as in the second embodiment (that is, performing the process of supplying $NH_3$ gas between the process of forming the first silicon oxide film and the process of forming the silicon nitride film). Then, a time delay in forming the silicon nitride film (incubation time) was measured in the above two cases.

Figure 18:
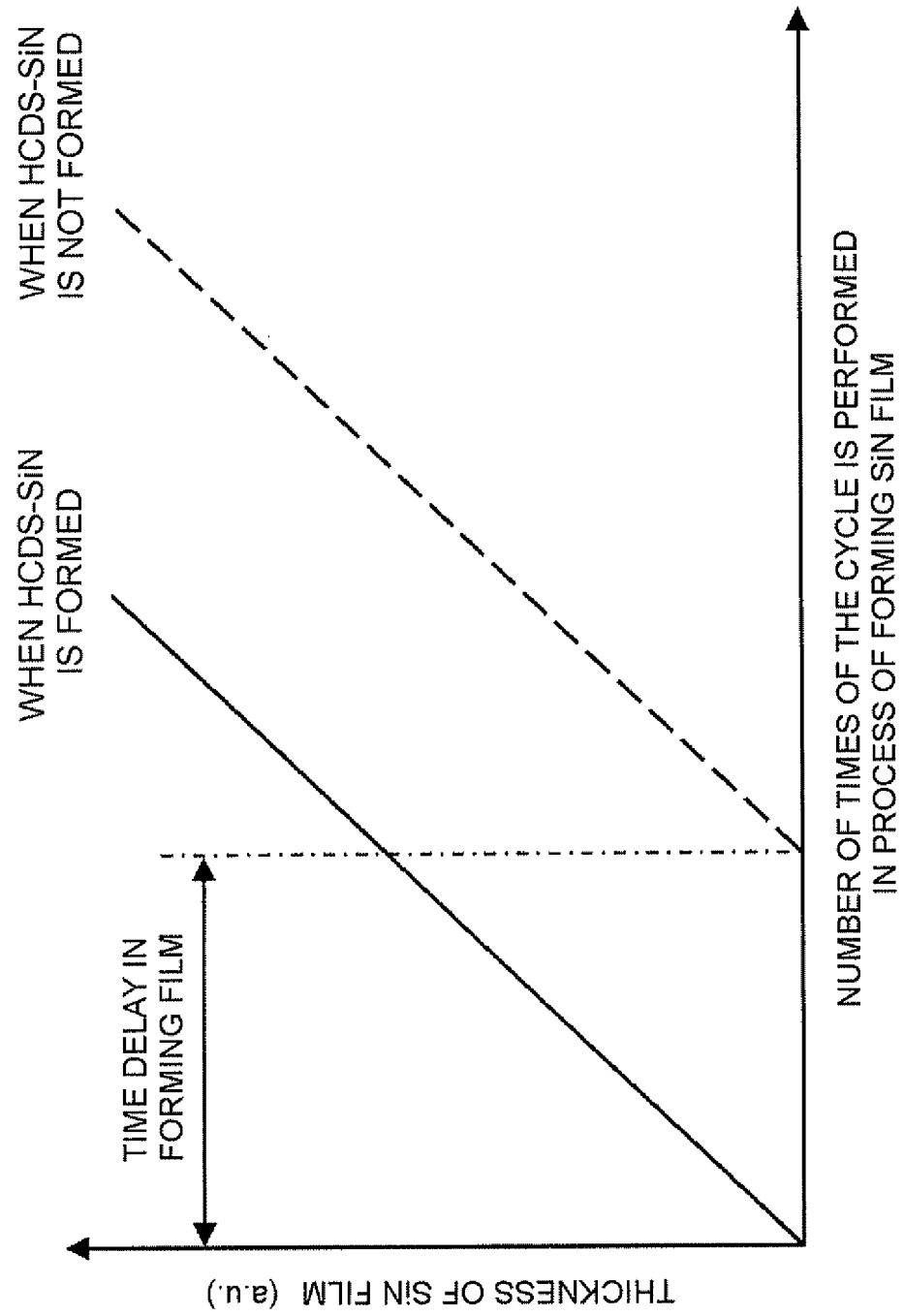
FIG. 18 is a graph illustrating a result of measuring a time delay in forming a silicon nitride film according to Example 1.

FIG. 18 is a graph illustrating a result of measuring a time delay in forming a silicon nitride film according to Example 1. In FIG. 18, a horizontal axis denotes a number of times that a cycle (Steps 1b to 4b) was performed in forming the silicon nitride film, and a vertical axis denotes the thickness of the silicon nitride film, expressed in arbitrary units, e.g., a.u. In FIG. 18, a dotted line denotes a case in which forming a first silicon oxide film and the process of forming the silicon nitride film were continuously performed, and a solid line denotes a case in which supplying $NH_3$ gas in advance was performed between these processes.

Referring to FIG. 18, formation of the silicon nitride film started earlier when the process of supplying $NH_3$ gas in advance was performed between the process of forming the first silicon oxide film and the process of forming the silicon nitride film (indicated by the solid line) than when the process of supplying $NH_3$ gas in advance was not performed (indicated by the dotted line), thereby reducing a time delay in forming the silicon nitride film (incubation time). In other words, a silicon nitride layer formed on a surface of the first silicon oxide film acted as an initial layer (seed layer) that promoted formation of the silicon nitride film, thereby facilitating formation of the silicon nitride film. That is, the yield when an insulating film having an ONO stacked structure was formed was greatly increased.

Example 2

In Example 2, a silicon nitride film was continuously formed on a first silicon oxide film, as in the first embodiment (that is, without performing the process of supplying $NH_3$ gas in advance or the process of forming the HCDS-SiN layer between the process of forming the first silicon oxide film and the process of forming the silicon nitride film). Also, the silicon nitride film was continuously formed on the first silicon oxide film, as in the third embodiment (that is, performing the process of forming the HCDS-SiN layer between the process of forming the first silicon oxide film and the process of forming the silicon nitride film). Then, a time delay in forming the silicon nitride film (incubation time) was measured in the above two cases.

Figure 19:
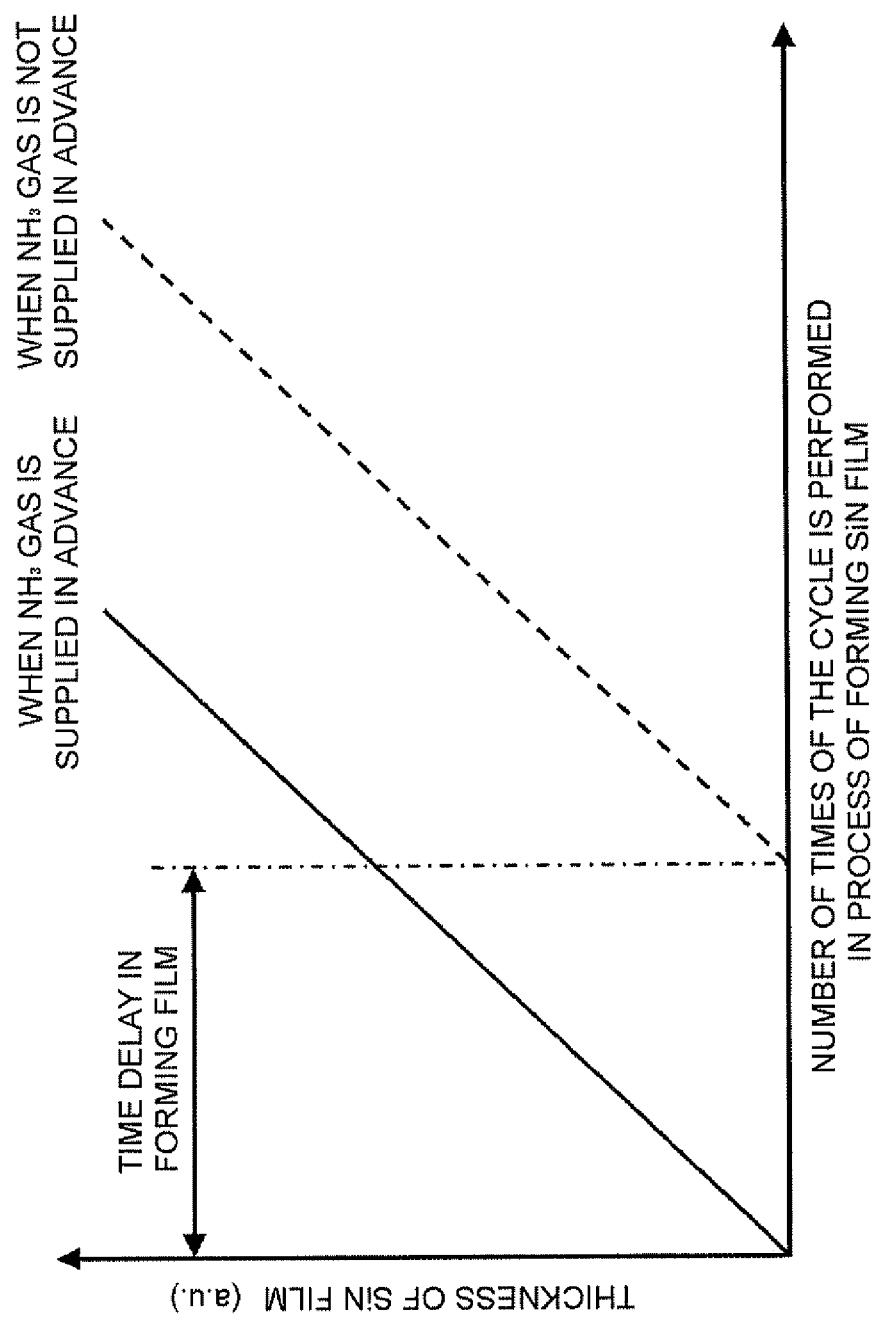
FIG. 19 is a graph illustrating a result of measuring a time delay in forming a silicon nitride film according to Example 2.

FIG. 19 is a graph illustrating a result of measuring a time delay in forming a silicon nitride film according to Example 2. In FIG. 19, a horizontal axis denotes a number of times that a cycle (Steps 1b to 4b) was performed in forming the silicon nitride film, and a vertical axis denotes the thickness of the silicon nitride film, expressed in arbitrary units, e.g., a.u. In FIG. 19, a dotted line denotes a case in which forming a first silicon oxide film and the process of forming the silicon nitride film were continuously performed, and a solid line denotes a case in which forming an HCDS-SiN layer was performed between these processes.

Referring to FIG. 19, formation of the silicon nitride film started earlier when the process of forming the HCDS-SiN layer was performed between the process of forming the first silicon oxide film and the process of forming the silicon nitride film (indicated by the solid line) than when the process of forming the HCDS-SiN layer was not performed (indicated by the dotted line), thereby reducing a time delay in forming the silicon nitride film (the incubation time). In other words, the HCDS-SiN layer formed to cover a surface of the first silicon oxide film acted as an initial layer (seed layer) that promoted formation of the silicon nitride film, thereby facilitating formation of the silicon nitride film. That is, the yield when an insulating film having an ONO stacked structure is formed was greatly increased.

According to the present invention, a method of manufacturing a semiconductor device capable of improving the thickness uniformity or step coverage of an insulating film having a stacked structure of an oxide film and a nitride film and thus increasing the yield of a film, a method of processing the substrate, a substrate processing apparatus, and a non-transitory computer-readable recording medium can be provided.

<Exemplary Embodiments of the Present Invention>

Exemplary embodiments of the present invention are hereinafter added.

(Supplementary Note 1)

According to one embodiment of the present invention, there is provided a method of manufacturing a semiconductor device, including:

(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

(Supplementary Note 2)

In the method of Supplementary Note 1, an inner pressure of the process container in the step (b) is higher than that of the process container in the step (c).

(Supplementary Note 3)

In the method of Supplementary Note 1, an inner pressure of the process container in the step (b) is higher than that of the process container in the supplying of the second source gas in the step (c).

(Supplementary Note 4)

In the method of Supplementary Note 1, an inner pressure of the process container in the step (b) is higher than that of the process container in the supplying of the nitriding gas in the step (c).

(Supplementary Note 5)

In the method of one of Supplementary Notes 1 to 4, the temperature of the substrate in the step (b) is equal to the second temperature.

(Supplementary Note 6)

In the method of one of Supplementary Notes 1 to 5, the step (b) may include nitriding the surface of the oxide film.

(Supplementary Note 7)

In the method of one of Supplementary Notes 1 to 6, the step (b) may include thermally nitriding the surface of the oxide film.

(Supplementary Note 8)

In the method of one of Supplementary Notes 1 to 7, the step (b) may include forming a nitriding layer as the seed layer on the surface of the oxide film.

(Supplementary Note 9)

In the method of one of Supplementary Notes 1 to 8, the step (b) may include forming a layer including a Si—N bond as the seed layer on the surface of the oxide film.

(Supplementary Note 10)

In the method of one of Supplementary Notes 1 to 9, the step (b) may further include supplying the first source gas to the substrate in the process container heated to the temperature equal to or higher than the first temperature and equal to or lower than the second temperature, wherein the seed layer is formed on the surface of the oxide film by performing each of the supplying of the first source gas and the supplying of the nitriding gas a predetermined number of times.

(Supplementary Note 11)

In the method of Supplementary Note 10, the step (b) may include alternately performing the supplying of the first source gas and the supplying of the nitriding gas.

(Supplementary Note 12)

In the method of Supplementary Note 10 or 11, the step (b) may include forming a nitriding layer as the seed layer on the oxide film by alternately performing the supplying of the first source gas and the supplying of the nitriding gas.

(Supplementary Note 13)

In the method of one of Supplementary Notes 1 to 12, a material constituting the first source gas may be different from a material constituting the second source gas, and a reactivity of the second source gas is lower than that of the first source gas.

(Supplementary Note 14)

In the method of one of Supplementary Notes 1 to 12, the first source gas and the second source gas may be formed of different materials including the same element, and the second source gas may have a lower reactivity than the first source gas.

(Supplementary Note 15)

In the method of one of Supplementary Notes 1 to 12, the first source gas and the second source gas may be formed of different materials including silicon, and a reactivity of the second source gas is lower than that of the first source gas.

(Supplementary Note 16)

In the method of one of Supplementary Notes 1 to 12, the first source gas and the second source gas are formed of the same material.

(Supplementary Note 17)

In the method of one of Supplementary Notes 1 to 12, the first source gas and the second source gas are formed of the same material including the same element.

(Supplementary Note 18)

In the method of one of Supplementary Notes 1 to 12, the first source gas and the second source gas are formed of the same material including silicon.

(Supplementary Note 19)

In the method of one of Supplementary Notes 1 to 18, the step (a) may include alternately performing the supplying of the first source gas and the supplying of the oxidizing gas and the reducing gas.

(Supplementary Note 20)

In the method of one of Supplementary Notes 1 to 19, the step (a) may include alternately performing the supplying of the first source gas and the supplying of the oxidizing gas and the reducing gas; and further supplying the oxidizing gas and the reducing gas.

(Supplementary Note 21)

In the method of one of Supplementary Notes 1 to 20, the step (c) may include alternately performing the supplying of the second source gas and the supplying of the nitriding gas.

(Supplementary Note 22)

In the method of one of Supplementary Notes 1 to 21, the step (c) may include simultaneously performing the supplying of the second source gas and the supplying of the nitriding gas.

(Supplementary Note 23)

In the method of one of Supplementary Notes 1 to 22, the step (c) may further include adding nitrogen to the oxide film.

(Supplementary Note 24)

In the method of one of Supplementary Notes 1 to 23, the step (c) may further include adding oxygen to the nitride film.

(Supplementary Note 25)

The method of one of Supplementary Notes 1 to 24 may further include forming an oxide film on the nitride film by additionally performing the first cycle a predetermined number of times.

(Supplementary Note 26)

According to another embodiment of the present invention, there is provided a method of manufacturing a semiconductor device, including:

(a) forming a first oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the first oxide film by supplying a nitriding gas to the substrate in the process container, the substrate being heated to a temperature equal to or higher than the first temperature and equal to or lower than a second temperature;

(c) forming a nitride film on the seed layer formed on the surface of the first oxide film by performing a second cycle a predetermined number of times, the second cycle including supplying a second source gas and supplying the nitriding gas to the substrate heated to the second temperature in the process container; and (d) forming a second oxide film on the nitride film by repeatedly performing a third cycle a predetermined number of times, the third cycle including supplying the first source gas and supplying the oxidizing gas and the reducing gas on the substrate heated to the first temperature in the process container under a pressure lower than the atmospheric pressure.

(Supplementary Note 27)

In the method of Supplementary Note 25 or 26, the step (c) may include forming the nitride film to a thickness greater than a finally desired thickness.

(Supplementary Note 28)

According to still another embodiment of the present invention, there is provided a method of processing a substrate including:

(a) forming an oxide film on the substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

(Supplementary Note 29)

According to yet another embodiment of the present invention, there is provided a substrate processing apparatus including:

a process container configured to accommodate a substrate;

a heater configured to heat the substrate in the process container;

a source gas supply system configured to supply a first source gas and a second source gas to the substrate in the process container;

an oxidizing gas supply system configured to supply an oxidizing gas to the substrate in the process container;

a reducing gas supply system configured to supply a reducing gas to the substrate in the process container;

a nitriding gas supply system configured to supply a nitriding gas to the substrate in the process container;

a pressure adjustment unit configured to adjust an inner pressure of the process container; and a control unit configured to control the heater, the source gas supply system, the oxidizing gas supply system, the reducing gas supply system, the nitriding gas supply system and the pressure adjustment unit so as to perform forming an oxide film on the substrate by performing a first cycle a predetermined number of times, the first cycle including supplying the first source gas and supplying the oxidizing gas and the reducing gas to the substrate heated to a first temperature in a process container under a pressure lower than an atmospheric pressure; forming a seed layer on a surface of the oxide film by supplying the nitriding gas to the substrate in the process container, the substrate being heated to a temperature equal to or higher than the first temperature and equal to or lower than a second temperature; and forming a nitride film on the seed layer formed on the surface of the oxide film by performing a second cycle a predetermined number of times, the second cycle including supplying the second source gas and supplying the nitriding gas to the substrate heated to the second temperature in the process container.

(Supplementary Note 30)

According to yet another embodiment of the present invention, there is provided a program causing a computer to execute:

(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

(Supplementary Note 31)

According to another embodiment of the present invention, there is provided a non-transitory computer-readable recording medium storing a program that causes a computer to execute:

(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;

(b) forming a seed layer on a surface of the oxide film by supplying a nitriding gas to the substrate in the process container, the substrate being heated to a temperature equal to or higher than the first temperature and equal to or lower than a second temperature; and (c) forming a nitride film on the seed layer formed on the surface of the oxide film by performing a second cycle a predetermined number of times, the second cycle including supplying a second source gas and supplying the nitriding gas to the substrate heated to the second temperature in the process container.

What is claimed is:

1. A method of manufacturing a semiconductor device, the method comprising:
    (a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;
    (b) forming a seed layer on a surface of the oxide film by supplying a nitriding gas to the substrate in the process container, the substrate being heated to a temperature equal to or higher than the first temperature and equal to or lower than a second temperature that is higher than the first temperature; and
    (c) forming a nitride film directly on the seed layer formed on the surface of the oxide film by performing a second cycle a predetermined number of times, the second cycle including supplying a second source gas and supplying the nitriding gas to the substrate heated to the second temperature in the process container, wherein a material constituting the second source gas is different from a material constituting the first source gas and the second source gas has a higher thermal decomposition temperature and a lower reactivity than the first source gas.

2. The method of claim 1, wherein an inner pressure of the process container in the step (b) is higher than that of the process container in the step (c).

3. The method of claim 1, wherein an inner pressure of the process container in the step (b) is higher than that of the process container in the supplying of the second source gas in the step (c).

4. The method of claim 1, wherein an inner pressure of the process container in the step (b) is higher than that of the process container in the supplying of the nitriding gas in the step (c).

5. The method of claim 1, wherein the temperature of the substrate in the step (b) is equal to the second temperature.

6. The method of claim 1, wherein the step (b) comprises nitriding the surface of the oxide film.

7. The method of claim 1, wherein the step (b) further comprises supplying the first source gas to the substrate in the process container, the substrate being heated to the temperature equal to or higher than the first temperature and equal to or lower than the second temperature,
wherein the seed layer is formed on the surface of the oxide film by performing each of the supplying of the first source gas and the supplying of the nitriding gas a predetermined number of times.

8. The method of claim 7, wherein the step (b) comprises alternately performing the supplying of the first source gas and the supplying of the nitriding gas.

9. The method of claim 1, wherein the step (a) comprises alternately performing the supplying of the first source gas and the supplying of the oxidizing gas and the reducing gas.

10. The method of claim 1, wherein the step (a) comprises:
alternately performing the supplying of the first source gas and the supplying of the oxidizing gas and the reducing gas; and
further supplying the oxidizing gas and the reducing gas.

11. The method of claim 1, wherein the step (c) comprises alternately performing the supplying of the second source gas and the supplying of the nitriding gas.

12. The method of claim 1, wherein the step (c) comprises simultaneously performing the supplying of the second source gas and the supplying of the nitriding gas.

13. The method of claim 1, further comprising forming an oxide film on the nitride film by additionally performing the first cycle a predetermined number of times.

14. The method of claim 13, wherein the step (c) comprises forming the nitride film to a thickness greater than a finally desired thickness.

15. The method of claim 1, wherein a time period of supplying the nitriding gas in the step (b) is longer than a time period of supplying the nitriding gas in the step (c) in each cycle.

16. The method of claim 1, further comprising adding nitrogen to the oxide film in the step (a).

17. The method of claim 1, further comprising adding oxygen to the nitride film in the step (c).

18. A method of processing a substrate, comprising:
(a) forming an oxide film on the substrate by performing a first cycle a predetermined number of times, the first cycle including supplying a first source gas and supplying an oxidizing gas and a reducing gas to the substrate heated to a first temperature in a process container under a pressure lower than an atmospheric pressure;
(b) forming a seed layer on a surface of the oxide film by supplying a nitriding gas to the substrate in the process container, the substrate being heated to a temperature equal to or higher than the first temperature and equal to or lower than a second temperature that is higher than the first temperature; and
(c) forming a nitride film directly on the seed layer formed on the surface of the oxide film by performing a second cycle a predetermined number of times, the second cycle including supplying a second source gas and supplying the nitriding gas to the substrate heated to the second temperature in the process container, wherein a material constituting the second source gas is different from a material constituting the first source gas and the second source gas has a higher thermal decomposition temperature and a lower reactivity than the first source gas.

19. A non-transitory computer-readable recording medium storing a program that causes a computer to execute:
(a) forming an oxide film on a substrate by performing a first cycle a predetermined number of times, the first cycle including supplying a first source gas and supplying an oxidizing gas and a reducing gas to the substrate heated to a first temperature in a process container under a pressure lower than an atmospheric pressure;
(b) forming a seed layer on a surface of the oxide film by supplying a nitriding gas to the substrate in the process container, the substrate being heated to a temperature equal to or higher than the first temperature and equal to or lower than a second temperature that is higher than the first temperature; and
(c) forming a nitride film directly on the seed layer formed on the surface of the oxide film by performing a second cycle a predetermined number of times, the second cycle including supplying a second source gas and supplying the nitriding gas to the substrate heated to the second temperature in the process container, wherein a material constituting the second source gas is different from a material constituting the first source gas and the second source gas has a higher thermal decomposition temperature and a lower reactivity than the first source gas.

* * * * *